US009147875B1

(12) United States Patent
Coakley et al.

(10) Patent No.: US 9,147,875 B1
(45) Date of Patent: Sep. 29, 2015

(54) INTERCONNECT FOR BATTERY PACKS

(71) Applicant: CelLink Corporation, Belmont, CA (US)

(72) Inventors: Kevin Michael Coakley, Belmont, CA (US); Malcolm Brown, Mountain View, CA (US)

(73) Assignee: CelLink Corporation, Belmont, CA (US)

( * ) Notice: Subject to any disclaimer, the term of this patent is extended or adjusted under 35 U.S.C. 154(b) by 0 days.

(21) Appl. No.: 14/671,814

(22) Filed: Mar. 27, 2015

Related U.S. Application Data

(60) Provisional application No. 62/048,404, filed on Sep. 10, 2014, provisional application No. 62/080,971, filed on Nov. 17, 2014, provisional application No. 62/111,333, filed on Feb. 3, 2015.

(51) Int. Cl.
*B29C 65/48* (2006.01)
*B32B 37/26* (2006.01)
*B32B 38/04* (2006.01)
*B32B 38/10* (2006.01)
*H01M 4/139* (2010.01)
*H05K 3/00* (2006.01)
*H05K 3/40* (2006.01)
*H05K 3/02* (2006.01)
*H01M 4/04* (2006.01)

(52) U.S. Cl.
CPC ............... *H01M 4/139* (2013.01); *H01M 4/04* (2013.01); *H05K 3/007* (2013.01); *H05K 3/0058* (2013.01); *H05K 3/02* (2013.01); *H05K 3/4038* (2013.01)

(58) Field of Classification Search
USPC ......... 156/230, 233, 237, 241, 247–250, 257, 156/268
See application file for complete search history.

(56) References Cited

U.S. PATENT DOCUMENTS

| | | | | | |
|---|---|---|---|---|---|
| 3,864,169 | A | * | 2/1975 | Cestaro et al. | 156/279 |
| 3,870,212 | A | * | 3/1975 | Polk | 225/42 |
| 4,047,457 | A | * | 9/1977 | Stubbings | 83/76.8 |
| 4,147,337 | A | * | 4/1979 | Bolza-Schunemann | 270/19 |
| 4,908,337 | A | * | 3/1990 | Treffer | 439/876 |
| 5,158,842 | A | * | 10/1992 | McHenry | 429/161 |
| 5,354,629 | A | * | 10/1994 | Kuroda et al. | 429/94 |

(Continued)

OTHER PUBLICATIONS

Schubert, Gunter, "Adhesion of Aluminium Foil to Coating—Stick with it", TAPPI 03/G. Schubert, http://www.tappi.org/content/enewsletters/eplace/2004/10-1schub1.pdf, May 14, 2003.

*Primary Examiner* — Sing P Chan
(74) *Attorney, Agent, or Firm* — Kwan & Olynick LLP

(57) ABSTRACT

Provided are interconnect circuits for interconnecting arrays of battery cells and methods of forming these interconnect circuits as well as connecting these circuits to the battery cells. An interconnect circuit may include a conductive layer and one or more insulating layers. The conductive layer may be patterned with openings defining contact pads, such that each pad is used for connecting to a different battery cell terminal. In some embodiments, each contact pad is attached to the rest of the conductive layer by a fusible link formed from the same conductive layer as the contact pad. The fusible link controls the current flow to and from this contact pad. The insulating layer is laminated to the conductive layer and provides support to the contacts pads. The insulating layer may also be patterned with openings, which allow forming electrical connections between the contact pads and cell terminals through the insulating layer.

20 Claims, 32 Drawing Sheets

(56) References Cited

U.S. PATENT DOCUMENTS

| | | | |
|---|---|---|---|
| 5,622,652 A * | 4/1997 | Kucherovsky et al. | 252/511 |
| 5,645,932 A * | 7/1997 | Uchibori | 428/347 |
| 5,656,081 A * | 8/1997 | Isen et al. | 118/46 |
| 5,796,588 A * | 8/1998 | Machida et al. | 361/773 |
| 6,010,771 A * | 1/2000 | Isen et al. | 428/209 |
| 6,042,966 A * | 3/2000 | Cheu | 429/163 |
| 6,214,444 B1 * | 4/2001 | Uchibori | 428/209 |
| 6,284,405 B2 * | 9/2001 | Kaido et al. | 429/94 |
| 6,383,616 B1 * | 5/2002 | Uchibori | 428/209 |
| 6,632,538 B1 * | 10/2003 | Yamazaki et al. | 428/461 |
| 6,972,544 B2 | 12/2005 | Seman et al. | |
| 8,236,443 B2 * | 8/2012 | Snyder et al. | 429/136 |
| 8,404,376 B2 * | 3/2013 | Snyder et al. | 429/136 |
| 8,414,308 B1 * | 4/2013 | Meyers | 439/67 |
| 8,497,037 B2 * | 7/2013 | Hosoe et al. | 429/211 |
| 8,635,761 B2 * | 1/2014 | Wu | 29/600 |
| 8,913,368 B2 * | 12/2014 | Hosoe et al. | 361/503 |
| 8,975,510 B2 | 3/2015 | Coakley | |
| 2001/0012588 A1 * | 8/2001 | Kaido et al. | 429/233 |
| 2002/0025416 A1 * | 2/2002 | Uchibori | 428/209 |
| 2006/0213548 A1 * | 9/2006 | Bachrach et al. | 136/251 |
| 2009/0022885 A1 * | 1/2009 | Matsumoto et al. | 427/98.5 |
| 2009/0045964 A1 * | 2/2009 | Takeda et al. | 340/572.9 |
| 2009/0139781 A1 * | 6/2009 | Straubel | 180/65.1 |
| 2009/0233237 A1 * | 9/2009 | Yoshiki et al. | 430/311 |
| 2009/0250104 A1 * | 10/2009 | Inoue et al. | 136/256 |
| 2012/0088140 A1 * | 4/2012 | Kardasz et al. | 429/120 |
| 2012/0183823 A1 * | 7/2012 | Von Borck et al. | 429/81 |
| 2012/0240995 A1 * | 9/2012 | Coakley | 136/256 |
| 2012/0288757 A1 * | 11/2012 | Hosoe et al. | 429/211 |
| 2013/0004844 A1 * | 1/2013 | Hosoe et al. | 429/211 |
| 2013/0004856 A1 * | 1/2013 | Hosoe et al. | 429/245 |
| 2013/0089769 A1 * | 4/2013 | Proctor et al. | 429/127 |
| 2013/0098424 A1 * | 4/2013 | Tsuda et al. | 136/244 |
| 2013/0112233 A1 * | 5/2013 | Coakley | 136/244 |
| 2013/0291375 A1 * | 11/2013 | Virtanen et al. | 29/601 |
| 2013/0307133 A1 * | 11/2013 | Toba | 257/677 |
| 2014/0061877 A1 * | 3/2014 | Lin et al. | 257/659 |
| 2014/0212695 A1 * | 7/2014 | Lane et al. | 429/7 |
| 2015/0050525 A1 * | 2/2015 | Ahn | 429/7 |

* cited by examiner

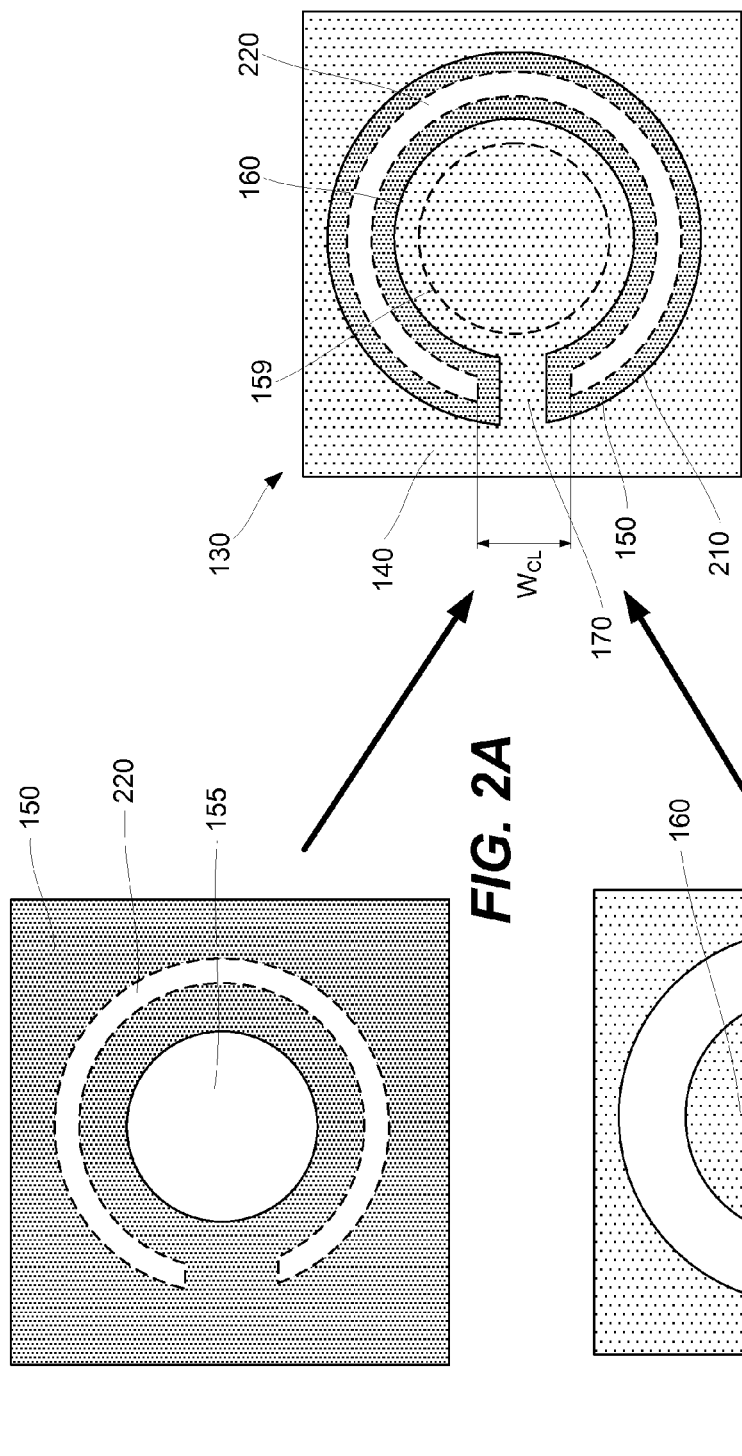

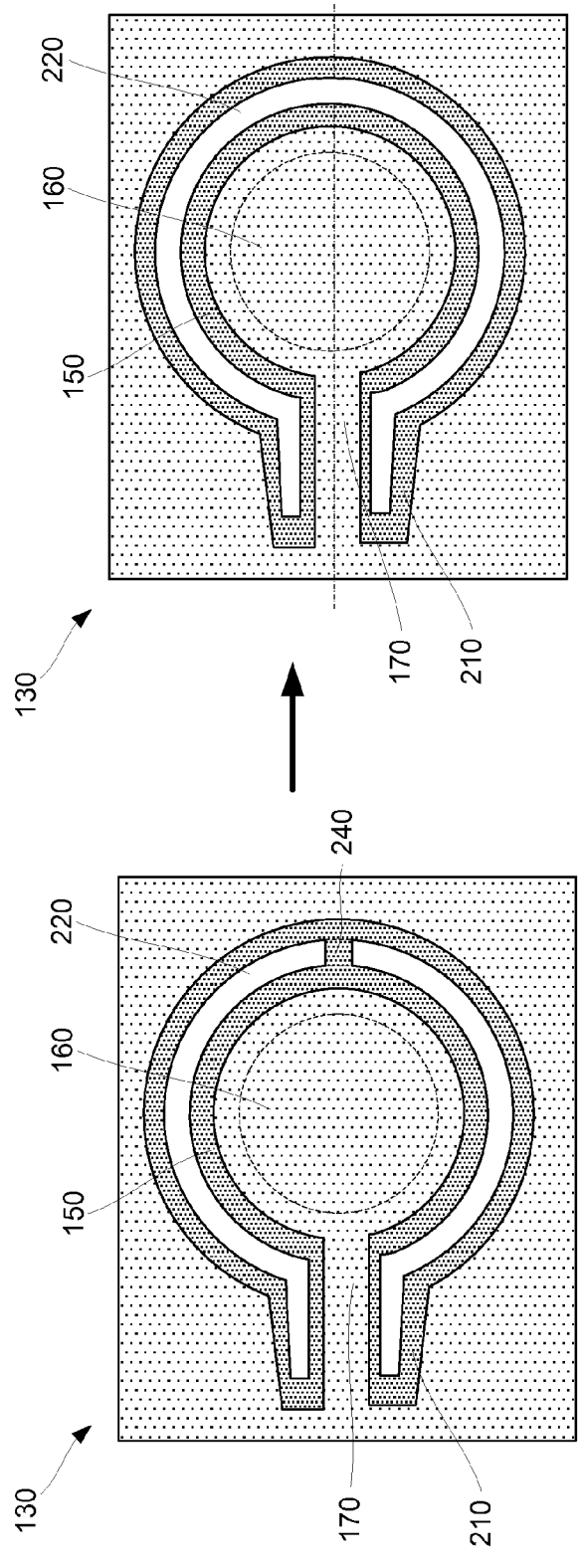
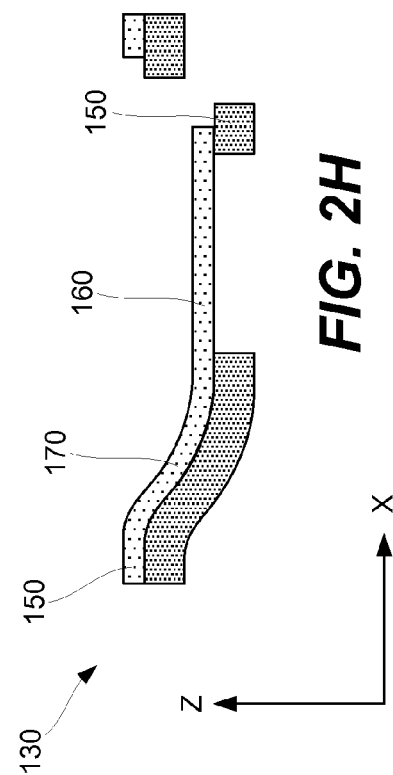
FIG. 2G
FIG. 2H
FIG. 2F

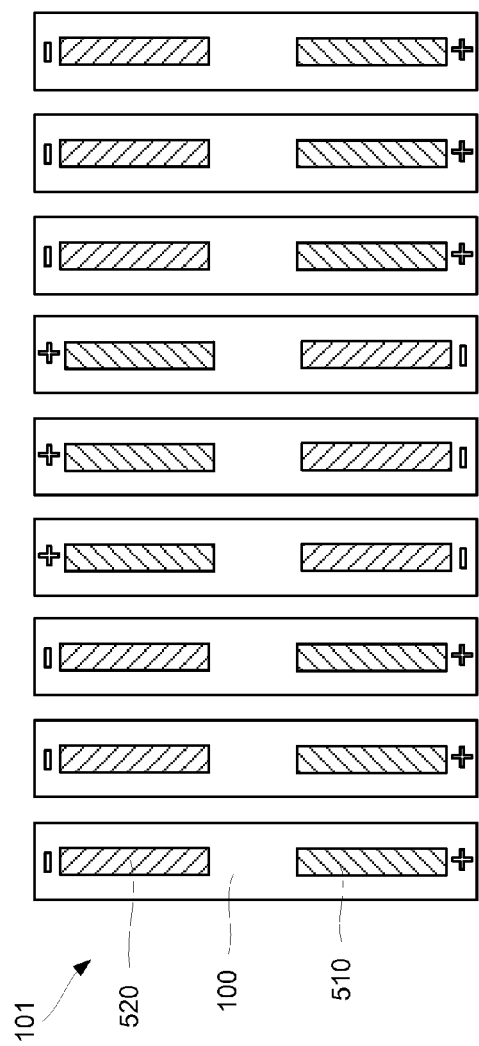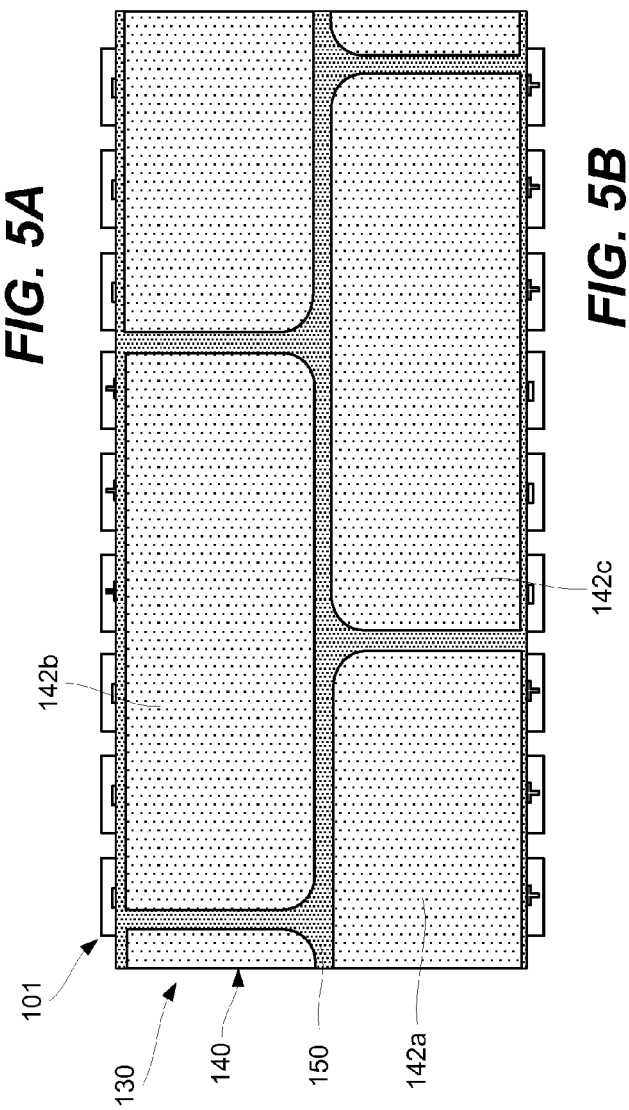

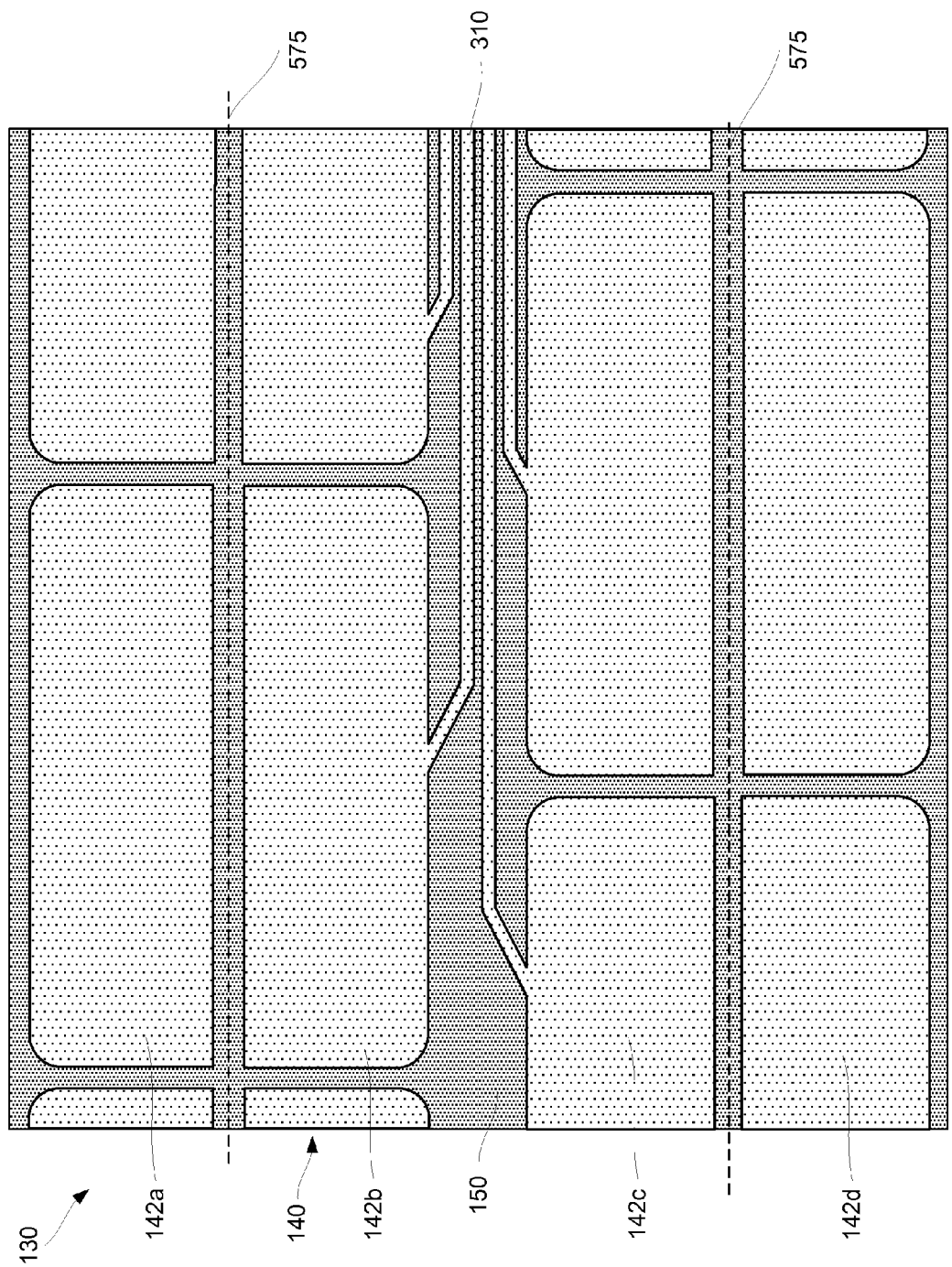

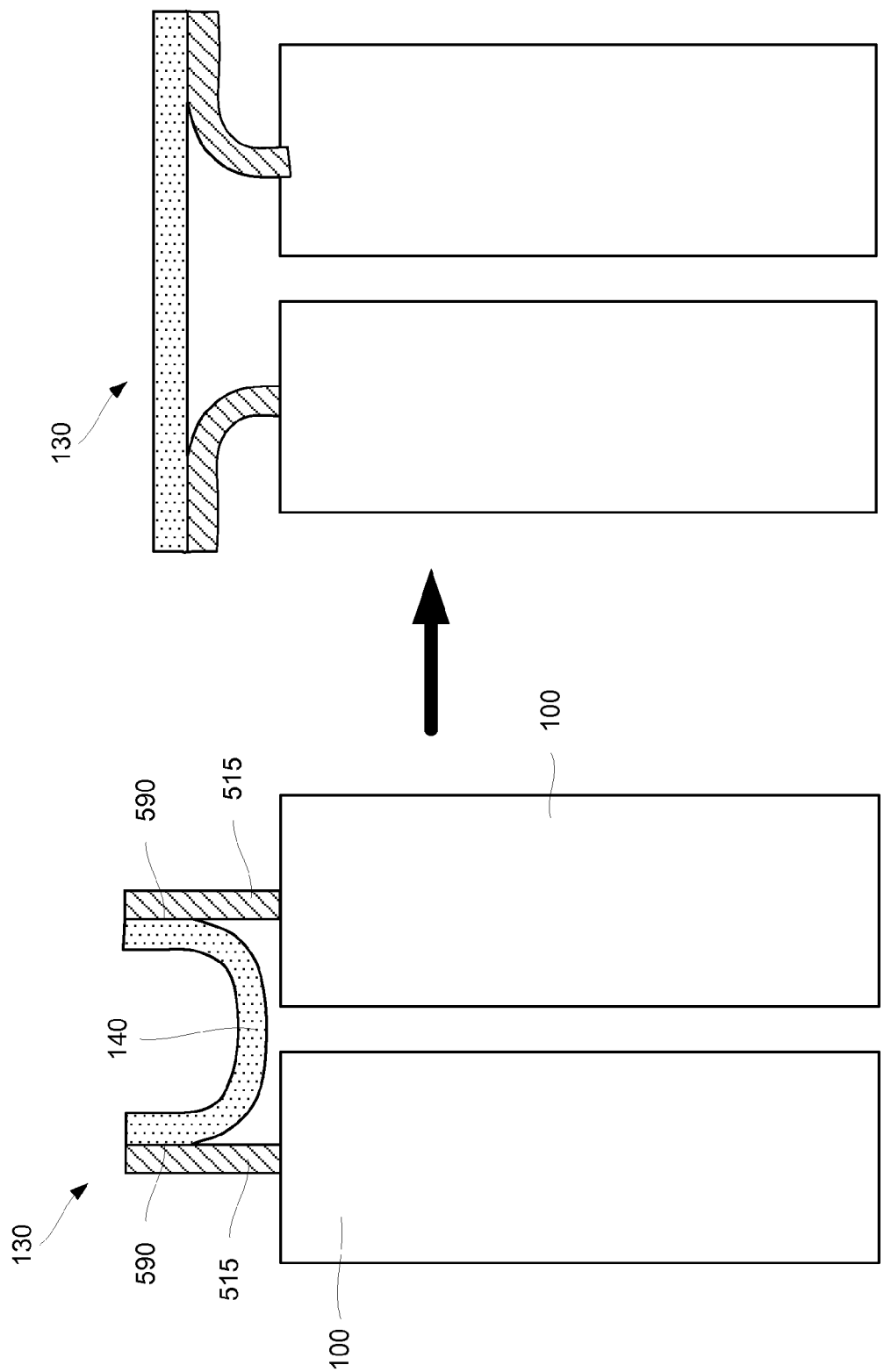

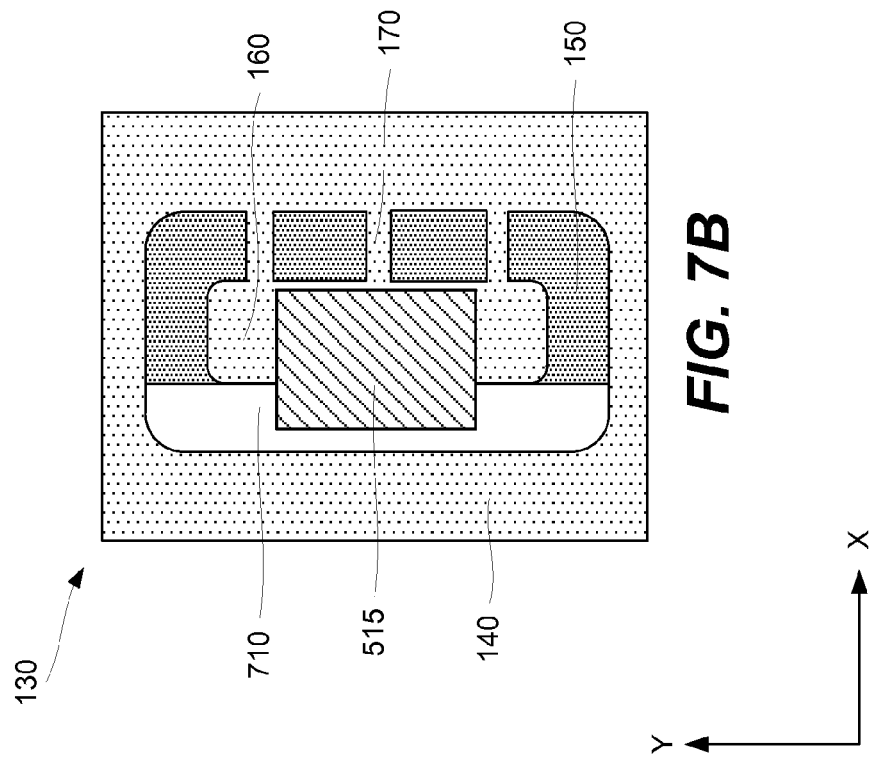
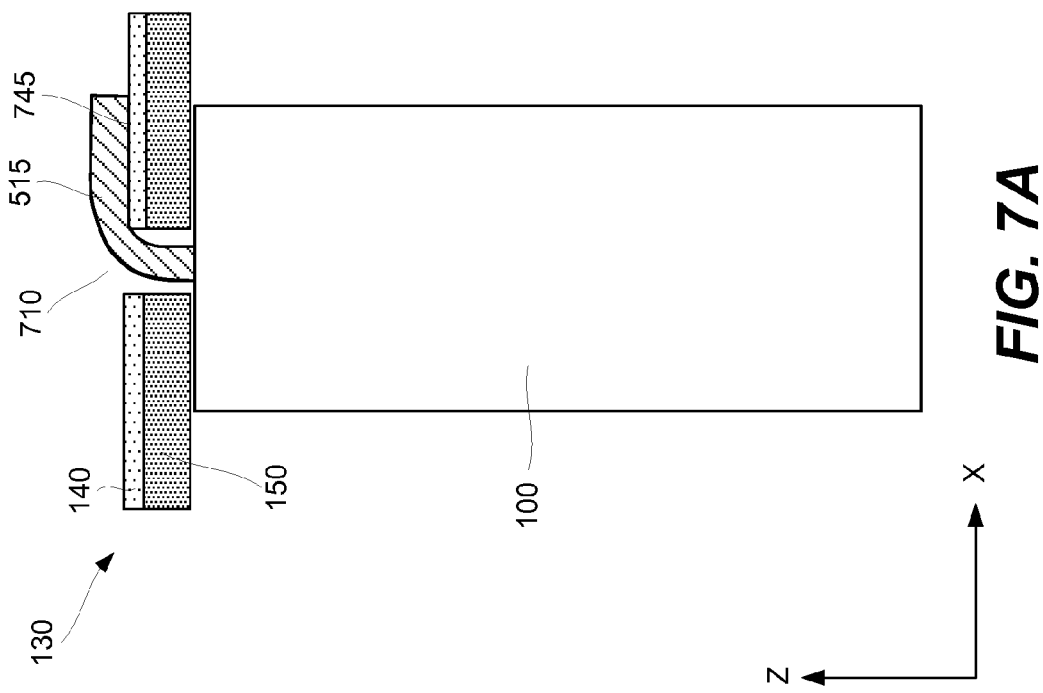
FIG. 7B
FIG. 7A

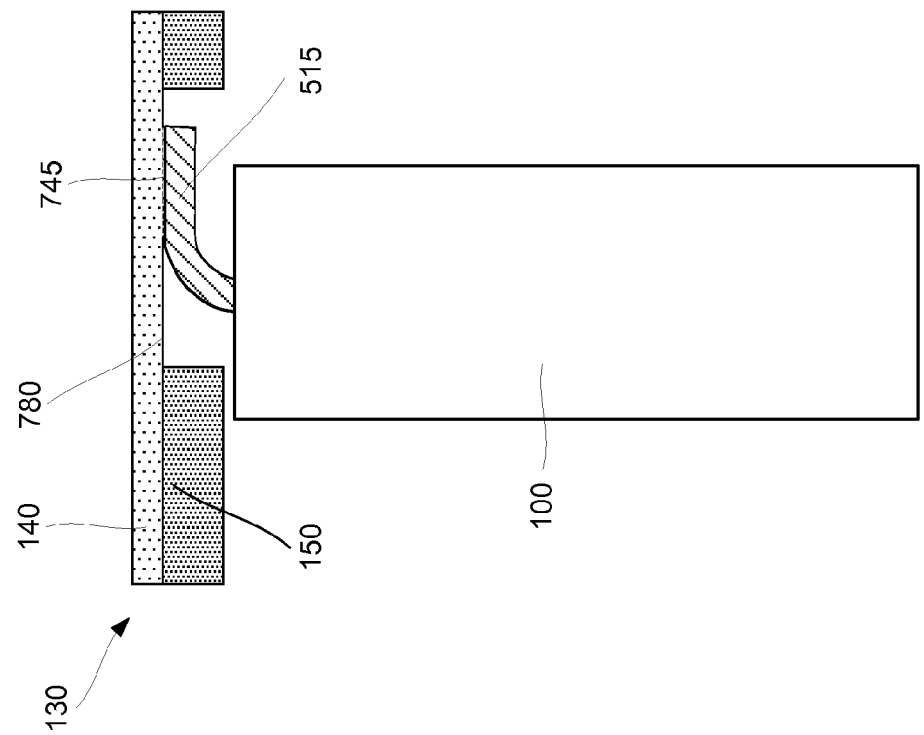
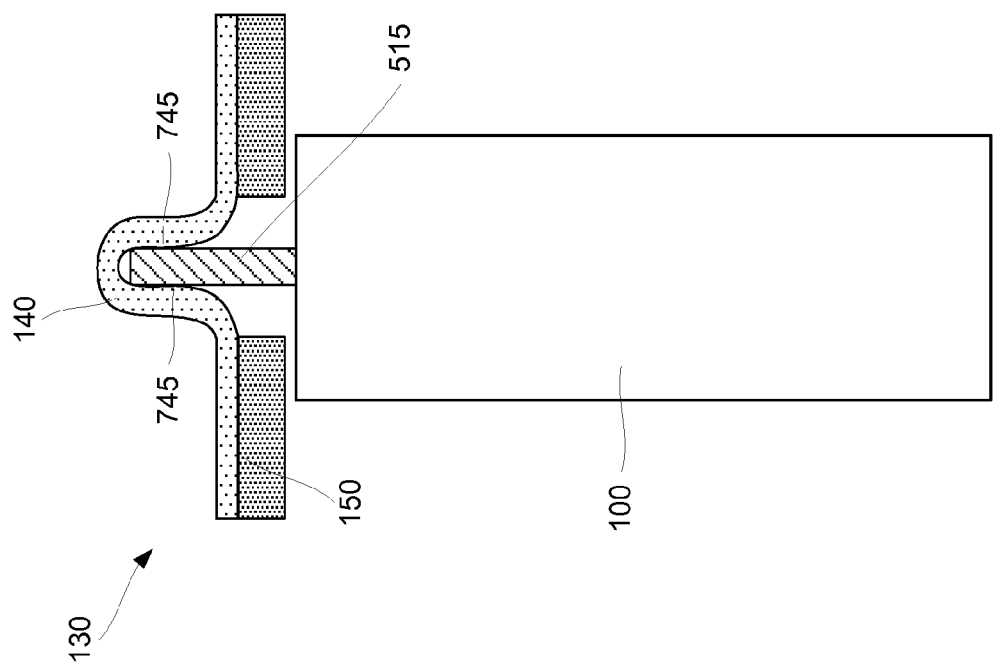

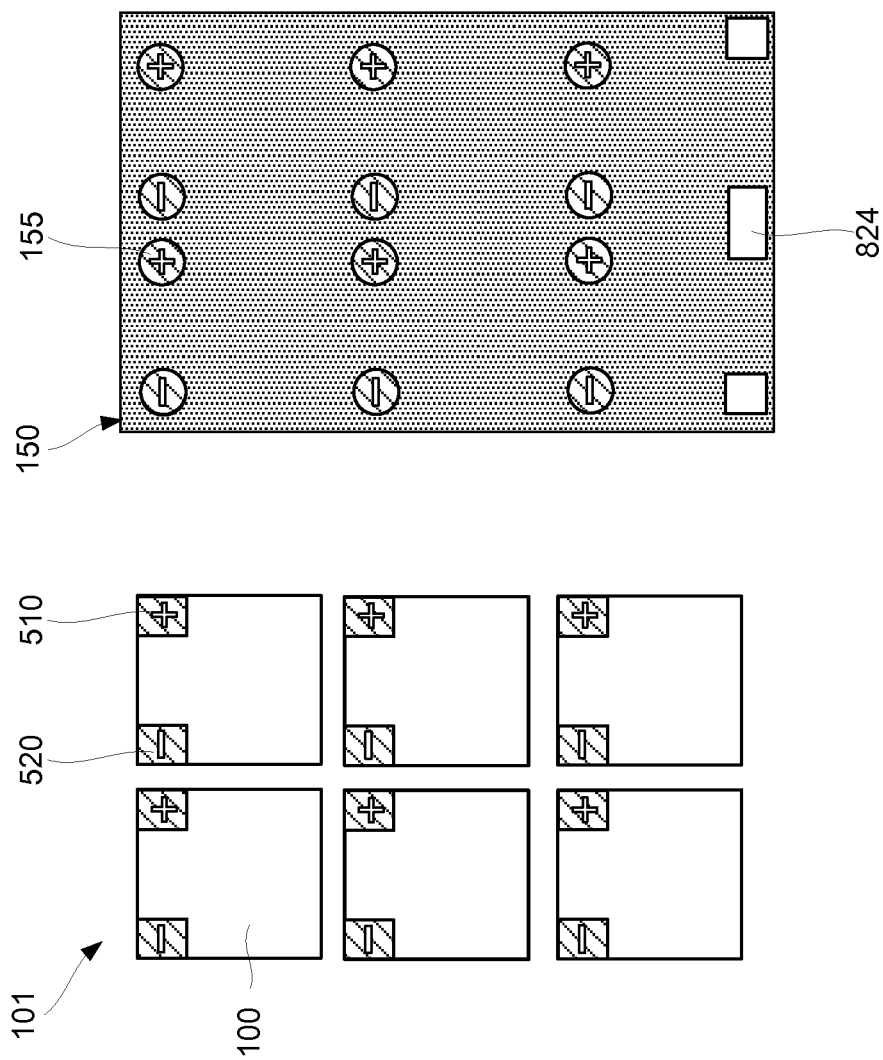

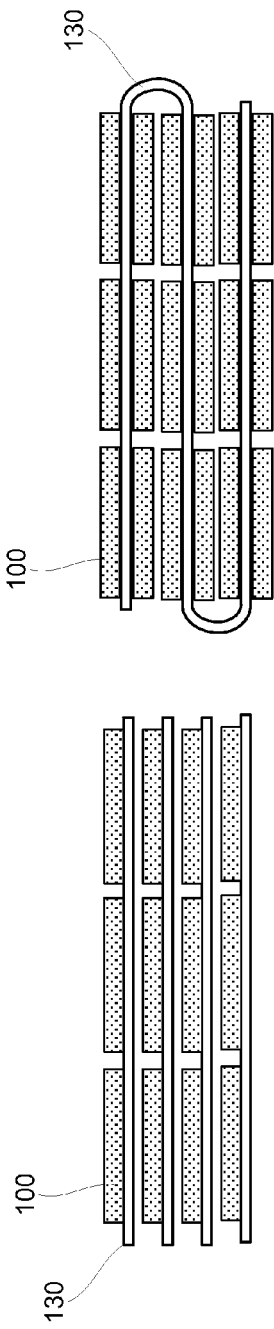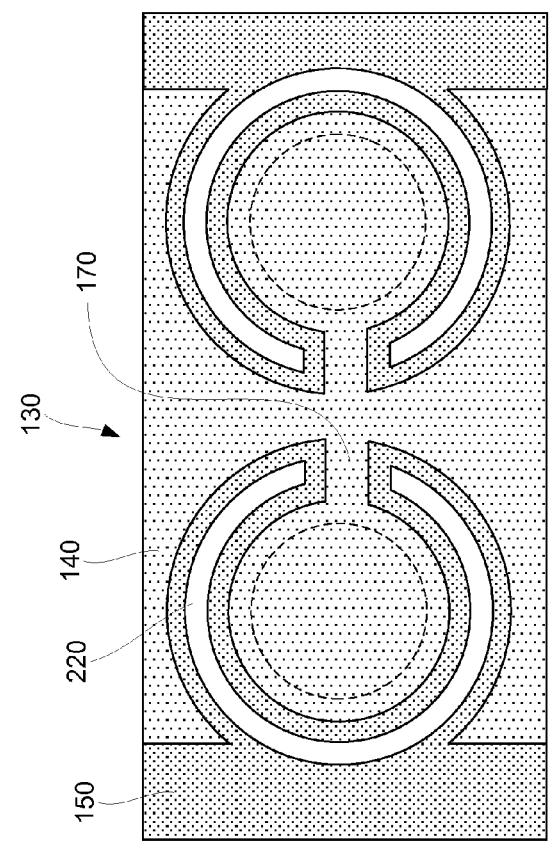

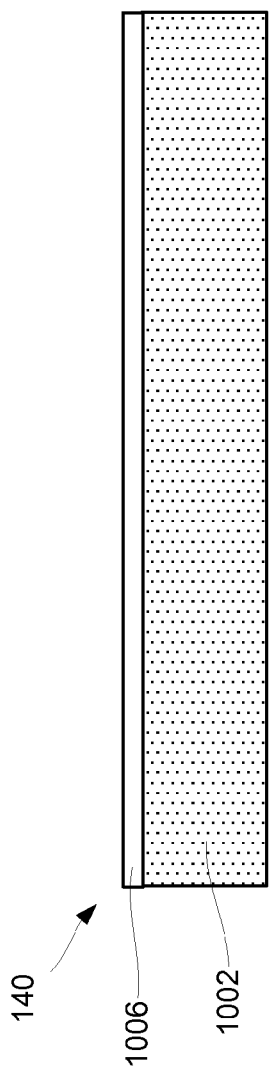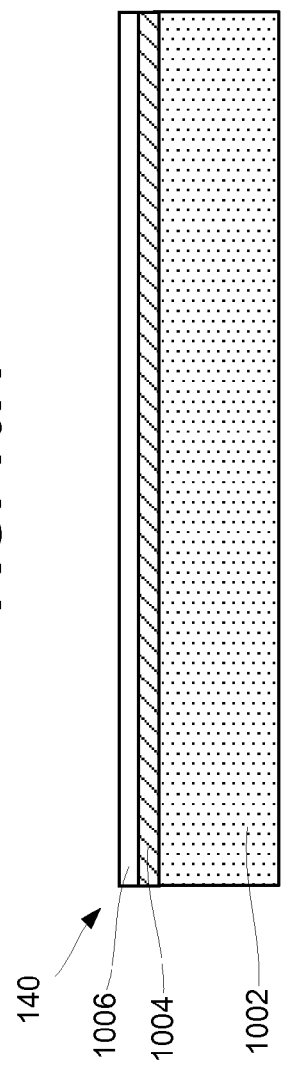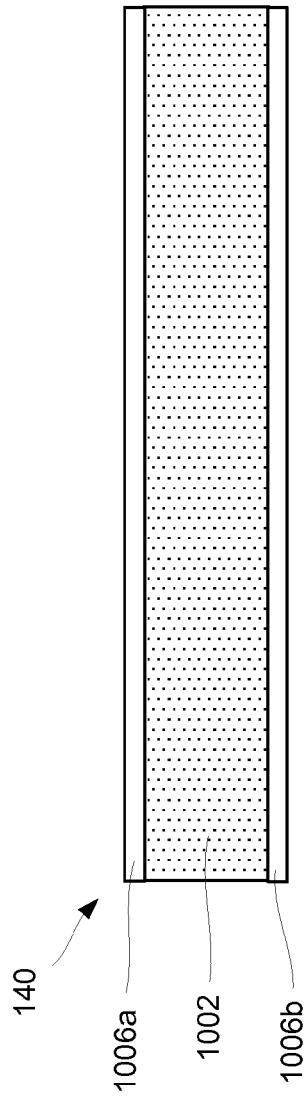

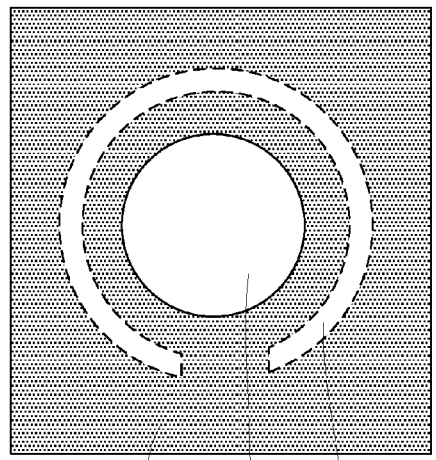
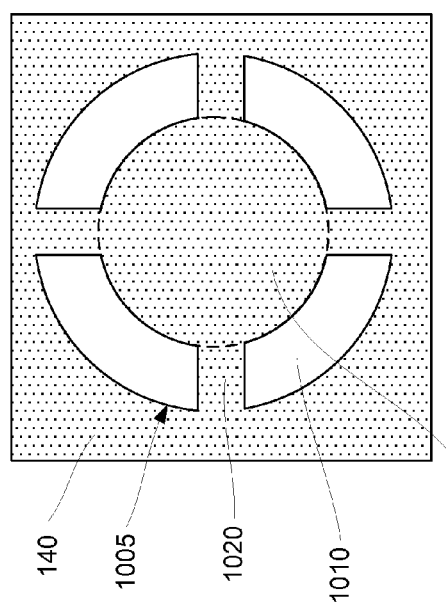
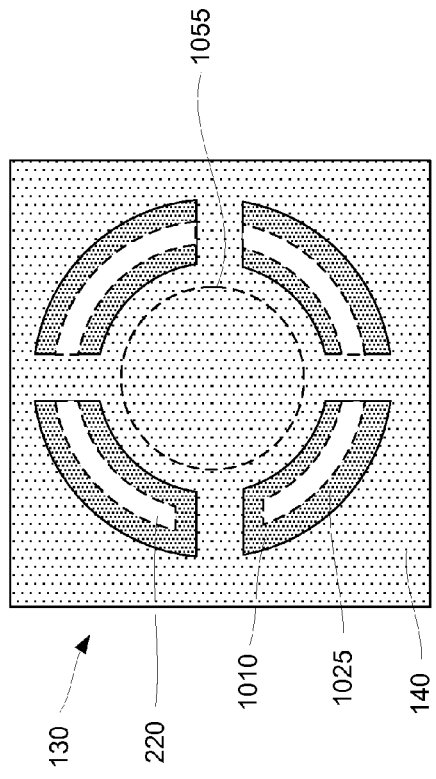

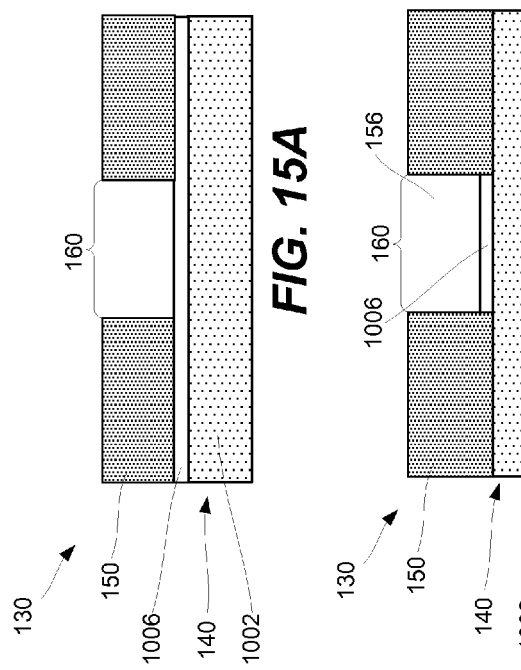
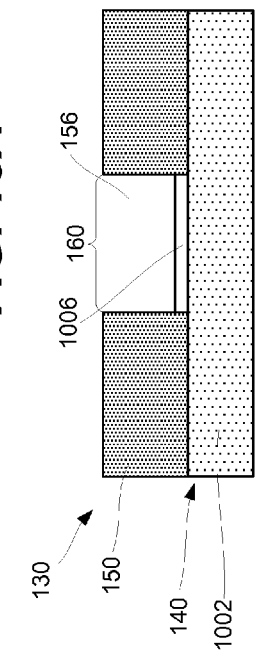
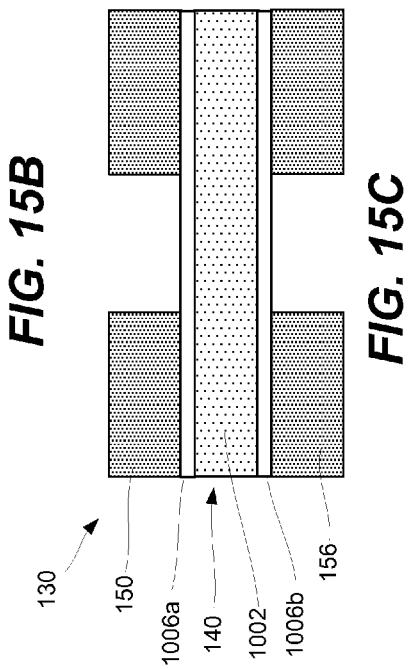
FIG. 15A
FIG. 15B
FIG. 15C

INTERCONNECT FOR BATTERY PACKS

CROSS-REFERENCE TO RELATED APPLICATIONS

This application claims the benefit under 35 U.S.C. §119 (e) of US Provisional Patent Application 62/048,404, entitled: "INTERCONNECT FOR BATTERY PACKS" filed on Sep. 10, 2014, U.S. Provisional Patent Application 62/080,971, entitled: "INTERCONNECT FOR BATTERY PACKS" filed on Nov. 12, 2014, and U.S. Provisional Patent Application 62/111,333, entitled: "INTERCONNECT FOR BATTERY PACKS" filed on Feb. 3, 2015, all of which are incorporated herein by reference in their entirety.

BACKGROUND

Rechargeable batteries represent a promising technology for providing large-scale energy storage for mobile and stationary applications. In order for the market penetration of this technology to increase, the cost of battery packs must be decreased. While the battery cells (e.g., lithium-ion cells) have traditionally been and probably are still the most expensive components in battery packs, the cost of the battery cells is expected to decrease over time with economies of scale, new materials, and design improvements. Furthermore, the performance and lifetime of the battery cells is expected to increase, leading to new high-durability applications needing robust connections and conductors. This trend will place more emphasis on the cost, performance, and reliability of other components in battery packs as well as efficient methods of assembling battery packs using these components.

The electrical interconnects and battery monitoring systems (BMS) in battery packs are two areas in which performance and component costs will be focused on. Many conventional battery packs are assembled using bulky metal plates with complex features. These metal plates are used for interconnecting individual battery cells in packs and to carry current among these cells and/or terminals of the packs. The plates are frequently wired to the individual cells using separate fuse or connector wires, which are designed to protect the individual cells against over-currents and thermal runaway. These fuse wires are fragile and are prone to breakage under the stress and vibration conditions typically encountered in the field. Furthermore, each plate is typically attached to the cells as a freestanding component. This individualized assembly drives up costs and the overall complexity of manufacturing the pack, which in turn negatively impacts safety and robust performance of the battery packs.

SUMMARY

Provided are interconnect circuits for interconnecting arrays of battery cells and methods of forming these interconnect circuits as well as connecting these circuits to the battery cells. An interconnect circuit may include a conductive layer and one or more insulating layers. The conductive layer may be patterned with openings defining contact pads, such that each pad is used for connecting to a different battery cell terminal. In some embodiments, each contact pad is attached to the rest of the conductive layer by a fusible link formed from the same conductive layer as the contact pad. The fusible link controls the current flow to and from this contact pad. The insulating layer is laminated to the conductive layer and provides support to the contacts pads. The insulating layer may also be patterned with openings, which allows for forming electrical connections between the contact pads and cell terminals through the openings in the insulating layer.

In some embodiments, a method of forming an interconnect circuit for interconnecting an array of battery cells involves forming a set of conductive layer openings in a conductive layer. The conductive layer openings in the set are separated from each other by two or more connecting tabs. For example, four conductive layer openings may be separate by four connecting tabs, one tab between each pair of adjacent layer openings. The set of the conductive layer openings and the two or more connecting tabs surround and define a region of the conductive layer. As further described below a region may be a contact pad an island including multiple conductive tabs, a lead, or any other conductive feature of the interconnect circuit. In some embodiments, multiple sets of conductive layer openings are formed on the same conductive layer at the same time. For example, each set may correspond to a different one of contact pads. After forming the set of the conductive layer openings, the two or more connecting tabs mechanically support and maintain registration of the region of the conductive layer relative to other portions of the conductive layer. In some embodiments, the two or more connecting tabs may be evenly distributed around the region of the conductive layer to provide uniform support.

The method may proceed with laminating the conductive layer having the set of the conductive layer openings to a support layer. After laminating the conductive layer to the support layer, the support layer mechanically supports and maintains registration of the region of the conductive layer relative to the other portions of the conductive layer. As such, some or all of the two or more connecting tabs may be removed as support from these opening is not needed. It should be noted that one or more connecting tabs may be completely or partially retained in order to provide electrical connections to the region of the conductive layer.

The method may proceed with removing at least one of the two or more connecting tabs. Specifically, removing the at least one of the two or more connecting tabs converts the set of the conductive layer openings into a continuous conductive layer channel at least partially surrounding and defining the region of the conductive layer. In some embodiments, at least another one of the two or more connecting tabs is retained while removing the at least one of the two or more connecting tabs. This retained connecting tab may be used to interconnect the region of the conducive layer with the other portions of the conductive layer. The retained connecting tab may be operable as a fusible link and may limit an electrical current level between the region of the conducive layer with the other portions of the conductive layer. In some embodiments, the continuous conductive channel ends at the retained tab. In these embodiments, the continuous conductive channel may have an open ring shape. Alternatively, removing the at least one of the two or more connecting tabs involves removing all of the two or more connecting tabs. In this case, the region of the conductive layer may remain unconnected to other parts of the conductive layer. For example, the region may be a standalone island comprising multiple contact pads.

In some embodiments, removing the at least one of the two or more connecting tabs also removes at least one support layer portion of the support layer laminated to the at least one of the two or more connecting tabs. For example, the support layer may be a temporary releasable liner that is later removed and, in some embodiments, replaced with another layer, e.g., a second insulating layer. In this case, any openings made in the support layer, such as by removing support layer portions) do not impact the resulting structure of the interconnect circuit because the support layer is later removed. Alternatively, the support layer may be retained as a part of the interconnect circuit. Specifically, the support layer may be operable as a first insulating layer and remains a part of the interconnect circuit. In these cases, the removed support layer portions become parts of the interconnect circuit. In some embodiments, the removed support layer portions leave openings in the layer. However, these openings may not impact the layer's performance.

In some embodiments, the support layer remains substantially intact while removing the at least one of the two or more connecting tabs. A technique used to remove the at least one connecting tab may not impact the support layer even though, in some embodiments, this removed connecting tab may be laminated to the support layer.

In some embodiments, the method also involves laminating a first insulating layer to the conductive layer. This lamination is performed after removing the at least one of the two or more connecting tabs. After the lamination, the conductive layer is disposed between the first insulating layer and the support layer. In some embodiments, after laminating the first insulating layer to the conductive layer, the method involves removing the support layer from the conductive layer. The conductive layer can now be removed because the conductive layer and its components are supported by the first insulating layer after the lamination. Alternatively, the support layer may be retained as a part of the interconnect circuit and may be operable as another insulating layer (e.g., a second insulating layer).

Prior to laminating the first insulating layer to the conductive layer, the first insulating layer may include first insulating layer slits. These slits may be used to increase flexibility of a portion of the first insulating layer, for example, the portion that later surrounds a contact pad. After laminating the first insulating layer to the conductive layer, the first insulating layer slits are positioned within a boundary of the continuous conductive layer channel. In some embodiments, the slits are formed after laminating the first insulating layer to the conductive layer, e.g., through the conductive layer channel. More specifically, the slits may be formed after removing the support layer from the conductive layer.

In some embodiments, prior to laminating the first insulating layer to the conductive layer, the first insulating layer includes a first insulating layer opening. After laminating the first insulating layer to the conductive layer, at least one of the insulating layer openings overlaps with the region of the conductive layer. Specifically, edges of the region of the conductive layer are supported by the first insulating layer. In this case, despite having the first insulating layer opening, the first insulating layer may provide support to all edges of the region. In some embodiments, the first insulating layer opening is aligned or, more specifically, centered with respect to a contact pad, which may occupy the entire region or a part thereof.

In some embodiments, after removing the support layer from the conductive layer, the method may also involve laminating a second insulating layer to the conductive layer such that the conductive layer is disposed between the first insulating layer and the second insulating layer. The support layer is effectively replaced by the second insulating layer. In these embodiments, the first insulating layer may include a first insulating layer opening, wherein the second insulating layer may include a second insulating layer opening partially overlapping with the first layer opening. For purposes of this disclosure, the term "overlap" refers of overlapping of projections of a common surface, e.g., a surface of the conductive layer facing one of the insulating layers. As such, two overlapping features do not need to be in direct contact with each other, such as openings of the first insulating layer and openings of the second insulating layer.

In some embodiments, the interconnect circuit is further bonded to a heat sink. More generally, the interconnect circuit may be thermally coupled to the heat sink. For example, portions of the conductive layer may directly interface the heat sink.

In some embodiments, prior to laminating the conductive layer to the support layer, the method may involve forming the conductive layer having a base sublayer and a surface sublayer. The base sublayer has a different composition than the surface sublayer. For example, the base sublayer may be formed from aluminum, while the surface sublayer may be formed from a material other than aluminum, such as a material that is more resistant to oxidation and/or easier to form electrical connections to. The forming operation may involve forming the surface sublayer over the base sublayer. In some embodiments, the surface layer directly contacts at least one of a first insulating layer or a second insulating layer in the interconnect circuit.

In some embodiments, forming the conductive layer also involves forming the intermediate sublayer over the base sublayer and prior to forming the surface sublayer. The composition of each of the base sublayer and the surface sublayer may be different from a composition of the intermediate sublayer. The intermediate sublayer may be used, for example, to prevent diffusion between the base sublayer and surface sublayer and, for example, to prevent alloying of materials of the base sublayer and surface sublayer.

Also provided is an interconnect circuit for interconnecting an array of battery cells. The interconnect circuit may include a conductive layer and first insulating layer. The conductive layer may include a region and continuous conductive channel at least partially surrounding and defining the region. The conductive layer may include a base sublayer and surface sublayer. The base sublayer and surface sublayer have different compositions. The base sublayer may include aluminum. The first insulating layer is laminated to the surface sublayer of the conductive layer. In some embodiments, the first insulating layer includes first insulating layer openings. At least one of the first insulating layer openings at least partially overlaps with the region of the conductive layer. In some embodiments, the base sublayer is at least 10 times thicker than the surface sublayer.

In some embodiments, the region comprises multiple contact pads. These contact pads may be a part of a continuous sheet of the region that does not have any openings defining the contact pads. In this case, the region may be viewed as a conductive layer island. Alternatively, the region itself is a contact pad. In this case, the region may be connected to one or more other regions of the same conductive layer by various portions of the conductive layer, such as voltage leads, fusible links, and the like.

In some embodiments, edges of the region of the conductive layer are supported by the first insulating layer. In this case, the at least one of the first insulating layer openings at least fully overlaps with the region of the conductive layer such that edges of the conductive layer does not extend through the opening.

In some embodiments, the interconnect circuit also includes a second insulating layer laminated to the conductive layer such that the conductive layer is disposed between the first insulating layer and the second insulating layer. The second insulating layer may include second insulating layer openings. At least one of the second insulating layer openings overlaps with the at least one of the first insulating layer openings. The conductive layer may include an additional surface sublayer such that the base sublayer is disposed between the additional surface sublayer and the surface sublayer. The second insulating layer may be laminated to the additional surface sublayer of the conductive layer. In some embodiments, the second insulating layer includes an adhesive sublayer forming a surface of the second insulating layer opposite of the conductive layer. The first insulating layer may include an adhesive sublayer forming a surface of the first insulating layer opposite of the conductive layer.

In some embodiments, the conductive layer includes one or more additional conductive layer channels. Each of the one or more additional conductive layer channels may partially surround a different one of contact pads. More specifically, the one or more additional conductive layer channels may be a part of the region of the conductive layer. The contact pads within this region may be electrically interconnected with each other.

In some embodiments, the conductive layer also includes a fusible link extending between and electrically interconnecting the region and a remaining portion of the conductive layer. The fusible link may be configured to limits an electrical current level between the region of the conductive layer with the remaining portion of the conductive layer. In some embodiments, the conductive layer channel has a shape of an open ring with the fusible link disposed between ends of the conductive layer channel. The fusible link may have a width to thickness ratio of less than 2. In some embodiments, the fusible links is laminated to the first insulating layer.

In some embodiments, the first insulating layer includes multiple slits. The multiple slits overlap with the continuous conductive channel and improve flexibility of a portion the first insulating layer positioned with the boundary of the slits. In some embodiments, this portion of the first insulating layer overlaps with a contact pad of the region of the conductive layer. In some embodiments, the first insulating layer includes at least one tab opening disposed overlapping with the conductive layer channels.

In some embodiments, the interconnect circuit includes a voltage monitoring trace extending between the region of the conductive foil and a set of contact points. At least a portion of the voltage monitoring trace is laminated to a portion of the first insulating layer foldable with respect to a portion of the first insulating layer laminated to the region.

BRIEF DESCRIPTION OF THE DRAWINGS

Various embodiments are disclosed in the following detailed description and the accompanying drawings.

FIG. 2A is a plan view schematic diagram illustrating an example of a portion of an insulating layer, in accordance with some embodiments.

FIG. 2B is a plan view schematic diagram illustrating an example of a portion of a contact layer including a contact pad, in accordance with some embodiments.

FIGS. 2C and 2D are plan view schematic diagrams of different interconnect circuits, in accordance with some embodiments.

FIGS. 2F and 2G are plan view schematic diagrams of an interconnect circuit during various fabrication stages, in accordance with some embodiments.

FIG. 2H is a cross-sectional view schematic diagram of the interconnect circuit also shown in FIG. 2G illustrating flexibility of the contact pad, in accordance with some embodiments.

FIG. 5A is a plan view schematic diagram of an array of prismatic battery cells, in accordance with some embodiments.

FIG. 5B is a plan view schematic diagram of an interconnect circuit suitable for interconnecting prismatic battery cells, in accordance with some embodiments.

FIG. 5D is a plan view schematic diagram of an interconnect circuit suitable for interconnecting prismatic battery cells, in accordance with some embodiments.

FIGS. 5F and 5G are side view schematic diagrams illustrating the interconnection of terminals of prismatic battery cells with an interconnect circuit at different stages of fabricating the circuit, in accordance with some embodiments.

FIGS. 7A-7D are side, plan, side, and side view schematic diagrams, respectively, illustrating the interconnection of a terminal of a prismatic battery cell with an interconnect circuit, in accordance with some embodiments.

FIG. 8A is a plan view schematic diagram illustrating an example of a group of battery cells, in accordance with some embodiments.

FIG. 8B is a hypothetical plan view schematic diagram illustrating an example of an insulating layer disposed over the group of cylindrical battery cells (shown in FIG. 8A) to illustrate alignment of openings in the insulating layer relative to terminals the battery cells.

FIGS. 8E-8F are side view schematic diagrams illustrating various arrangements of stacked arrays of battery cells and interconnect circuits, in accordance with some embodiments.

FIG. 8G is a plan (top) view schematic diagram of an interconnect circuit in the vicinity of a contact to a battery cell, in accordance with some embodiments.

FIGS. 10A-10C are side view schematic diagrams illustrating various examples of conductive layers, in accordance with some embodiments.

FIG. 11A is a plan view schematic diagram illustrating an example of a portion of a conductive layer having a contact pad, in accordance with some embodiments.

FIG. 11B is a plan view schematic diagram illustrating an example of a portion of a support layer, in accordance with some embodiments.

FIG. 11C is a plan view schematic diagram of an interconnect circuit, in accordance with some embodiments.

FIG. 15A-15C are side view schematic diagrams of different laminates each including a conductive layer and one or more insulating layers, in accordance with some embodiments.

Figure 1A:
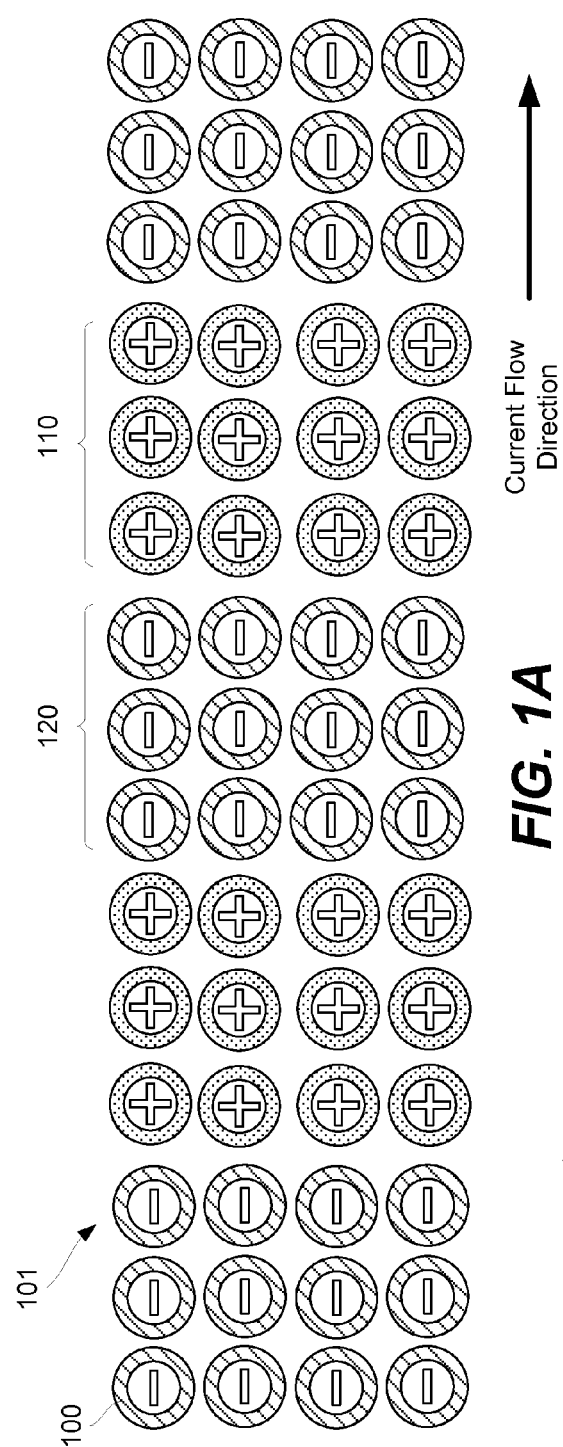
FIG. 1A is a plan view schematic diagram illustrating an example of an array of cylindrical battery cells, in accordance with some embodiments.

The foregoing summary, as well as the following detailed description of some embodiments of the presently described technology, will be better understood when read in conjunction with the appended drawings. For the purpose of illustrating the presently described technology, some embodiments are shown in the drawings. It should be understood, however, that the presently described technology is not limited to the arrangements and instrumentality shown in the attached drawings. Moreover, it should be understood that the components in the drawings are not to scale and the relative sizes of one component to another should not be construed or interpreted to require such relative sizes.

DETAILED DESCRIPTION

The ensuing detailed description of embodiments of this disclosure will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

INTRODUCTION

Many modern battery packs includes many cells that need to be interconnected and connected to terminals of a battery pack. For example, the Model S manufactured by Tesla Corporation in Palo Alto, Calif. has thousands of 18650 battery cells. The success of many battery applications often depends on robust, reliable, and inexpensive interconnect circuitry. Some interconnect circuits use rigid metal plates connected to cell terminals and extending across multiple cells. While these plates can transmit large currents and can be used for mechanical support, these plates are expensive to manufacture and connect to the battery terminals. Furthermore, the rigidity may often interfere with relative motion between the cells and plates, potentially resulting in the loss of electrical connections.

Flexible interconnect circuits may provide more reliable electrical connections, may be easier to manufacture, connect to cell terminals, and fit into packs. The flexible circuits may also provide fusing functionality as further described below. Some flexible interconnects utilize printed circuits. However, such circuits are generally limited to low current applications. Specifically, the thickness of conductive elements is limited by mask-and-etch capabilities, which are generally not suitable for high aspect ratio features and thick layers. Furthermore, the prolonged etching required for thicker layer drives up the production cost of the flex circuit. At the same time, many modern battery cells are capable of operating at currents on the order of 10-200 A, such as during a rapid charge or a rapid discharge. This, in turn, necessitates the use of relatively thick conductive layers (e.g., 70 to 1000 microns).

In addition, the extra thickness required for high currents makes it difficult to form fuses or fusible links with a controlled cross-sectional area. A fusible link may be used to break the connection between the battery cell and interconnect circuit when the current exceeds through the link exceeds a certain threshold. When forming a fusible link by etching a thick conductive layer, it may be difficult to mask and etch a controlled narrow trace. Specifically, when etching is used, the minimum trace width must generally be four to five times greater than the metal thickness to avoid excessive undercutting during etching. For example, a 140 micron thick conductive layer may be used to form traces (fusible links) that are at least 560-700 microns wide, which may be excessive for some applications.

Provided are interconnect circuits for interconnecting arrays of battery cells. In some embodiments, an interconnect circuit includes a conductive layer and one or more insulating layers. For example, a conductive layer may be disposed between two insulating layers. One or both insulating layers may have openings for making coupling the conductive layer to battery cell terminals. The conductive layer may be patterned with openings defining contact pads or some other features. Each contact pad may be used for connecting to a different battery cell terminal. In some embodiments, each contact pad is attached to the rest of the conductive layer by a fusible link. The fusible link is formed from the same conductive layer as the contact pad. The fusible link controls the current flow to and from this contact pad and breaks when the current exceeds a set threshold. In some embodiments, the conductive layer may include a base sublayer and surface sublayer. The composition of the surface sublayer may be selected such that it is more capable of forming mechanical connections (to battery cell terminals and insulating layer) and electrical connections (to battery cell terminals). The base sublayer may be used for mechanical support and conducting most of the electrical current through the conductive layer. As such, the thickness of the base sublayer may be substantially greater (e.g., between about 5 and 10000 times greater) than the thickness of the surface sublayer.

Also provided are methods of forming interconnect circuits as well as connecting these circuits to the battery cells. The method may involve forming a conductive layer or, more specifically, with forming a surface sublayer on a base sublayer. The method may also involve forming multiple sets of first openings in the conductive layer. It should be noted that openings in the conductive layers are formed during two different operations. Specifically, first conductive layer openings are formed during the first operation, while second conductive layer openings are formed during a separate operation. In between these two operations, a support layer is laminated to the conductive layer to provide support to and maintain registration between various structures when the second conductive layer openings are formed. It should also be noted that when the first conductive layer openings are formed, these structures are well supported by connecting tabs that remain in the conductive layer following the formation of the first conductive layer openings. Some or all of these connecting tabs are later removed during the second operation.

Examples of Interconnect Circuits and Battery Packs

In some embodiments, an interconnect circuit described herein may be used to electrically connect a group of battery cells having different terminals on opposing sides of the cells. For example, a cylindrical battery cell may have one terminal (e.g., a positive terminal) on one end of the cylindrical shape and another terminal on the opposite end. The connections between batteries in the group may be in series, parallel, or various combinations of series and parallel connections. Furthermore, the same interconnect circuit may be used to interconnect different groups of battery cells.

An example of battery cells 100 arranged into group 101, which may be also referred to as an array, is shown in a plan view in FIG. 1A. Specifically, FIG. 1A illustrates battery cells 100, which may be cylindrical cells having different polarities on their top sides and bottom sides of cells 100. These sides may be referred to as positive sides and negative sides. Depending on the orientation of each cell 100 in group 101, the top surface of group 101 may be formed all positive sides, all negative sides, or various combinations of positive sides and negative sides. In some embodiments, group 101 may include two or more subgroups such that orientation of cells 100 in each subgroup is the same. For example, FIG. 1A illustrates group 101 having five subgroups with twelve cells in each subgroup. Subgroups 110 and 120 are specifically identified in this figure. In subgroup 110, all cells have their positives sides facing up. On the other hand, in subgroup 120, all cells have their negative sides facing up. When arranged into a battery pack, cells 100 in each of subgroups 110 and 120 may be connected in parallel (at least within the respective subgroup). At the same time, subgroups 110 and 120 may be interconnected in series. These connections may be formed by the same interconnect circuit as further described below. One having ordinary skills in the art would understand that various other orientations of the cells and interconnection schemes are possible. In some embodiments, battery cells 100 are lithium-ion, lithium polymer, nickel metal hydride, nickel cadmium, lead acid, or other rechargeable cells. The form factor of battery cells 100 may be 10180, 10280, 10440 ("AAA cells"), 14250, 14500 ("AA cells"), 14650, 15270, 16340, 17340 ("R123 cells"), 17500, 17670, 18350, 18500, 18650, 19670, 25500 ("C cells"), 26650, and 32600 ("D cells"), or custom-geometry cells.

Figure 1B:
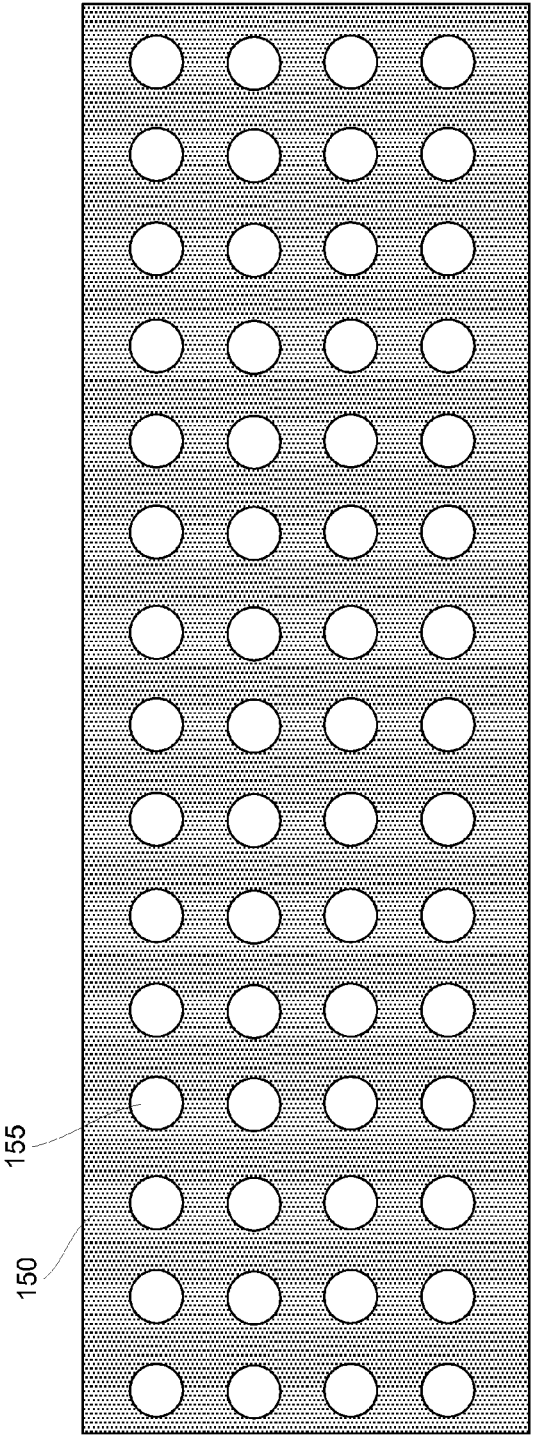
FIG. 1B is a plan view schematic diagram illustrating an example of an insulating layer, in accordance with some embodiments.

Battery cells 100 arranged as group 101 may be interconnected by the same interconnect circuit, which includes at least a conductive layer and insulating layer. FIG. 1B illustrates insulating layer 150 of the interconnect circuit, in accordance with some embodiments. Insulating layer 150 includes insulating layer openings 155, which are aligned with the terminals of the battery cells when the interconnect circuit is connected to these cells. As such, the locations of openings 155 depend on the locations of the cells in the battery pack or, more specifically, on the locations of the cell terminals. The size of openings 155 may be sufficient for the cell terminals to protrude into openings 155 in order to make electrical connections to the conductive layer. In some embodiments, the size of openings 155 is between 25% and 250% of the diameter of cells 100 or, more specifically, between 50% and 150%. The shape of openings 155 may be similar to the shape of the cell terminals protruding through openings. Openings 155 may be formed prior to laminating insulating layer 150 to the conductive layer as further described below. Openings 155 may be formed using techniques including, but not limited to, punching, flat bed die cutting, match-metal die cutting, male/female die cutting, rotary die cutting, laser cutting, laser ablation, waterjet cutting, machining, or etching. In some embodiments, insulating layer 150 has additional openings that are used to improve the flexibility of insulating layer 150, e.g., bending in particular directions. These additional openings may be in the form of slots, for example, as further described below with reference to FIGS. 2C and 2D.

The thickness of insulating layer 150 may be between 1 micron and 500 microns or, more specifically, between 10 microns and 125 microns. In some embodiments, insulating layer 150 includes an adhesive sublayer disposed on one or both surfaces. For example, the adhesive sublayer may form a surface of insulating layer 150 that is later laminated to the conductive layer. In some embodiments, the surface of insulating layer 150 facing battery cells includes adhesive sublayer for bonding to the battery cells.

Insulating layer 150 provides electrical isolation and mechanical support to the conductive foil layer and, in some embodiments, other layers of the interconnect circuit. In some embodiments, insulating layer 150 may initially be processed in sheet or roll form and may subsequently be laminated to the conductive layer using, for example, adhesive material. Insulating layer 150 may include, but are not limited to, polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), or polyvinyl butyral (PVB). The composition and thickness of insulating layer 150 may be chosen to minimize distortion of openings 155 and features of the conductive layer further described below (such as contact pads). This distortions may occur during fabrication of the interconnect circuit, during connection of the interconnect circuit to the battery cells, and during operation of the battery pack. Specifically, insulating layer 150 may help ensure that each contact pad of the conductive layer is properly aligned with a battery cell.

In some embodiments, the interconnect circuit includes a second insulating layer as further shown and described with reference to FIGS. 13A-13C. In these embodiments, the conductive layer is disposed between the two insulating layers. When connected to battery cells, the first insulating layer may be disposed between the cells and conductive layer, while the second insulating layer may be used provide the electrical isolation of the conductive layer from the other elements of the battery pack. In some embodiments, the second insulating layer may be patterned with openings to allow electrical, optical, and/or mechanical access to the top of the contact pads or other outer surfaces of the conductive layer. For example, the second insulating layer may be patterned with openings above the contact pads to provide access to the contact pads during the attachment of the contact pads to terminals of the battery cells. For example, this access may help simplify mechanical joining processes including, but not limited to, laser, resistive, or ultrasonic welding. Furthermore, the second insulating layer may include an adhesive sublayer or, more specifically, a patterned adhesive sublayer in order to bond the interconnect circuit to other components of the battery pack, such as a supporting frame of the battery cells. In some embodiments, this adhesive sublayer uses mechanical pressure, heat, UV activation, and the like.

Figure 1C:
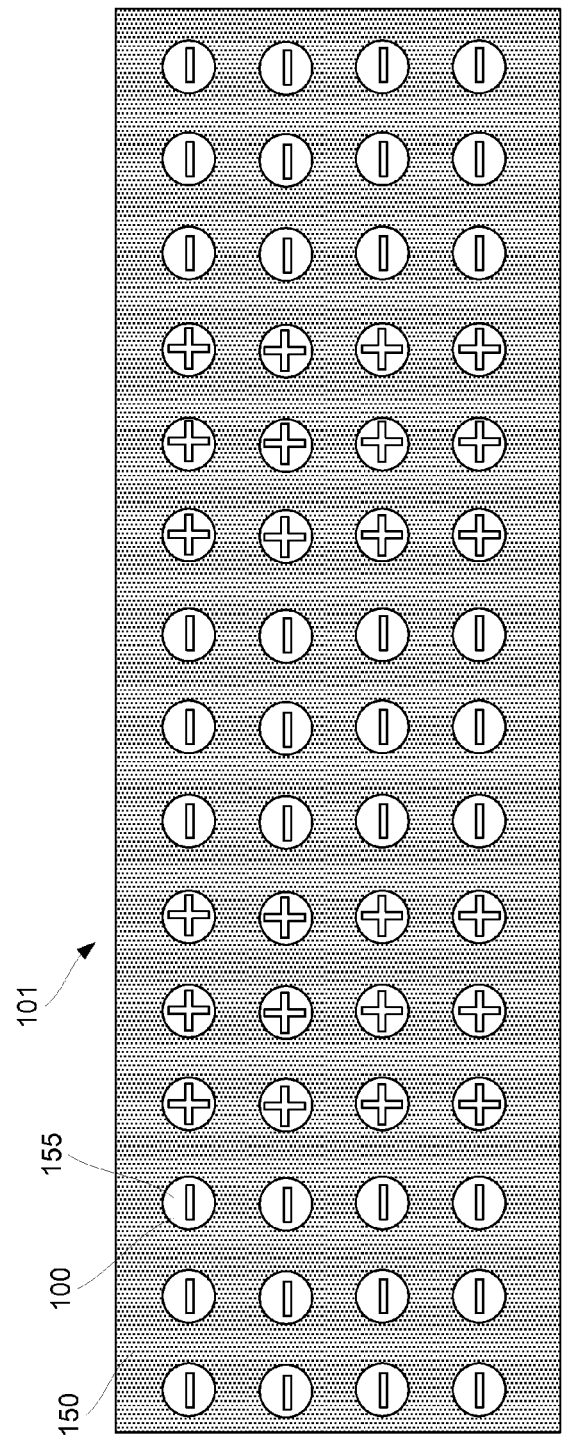
FIG. 1C is a hypothetical plan view schematic diagram illustrating an example of an insulating layer disposed over an array of cylindrical battery cells to illustrate aligned of openings in the insulating layer relative to terminals the battery cells.

FIG. 1C is a hypothetical example of insulating layer 150 disposed over group 101 of cells 100. The conductive layer is not show in FIG. 1C to provide better understanding of the orientation between insulating layer 150 and cells 100. Specifically, each cell terminal is aligned with one of insulating layer openings. The example is hypothetical because insulating layer 150 is generally laminated to the conductive layer before the interconnect circuit is connected to cells 100. After the connection is made, insulating layer 150 is disposed between cells 100 and the conductive layer with connections made through insulating layer openings 155.

Figure 1D:
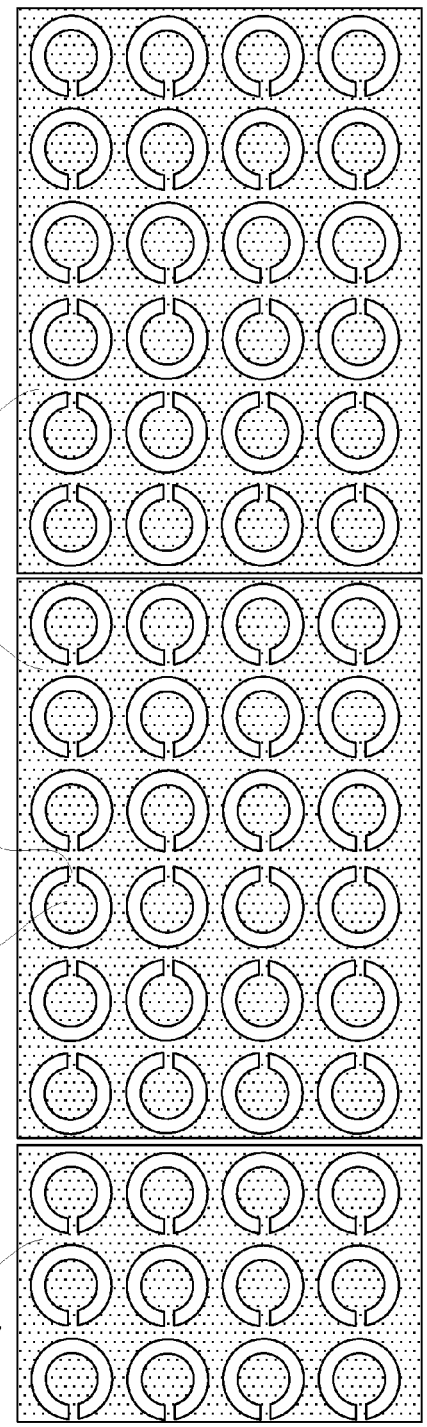
FIG. 1D is a plan view schematic diagram illustrating an example of an conductive layer, in accordance with some embodiments.

FIG. 1D is a hypothetical example of conductive layer 140. The example is hypothetical because conductive layer 140 having formed features, such as contact pads 160 and fusible links 170, is generally supported by a support layer, which may be a temporary releasable liner or an insulating layer. As shown in FIG. 1D, conductive layer 140 includes contact pads 160. In some embodiments, contact pads 160 have a shape of electrically-isolated islands connected to the rest of conductive layer 140 by fusible link 170. Fusible links 170 may be configured to minimize the path length for electrical current traversing the foil islands. For example, fusible links 170 may be oriented towards the subgroup to which it is connected in series. FIG. 1D illustrates one example of orientations of fusible links 170. One having ordinary skills in the art would understand that various other orientations are possible, such as an orientation to achieve the most uniform distribution of the current within conductive layer 140.

FIG. 1D illustrates conductive layer 140 having three different islands 142a, 142b, and 142c, which are electrically isolated from each other. Each of 142a, 142b, and 142c may be electrically connected to battery pack terminals through leads and/or through the battery cells. While conductive foil islands 142a, 142b, and 142c are depicted having a rectangular shape in FIG. 1D, in practice these islands may take any shape that allows the battery cells to be properly interconnected. One reason for varying the shape of these islands is reducing the resistive power loss across conductive layer 140. Another reason may be improving yield by increasing the area of contact pads 160. Another reason may be maximizing or optimizing the density of battery cells in the pack. Yet another reason may be reducing the mechanical stress within the overall interconnect circuit and/or simplifying the fabrication process of the interconnect circuit.

Conductive layer 140 may be formed from any conductive material that is sufficiently conductive (e.g., a conductivity being greater than $10^6$ S/m or even greater than $10^7$ S/m) to allow for current flow through the foil with low power loss. As a percentage of the total power output from the battery pack, the resistive power loss incurred within conductive layer tends to increase in proportion to the square of the number of columns (as shown FIG. 1A) of battery cells in each subgroup. To minimize this power loss while allowing for a sufficiently large number of cell columns (as may be determined by other design constraints of the battery pack), in some embodiments conductive layer 140 includes copper and has a thickness of between approximately 35 and 350 microns. Alternatively, to reduce cost and weight relative to copper (e.g., for an equivalent conductance), conductive layer 140 may include aluminum or aluminum alloy with a thickness ranging from 50 to 2000 microns. The use of aluminum instead of copper may also help with lowering the minimum achievable fuse current rating due to the higher resistivity and lower melting temperature of aluminum relative to copper.

In some embodiments, conductive layer 140 may be a relatively thick layer in order to minimize resistive power loss. For example, for cylindrical cells which may have a maximum short duration current of 20 A, a cell column-to-column spacing of about 30 millimeters, and in which it is desirable to connect 6 columns of cells in parallel by a single aluminum portion of conductive layer, the thickness of this layer maybe at least 250 microns to prevent the maximum power loss in the layer from exceeding 1% of the total array power. When copper is used for conductive layer 140 in otherwise the same example, the thickness may be about 160 microns. Similarly, for prismatic battery cells which may have a maximum short duration current of 300 A, a cell column-to-column spacing of 8 millimeters, and with three prismatic cells connected in parallel using a single aluminum portion of conductive layer 140, the thickness of conductive layer may be about 250 microns to prevent the maximum power loss in the bus from exceeding 1% of the total array power.

In some embodiments, multiple layers of conductive foil may be used to provide the desired conductance between the terminals of battery cells. A single island of a thicker foil may be substantially less flexible than multiple layers of thinner foils with the same overall cross-sectional area.

In some embodiments, conductive layer 140 may include a surface sublayer or coating for providing a low electrical contact resistance and/or improving corrosion resistance. The surface sublayer may assist with forming electrical interconnections using techniques/materials including, but not limited to, soldering, laser welding, resistance welding, ultrasonic welding, bonding with conductive adhesive, or mechanical pressure. Surface sublayers that may provide a suitable surface for these connection methods include, but are not limited to, tin, lead, zinc, nickel, silver, palladium, platinum, gold, indium, tungsten, molybdenum, chrome, copper, alloys thereof, organic solderability preservative (OSP), or other electrically conductive materials. Furthermore, the surface sublayer may be sputtered, plated, cold welded, or applied via other means. In some embodiments, the thickness of the surface sublayer may range from 0.05 microns to 10 microns or, more specifically, from 0.1 microns to 2.5 microns. Furthermore, in some embodiments the addition of a coating of organic solderability preservative (OSP) on top of the surface sublayer may help prevent the surface sublayer itself from oxidizing over time.

The surface sublayer may be used when a base sublayer of conductive layer 140 includes aluminum or its alloys. Without protection, exposed surfaces of aluminum tend to form a native oxide, which is insulating. The oxide readily forms in the presence of oxygen or moisture. To provide a long-term stable surface in this case, the surface sublayer may be resistant to the in-diffusion of oxygen and/or moisture. For example, zinc, silver, tin, copper, nickel, chrome, or gold plating may be used as surface layers on an aluminum containing base layer.

In some embodiments, conductive layer 140 is solderable. When conductive layer 140 includes aluminum, the aluminum may be positioned as the base sublayer, while the surface sublayer may be made from a material having a melting temperature that is above the melting temperature of the solder. Otherwise, if the surface sublayer melts during circuit bonding, oxygen may penetrate through the surface sublayer and oxidize aluminum within the base sublayer. This in turn may reduce the conductivity at the interface of the two sublayers and potentially cause a loss of mechanical adhesion. Hence for many solders which are applied at temperatures ranging from 150-300 C, a surface sublayer may be formed from zinc, silver, palladium, platinum, copper, nickel, chrome, tungsten, molybdenum, or gold. Additional features of various sublayers of conductive layer 140 are further described below with reference to FIG. 10A-10C.

Figure 1E:
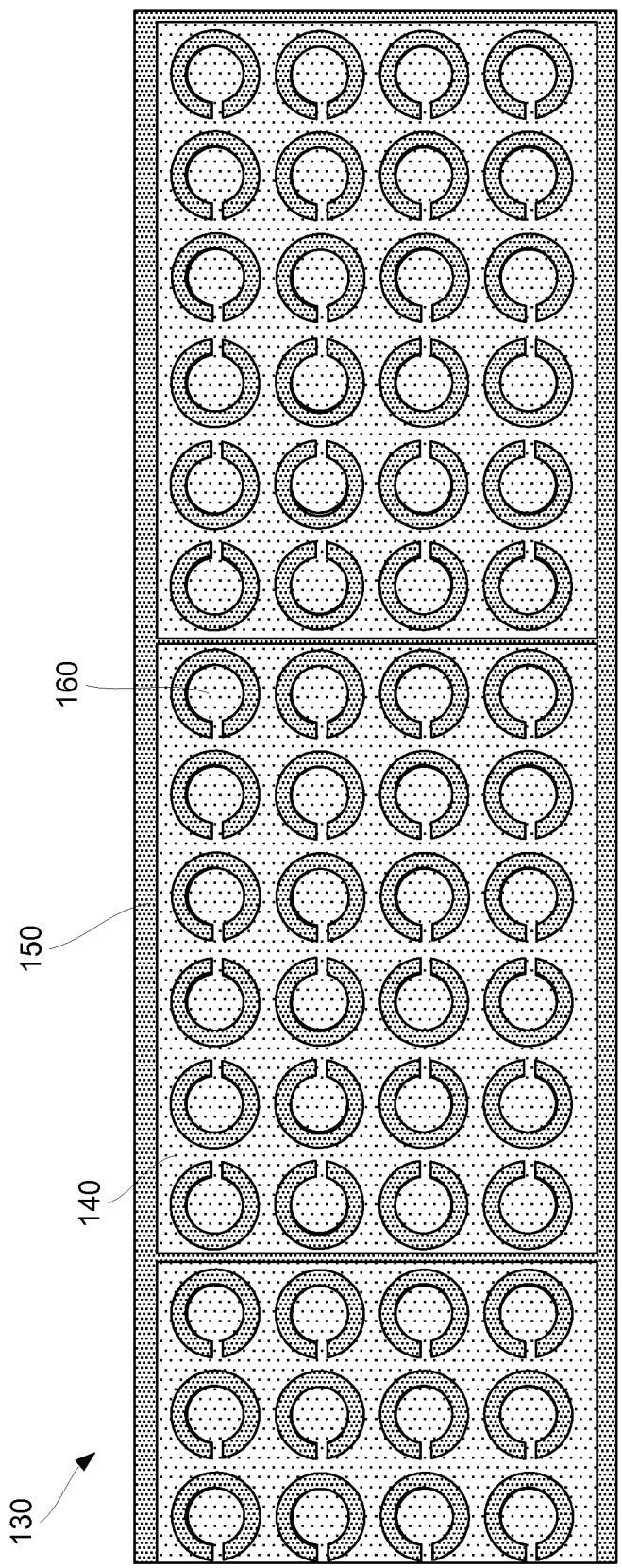
FIG. 1E is a plan view schematic diagram illustrating an example of an interconnect circuit, in accordance with some embodiments.

FIG. 1E is a schematic illustration of interconnect circuit 130 showing both conductive layer 140 and insulating layer 150 disposed underneath conductive layer 140 in this view. Portions of insulating layer 150 extend outside of the boundary of conductive layer (e.g., in between the islands). Furthermore, portions of insulating layer 150 are visible through the openings in conductive layer 140 that partially surround contact pads 160.

Figure 1F:
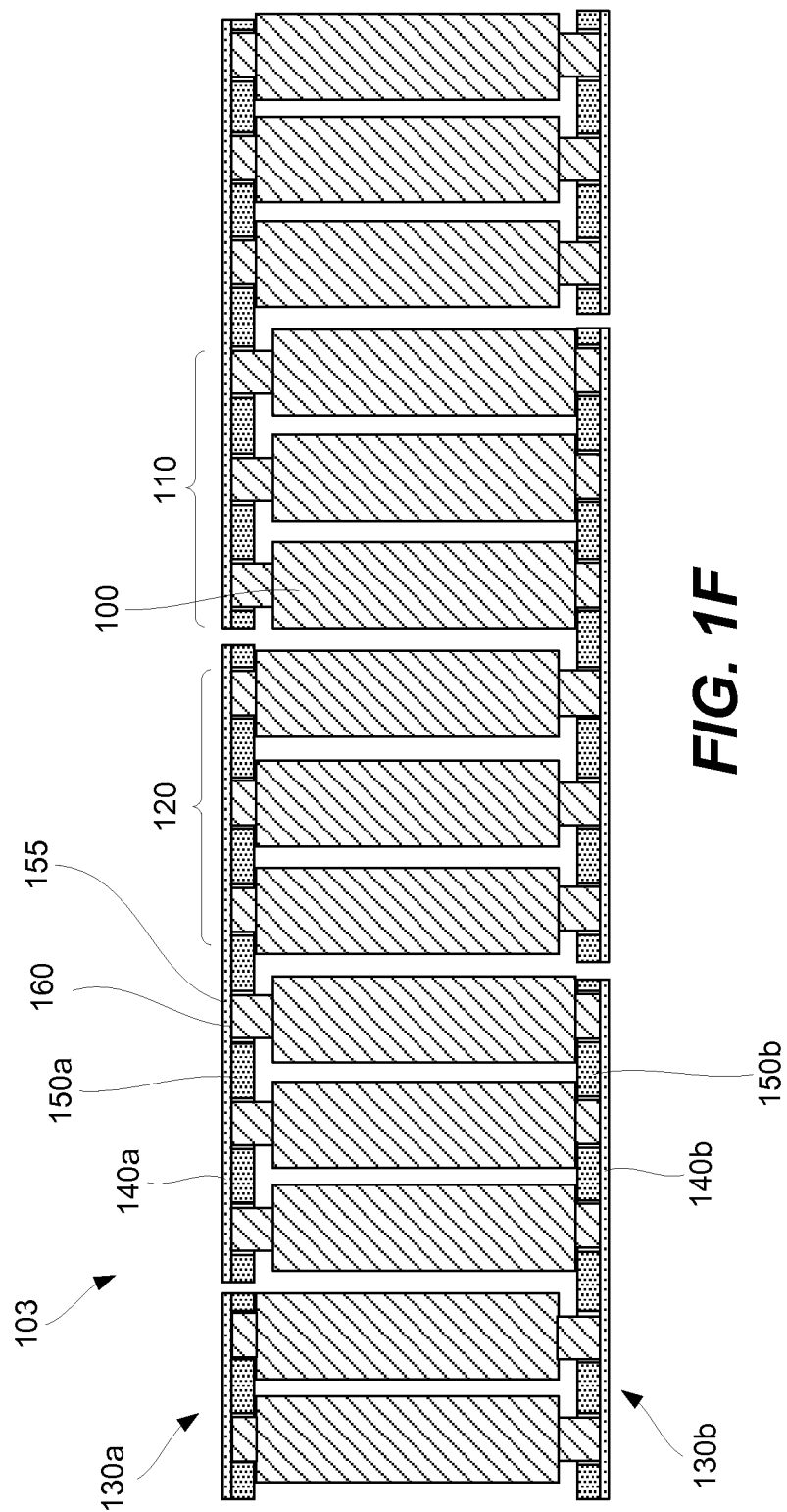
FIG. 1F is a side view schematic diagram of a battery pack including battery cells interconnected with two interconnect circuits, in accordance with some embodiments.

FIG. 1F is a side schematic view of battery pack assembly 103 including two interconnect circuits 130a and 130b, in accordance with some embodiments. Battery cells 100 are interconnected in parallel by interconnect circuit 130a within each one of subgroups 110 and 120. Furthermore, subgroups 110 and 120 are interconnected in series by interconnect circuit 130b. Interconnect circuits 130a and 130b are disposed on different sides of cells 100 and connected to different terminals of cells 100. Interconnect circuit 130a may be laterally shifted, or may have an adjusted pattern, relative to interconnect circuit 130b to allow for electrical connections within and among subgroups 110 and 120. As such, a battery pack formed by a single layer of battery cells having different polarities on opposite sides may utilize two interconnect circuits, e.g., one on each side of that cell layer. In some embodiments, battery cells may have both terminals on the same side (e.g., on the top cover). In this case, the same interconnect circuit may be used for interconnecting this layer of battery cells. As shown in FIG. 1F, insulating layer 150a is disposed between cells 100 and conductive layer 140a in interconnect circuit 130a. In a similar manner, insulating layer 150b is disposed between cells 100 and conductive layer 140b in interconnect circuit 130b. While insulating layers 150a and 150b allow forming electrical connections between cells 100 and conductive layers 140a and 140b through openings in insulating layers 150a and 150b, respectively, insulating layers 150a and 150b may protect conductive layers 140a and 140b, respectively, from contacting other parts of cells, which may be at different potentials.

Figure 1G:
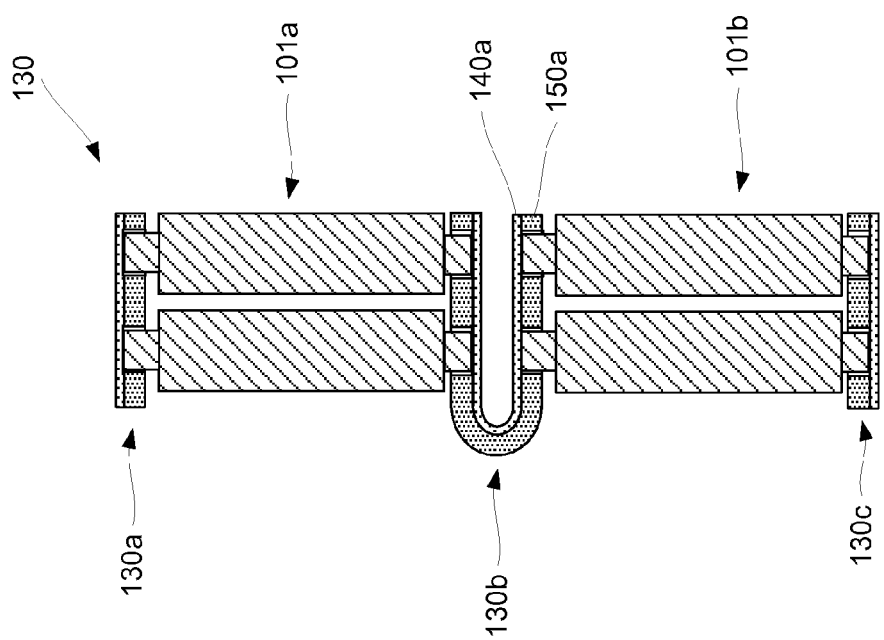
FIG. 1G is a side view schematic diagram of another battery pack including two sets of battery cells interconnected using three interconnect circuits with one interconnect circuit connected to both sets of battery cells, in accordance with some embodiments.

FIG. 1G is a schematic representation of another example of battery pack assembly 103 including two groups 101a and 101b of interconnected battery cells using interconnect circuit 130b. It should be noted that interconnect circuit 130b not only interconnects two groups 101a and 101b but also interconnects cells within each group. Specifically, the battery cells in group 101a are interconnected using interconnect circuit 130b and interconnect circuit 130a, while the battery cells in group 101b are interconnected using interconnect circuit 130b and interconnect circuit 130c.

Examples of Contact Pad Areas of Interconnecting Circuits

Figure 2E:
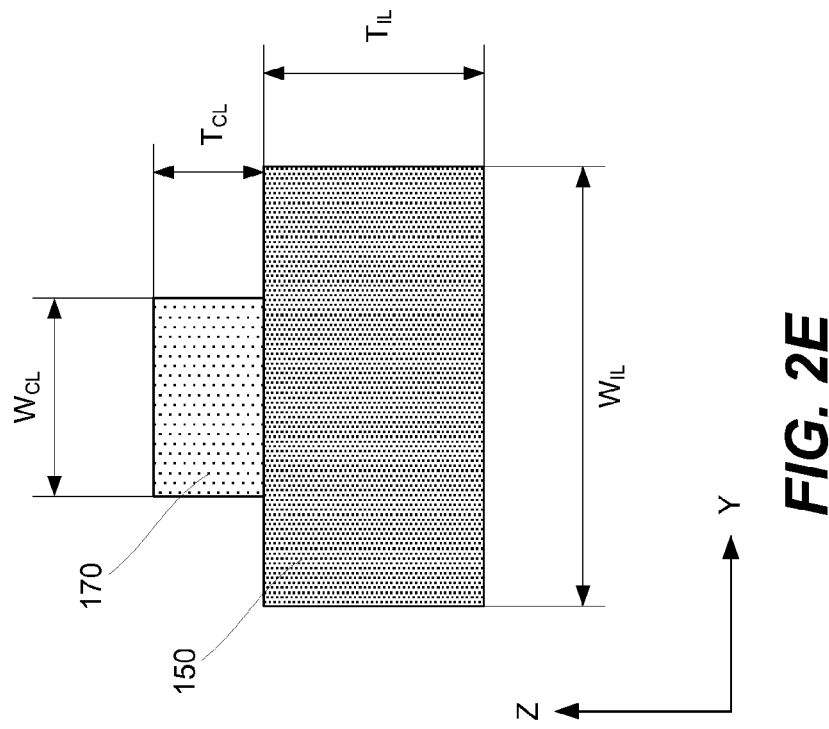
FIG. 2E is a cross-sectional view schematic diagram of a fusible link supported by an insulating layer, in accordance with some embodiments.

Specific features of conductive and insulating layers near contact pads will now be described with reference to FIGS. 2A-2H. FIG. 2A illustrates a portion of insulating layer 150 having insulating layer opening 155 and slot 220. As described above, insulating layer opening 155 is used to access the contact pad aligned with this opening during fabrication of the interconnecting circuit. Slot 220 is an optional feature and, as such, is shown with a dashed line. Slot 220 may be used to improve flexibility of a portion of insulating layer 150 around opening 155. In some embodiments, other features are used to improve this flexibility as further described below with reference to FIG. 2D.

FIG. 2B illustrates a portion of conductive layer 140 having contact pad 160, in accordance with some embodiments. In these embodiments, contact pad 160 is partially surrounded by conductive layer channel 210 that defines the boundaries of contact pad 160. Conductive layer channel 210 has a shape of a partially open ring structure. The ends of conductive layer channel 210 are separated by fusible link 170 which connects contact pad 160 with the remaining portion of conductive layer 140. Conductive layer channel 210 and fusible link 170 are optional features and, in some embodiments, contact pad 160 is not specifically defined on conductive layer as, for example, shown in FIGS. 5A-5B and further described below.

FIG. 2C illustrates a portion of interconnect circuit 130 having conductive layer 140 and insulating layer 150, in accordance with some embodiments. In this schematic plan view, conductive layer 140 is shown above insulating layer 150. A part of insulating layer 150 is visible through conductive layer channel 210. It should be noted that when slot 220 is used in insulating layer 150, this slot 220 may be disposed within the boundaries of conductive layer channel 210 as shown in FIG. 2C. This view also illustrates contact pad 160 being supported by insulating layer 150. In fact, a portion of insulating layer 150 protrudes beyond the boundaries of contact pad 160, up to slot 220 in this example. Furthermore, a portion of insulating layer 150 extends under contact pad and up to the insulating layer opening (represented by insulating layer boundary 159 shown with a dashed line in FIG. 2C since the insulating layer opening is not visible in this view).

The degree of overlap between the insulating layer opening and contact pad 160 may be such that the sufficient mechanical support is provided to the contact pad while maintaining a sufficiently large region of exposed conductive layer 140 at contact pad 160 to form electrical contacts with battery cells 100. For example, for contact pad 160 that is 10-20 millimeters in diameter, the insulating layer boundary 159 may be located approximately 1-5 millimeters from the edge of contact pad 160.

In some embodiments, the thickness of insulating layer 150 is such that contact pad 160 can be pressed and protrude into the insulating layer opening and directly contact the battery cell terminals. In other words, a portion of contact pad 160 takes a curved (non-planar) shape that allows it to protrude into the openings. For example, insulating layer 150 may be 10-50 microns thick, while contact pad 160 may be about 5-20 millimeters in diameter. With dimensions in these respective orders of magnitude, it is possible for conductive layer 140 to be protruded to the plane of the battery cell terminals without tearing conductive layer 140. It should be noted that in these embodiments, the edges of contact pad 160 may remain attached to a portion of insulating layer 150 surrounding the insulating layer opening. Insulating layer 150 may also be deformed when contact pad 160 protrudes into the insulating layer opening.

In some embodiments, the insulating layer opening is sufficiently large that it does not to come into contact with the battery cell terminal. Instead, the battery cell terminal protrudes into the opening and made contact with contact pad 160. Contact pad 160 may remain substantially planar in these embodiments. For example, the size of insulating layer opening 155 may be 101-120 percent of the diameter of the terminals of the battery cells.

The shape and patterning of contact pad 160, fusible link 170, and insulating layer 150 may be modified to reduce the mechanical stress on and, in some cases, to improve the vibration resistance of fusible link 170 and electrical contacts to the battery cell terminal. For example, as shown in FIG. 2C, a portion of insulating layer 150 may be located near fusible link 170 to provide mechanical support when fusible link 170 has a small cross-sectional area (e.g., when a low fuse current rating is desired). This may help ensure that fusible link 170 remains intact during fabrication, installation, and operation. A ratio of the width of conductive layer channel 210 (the distance between the ends of slot 220—$W_{CL}$ as shown in FIG. 2C) to the width of fusible link 170 may be between about 1.5 and 100 or, more specifically, between 1.5 and 5. In other embodiments, no portion of insulating layer 150 is attached to fusible link 170 and fusible link 170 remains freestanding.

As noted above, slot 220 may be used to add flexibility to the portion of insulating layer 150 around contact pad 160. In other words, slot 220 may provide a degree of freedom of vertical and/or lateral motion of contact pad 160 relative to surrounding portions of interconnect circuit 130. This additional flexibility may help facilitate the electrical connection of contact pad 160 to the battery cell terminals and, in some cases, to reduce the level of stress on the connection.

Figure 2D:
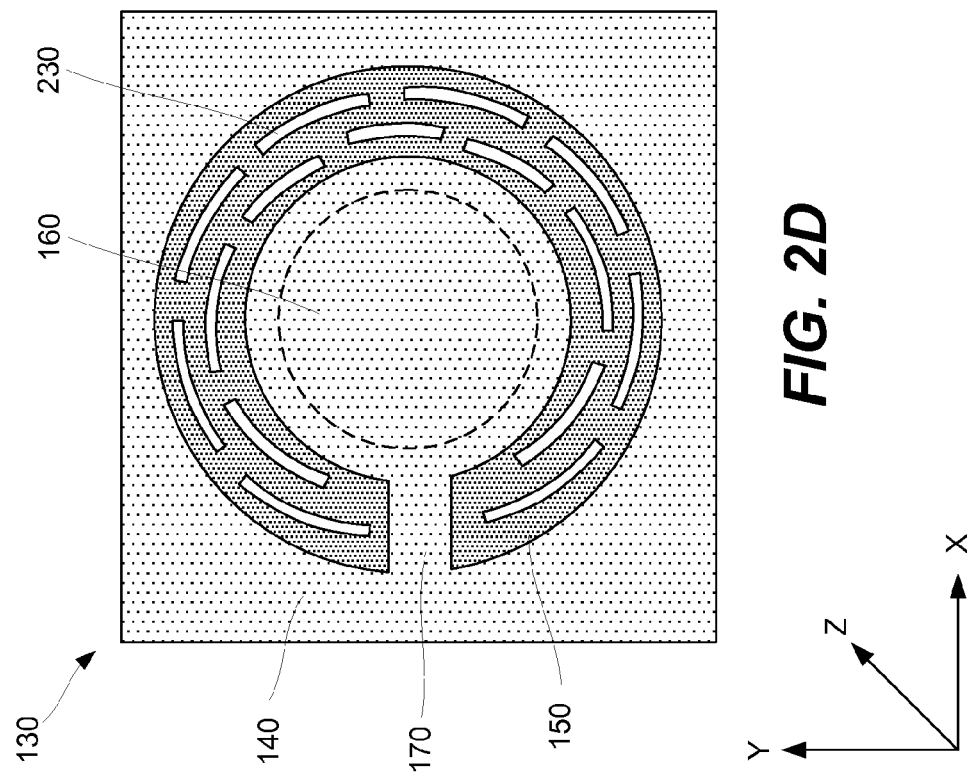

Slot 220 is an optional feature. In some embodiments, flexibility may instead be provided by a set of slits 230 that are patterned into insulating layer 150 as shown in FIG. 2D. Slits 230 may allow a sufficient degree of vertical and/or lateral motion of contact pad 160 while still maintaining proper alignment of contact pad 160 to the battery cell during fabrication of the battery pack (e.g., before the electrical connections are formed). In some embodiments, the area occupied by slits 230 may be between about 1-40% of the area of insulating layer 150 that occupies conductive layer channel 210, or more specifically, between about 5-10% of the area of insulating layer 150 that occupies conductive layer channel 210.

In some embodiments, the length (the dimension along the X axis) of fusible link 170 may be increased to provide additional freedom of relative motion between contact pad 160 and the surrounding portions of interconnect circuit 130, as shown in FIG. 2F. This provides more flexibility to contact pad 160.

FIG. 2F is a schematic illustration of interconnect circuit in a partially fabricated state with slot tab 240 separating two portions of slot 220. Slot tab 220 may be also referred to as a tearable tab as it is later removed during further processing such as using a punch. Slot tab 220 provides support to a portion of insulating layer 150, for example, while aligning contact pad 160 with respect to the battery cell terminal and even forming the electrical connection between contact pad 160 and terminal. Slot tab 220 may be removed thereafter. In some embodiments, slot tab 240 may be removed while pressing contact pad 160 toward the terminal. In fact, forcing contact pad 160 toward the terminal may tear off or through slot tab 240. Removal of slot tab 240 provides additional freedom of moving contact pad 160 as, for example, shown in FIG. 2H.

Examples of Interconnect Circuits with Voltage Monitoring Traces

Figure 3A:
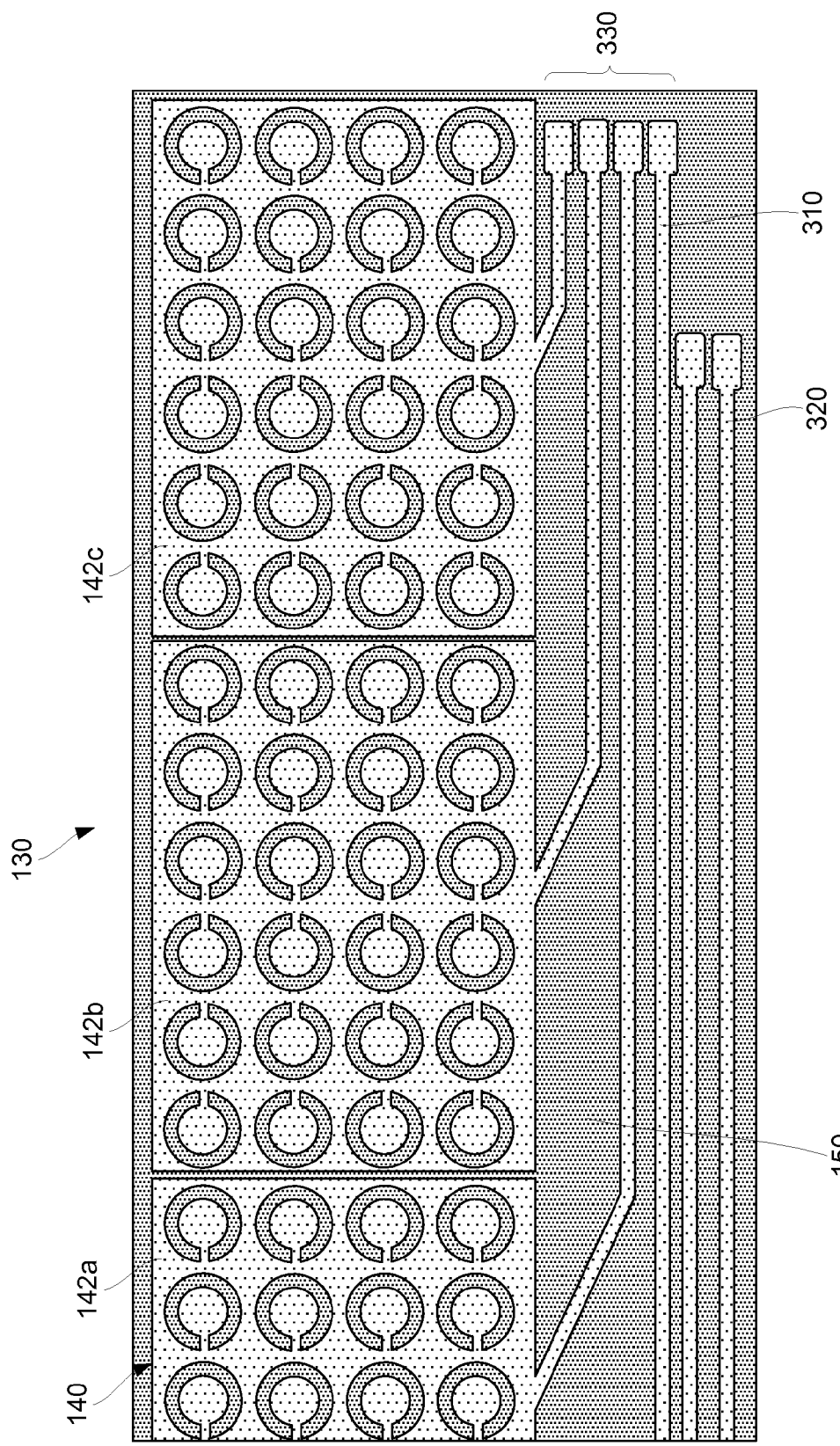
FIGS. 3A-3B are plan view schematic diagrams of interconnect circuits comprising electrical monitoring and control traces, in accordance with some embodiments.

FIG. 3A illustrates an example of interconnect circuit 130 including voltage monitoring traces 310, in accordance with some embodiments. Voltage monitoring traces 310 are also parts of conductive layer 140. Also shown are ancillary traces 320, which may be connected to other components of the battery pack, such as other islands of conductive layer, temperature monitoring devices, safety devices, and the like.

Each of voltage monitoring traces 310 is connected to a different one of islands 142a, 142b, and 142c of conductive layer 140. More specifically, each of voltage monitoring traces 310 and a corresponding one of islands 142a, 142b, and 142c form a monolithic structure. All voltage monitoring traces 310 and all islands 142a, 142b, and 142c may be formed from the same initial layer. Voltage monitoring traces 310 may be used to probe the voltage of islands 142a, 142b, and 142c during, for example, charging and discharging of the battery pack. Alternatively, voltage monitoring traces 310 may be used for any other electrical purpose involving an independent connection to individual islands 142a, 142b, and 142c.

Voltage monitoring traces 310 may be terminated in contact points 330 for connection to wire harnessing, fuses, surface mount components, integrated circuits, or other devices. Similarly, ancillary traces 320 may be used to connect surface mount components or other devices to interconnect circuit 130 without directly wiring the components to the power transfer circuitry. These connections may be useful for devices such as thermistors or other sensors. Voltage monitoring traces 310 and/or ancillary traces 320 may include a narrow region along the trace that is capable of acting as a built-in fuse.

In some embodiments, voltage monitoring traces 310 may be made sufficiently conductive (e.g., by modifying the trace length, width, and/or thickness) to provide a degree of power transmitting capability. Voltage monitoring traces 310 may be patterned from the same conductive sheet as islands 142a-c and may form monolithic structures with corresponding islands 142a-c. Voltage monitoring traces 310 may be used for precise control of the charge and discharge states of the battery cell sub-groups. For example, in cases of imbalanced charging or undercharging between different cell groups in the same power pack, a power IC or floating capacitors may be used to selectively route charging current through voltage monitoring traces 310 to individual sub-groups of battery cells. Electrical disconnects may optionally be provided at the battery module level to ensure the power IC is not exposed to excessively high voltage during the selective charging process. Similarly, in cases of overcharging, a power IC or shunt resistor may be used to selectively bleed charge from individual battery sub-groups via voltage monitoring traces 310.

In some embodiments, the flexible nature of interconnect circuit 130 allows folding one or more portions of the circuitry. For example, voltage monitoring traces 310 and ancillary traces 320 as shown in FIG. 3A may be folded to the side of the battery cell array within the battery pack. This folding may help to maintain or even to increase the overall energy density of the pack. Insulating layer 150 may be used to provide electrical isolation between the folded portion of interconnect circuit 130 and the packaging of the battery cells.

In some embodiments, interconnect circuit 130 may be attached or bonded to a housing or heat sink on one side of the circuit in addition to being attached to battery cells on the opposite side. For example, interconnect circuit 130 may be attached to a 0.5-5-mm-thick aluminum island to help reduce the temperature rise during operation due to joule heating in interconnect circuit 130 and/or battery cells 100. In addition, the housing and/or heat sink may be used to provide mechanical support to interconnect circuit 130. The housing and/or heat sink may be patterned with an array of holes to allow access to the battery cells (e.g., for welding or to provide ventilation paths). To provide electrical isolation between interconnect circuit 130 and the heat sink and/or housing, as described elsewhere a second insulating layer may be disposed on the opposite side of conductive layer 140 from insulating layer 150. The second insulating layer may include an adhesive sublayer to facilitate the attachment of interconnect circuit 130 to the heat sink and/or housing.

Figure 3B:
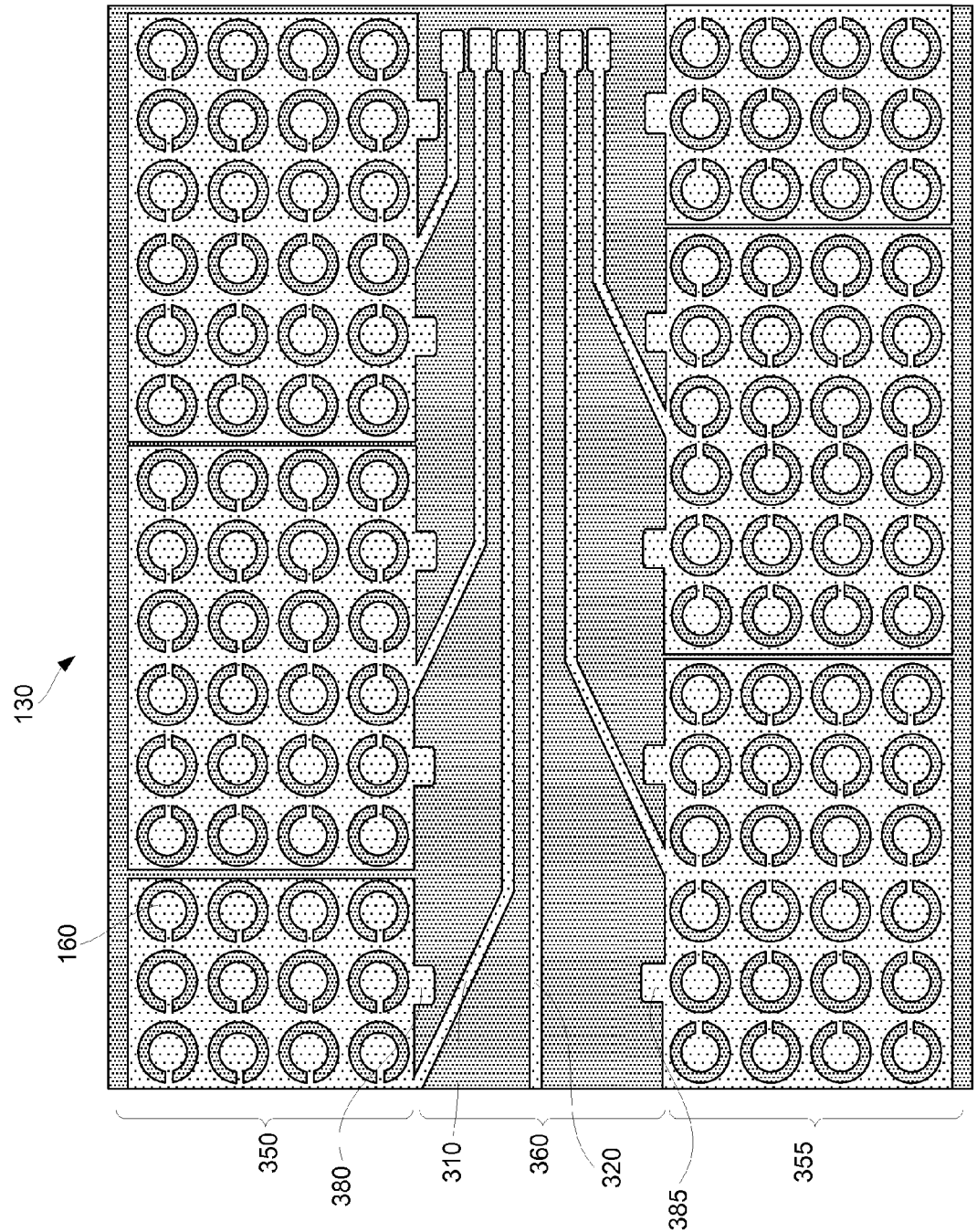

FIG. 3B shows another example of interconnect circuit 130 that may be folded, wrapped, and/or bent, in accordance with some embodiments. This interconnect circuit 130 may be used, for example, to form electrical connection to both the positive and negative terminals of the same battery cells, when these terminals are disposed on different ends of the cells. Interconnect circuit 130 may include two sets 350 and 355 separated by middle region 360. Middle region 360 may have a width (e.g., the distance between sets 350 and 355) corresponding approximately to the length of the battery cells (e.g., 65 mm for 18650 battery cells). The patterns of contact pads 160 in each of two sets 350 and 355 may be the same. However, two sets 350 and 355 may be offset from each other to allow for a completed series-parallel connection once interconnect circuit 130 has been connected to the battery cells.

Middle region 360 of interconnect circuit 340 may be used to carry voltage monitoring traces 310 and, in some embodiments, ancillary traces 320. In some embodiments, the conductance of voltage monitoring traces 310 may be sufficiently high so as to provide a degree of power transfer capability along with monitoring capability. In addition, a mechanical separator may be used to provide space between middle region 360 and battery cells once interconnect circuit 130 has been folded into place.

Probe points 380 and 385 may be used for connecting surface mount components, such as bypass diodes or power transistors with optional extension leads, or other devices directly across the terminals of individual sub-group of battery cells. For example, surface mount components may be connected vertically across middle region 360 with one terminal on probe points 380 and the other terminal on corresponding probe points 385. In some embodiments, surface mount bypass diodes may be connected across probe points 380 and 385 to provide a bypass path for charging current if the voltage across a sub-group of battery cells exceeds a certain threshold level during battery charging.

Interconnect circuit 130 shown in FIG. 3B includes all circuitry components used for interconnecting battery cells having positive and negative terminals on opposing sides. Integrating all components into the same interconnect circuit may simplify the battery pack assembly process. More specifically, fewer assembly operations may be needed when interconnect circuit 130 shown in FIG. 3B is used in a battery pack than many conventional interconnects and/or wire harnesses. Furthermore, the number of discrete electrical connections used to interconnect cells in the same battery pack is reduced, thereby potentially improving yield and reliability.

Examples of Battery Packs Including Interconnect Circuits

Figure 4B:
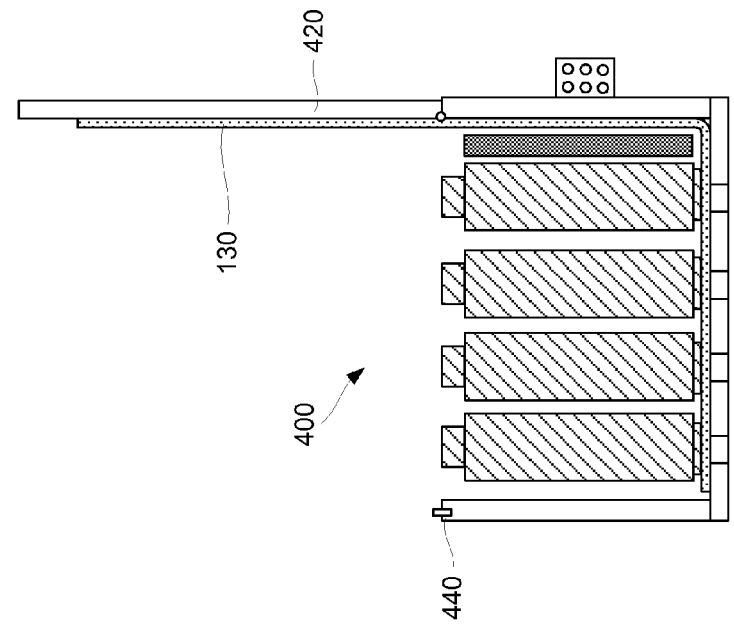
FIGS. 4A-4C are side view schematic diagrams of a battery pack having an interconnect circuit, in accordance with some embodiments.
Figure 4A:
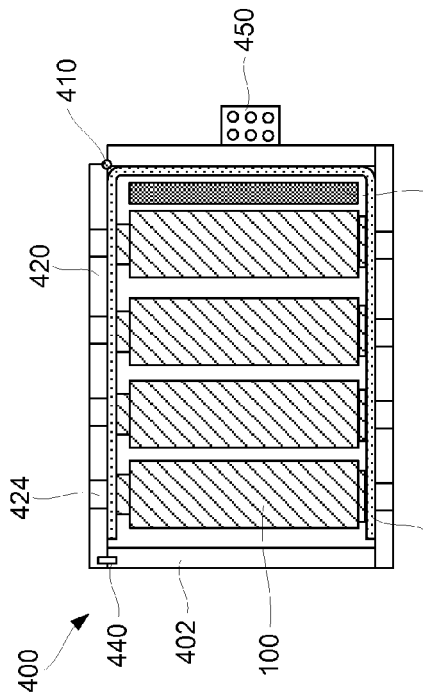
Figure 4C:
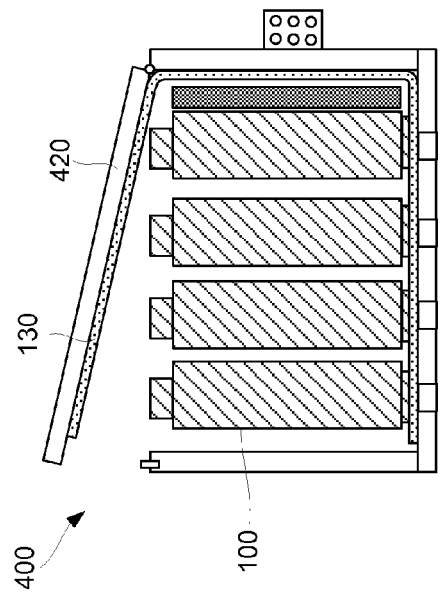

FIG. 4A is a side view schematic diagram of battery pack 400 including housing 402, interconnect circuit 130, and battery cells 100, in accordance with some embodiments. Interconnect circuit 130 may optionally be similar to the one shown in 3B and described above. In some embodiments, interconnect circuit 130 may be pre-laminated to housing 402 using an adhesive, which may be a part of interconnect circuit 130 or housing 402. For example, the adhesive may be a sublayer of the second insulating layer. For purposes of this disclosure, a first insulating layer may be disposed between a conductive layer and battery cells, while a second insulating layer may be positioned such that the conductive layer is disposed between the first and second insulating layers. In some embodiments, adhesive may be disposed on the interconnect circuit surface, the housing surface, or through a separate adhesive coating/application step. Housing 402 may have one or more hinges 410 that allows cover 420 to move with respect to the rest of housing and, more specifically, with respect to battery cells 100. In some embodiments, cover 420 is foldable without a need for a hinge. In general, cover 420 allows placement of battery cells 100 into housing prior to completing the electrical connection of cells 100 to interconnect circuit 130. Cover 420 may also simplify the attachment of interconnect circuit 130 to housing 402 by allowing straightforward access to the inside surfaces of housing 402 during lamination of interconnect circuit 130 to housing 402.

Housing 402 may also accommodate a cooling device to, for example, control the temperature of battery cells 100 during their operation in battery pack 400. Alternatively, housing 402 may itself be or may include a heat sink that is capable of withdrawing heat from interconnect circuit 130 and/or battery cells 100 during battery pack operation. For example, the walls and lid of housing 402 may be built from 0.5-5 mm thick aluminum (or another thermally conductive material) to provide a heat sink for interconnect circuit 130 and/or battery cells 100. As described above, in some embodiments, a second insulating layer may be incorporated into interconnect circuit 130 to provide electrical isolation between interconnect circuit 130 and housing 402. Housing 402 may also accommodate mechanical racking to, for example, hold battery cells 100 in place during their operation in battery pack 400. These devices may be placed into housing 402 during various stages of assembly of battery pack 400. In some embodiments, battery pack 400 may include electromagnetic shield 430 disposed inside housing 402. Electromagnetic shield 430 may be used to prevent electromagnetic noise from affecting the monitoring and control circuitry of interconnect circuit 130. In some embodiments, electromagnetic shield 430 is a part of interconnect circuit 130. For example, electromagnetic shield 430 may be formed by laminating a second conductive layer to the opposite side of the insulating layer such that the insulating layer is disposed between the second conductive layer and the original conductive layer, which is used for interconnecting battery cells 100.

Prior to interconnecting battery cells 100 using interconnect circuit 130, a disconnected version of battery pack 400 may be assembled. For example, a sheet of insulating material may be placed between interconnect circuit 130 and battery cells 100. This feature may help facilitate the storage and/or transport of battery pack 400 with battery cells 100 being disconnected, thus ensuring that battery cells 100 do not lose energy or become unsafe during storage and/or transport. In addition, housing latch 440 may have a built-in safety feature which allows the latch to be blown open in response to an external signal, thereby resulting in an instant disconnect of all battery cells 100 in the pack/module.

In some embodiments, housing 402 may include an array of openings 424 to access to interconnect circuit 130 and, for example, form electrical connections between interconnect circuit 130 and battery cells 100. These electrical connections may be made using, for example, laser welders, resistance welders, ultrasonic welders, and soldering equipment. These connections may be formed, for example, after cover 420 is lowered to the rest of housing 402. In addition, openings 424 may be used to pass electrical current or signals outside battery pack 400, such as through electrical connector 450. Electrical connector 450 may be then connected to a wire harness.

Examples of Interconnect Circuits for Interconnecting Prismatic Battery Cells

In some embodiments, interconnect circuits may be used as an electrical interconnect for cells having both terminals on the same side. Some examples of such cells include rectangular cells, prismatic cells, pouch cells, and other like cells. FIG. 5A shows a plan view schematic diagram of group 101 of cells 100 arranged into a linear array, in accordance with some embodiments. Cells 100 have both positive terminals 510 and negative terminals 520 on the top surfaces of battery cells 100. Note that while battery cells 100 are depicted as only having two terminals in FIG. 5A, in practice interconnect circuits may be used to interconnect and/or monitor battery cells 100 with any number of terminals, such as terminals and/or electrodes for measuring reference potentials within cells 100 (e.g., terminals connected to lithium reference electrodes in lithium ion cells). Terminals 510 and 520 may optionally include contact pads, rigid bumps, or flexible foil tabs. In the example shown in FIG. 5A, battery cells 100 have been oriented with a 180 degree rotation of the terminals on every fourth cell. An arrangement of battery cells 100 may have gaps in between pairs of adjacent cells to, for example, accommodate cooling fins in between the cells and/or thin sheets of foam to accommodate expansion (and, for example, some maintain a contact pressure on the cells). In some embodiments, the cooling fins may be thermally coupled to the conductive layer of an interconnect circuit.

Interconnect circuit 130 capable of interconnecting cells 100 is shown schematically in plan view in FIG. 5B. Interconnect circuit 130 includes conductive layer 140 and insulating layer 150, such that insulating layer 150 is positioned between conductive layer 140 and cells 100. Conductive layer 140 includes a set of electrically-isolated islands 142a, 142b, and 142c. Insulating layer 150 is patterned with openings to provide connections between the battery cell terminals and conductive layer 140 or, more specifically, between the battery cell terminals and the set of electrically-isolated islands 142a, 142b, and 142c. As described above, each of islands 142a, 142b, and 142c may include an array of contact pads, which may be parts of a continuous layer or may be partially surrounded by conductive layer openings and connected to the rest of islands 142a, 142b, and 142c by fusible links.

Figure 5C:
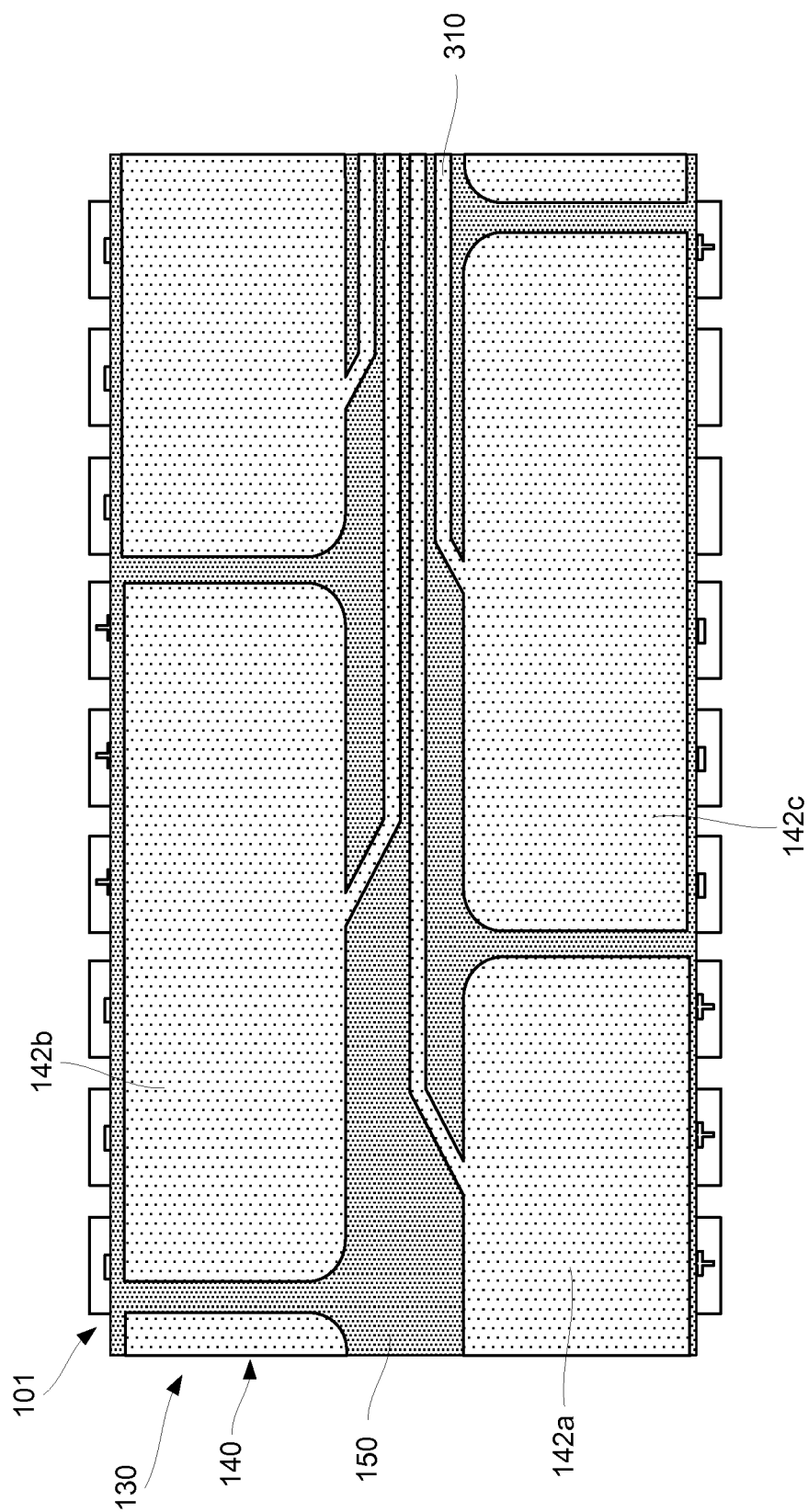
FIG. 5C is a plan view schematic diagram of an interconnect circuit suitable for interconnecting prismatic battery cells, in accordance with some embodiments.

In some embodiments, interconnect circuit 130 includes voltage monitoring or other circuitry, as shown schematically in plan view in FIG. 5C. Voltage monitoring traces 310 may be included within conductive layer 140. Voltage monitoring traces 310 may occupy the center portion of interconnect circuit 130 in between two rows of islands 142a, 142b, and 142c. Islands 142a, 142b, and 142c may be sufficiently thick so as to provide low resistive power loss within conductive foil islands 540. Alternatively, islands 142a, 142b, and 142c 40 (and, consequently, the edges of interconnect circuit 130) may be extended beyond the edges of battery cells 100 to provide sufficient conductance between the terminals of battery cells 100. This may have the effect of increasing the conductance of islands 142a, 142b, and 142c by increasing their width. Interconnect circuit 130 may optionally be folded along the sides of battery cells 100 to minimize the area of the battery pack occupied by interconnect circuit 130 (e.g., for high energy density applications). In some embodiments, insulating layer 150 may be patterned to ensure that interconnect circuit 130 does not short to the packaging of battery cells 100 after interconnect circuit 130 has been folded. Furthermore, the outer surface of the packaging of battery cells 100 may be electrically insulating to prevent an electrical short from taking place.

FIG. 5D depicts another example of interconnect circuit 130 including four rows of islands 142a-142d. Each of islands 142a-142d may optionally be attached at its edges to insulating layer 150. Furthermore, insulating layer 150 may include openings, or windows, that overlap portions of islands 142a-142d. Alternatively, insulating layer 150 may be designed to extend over voltage monitoring traces 310. In this case, the registration between adjacent rows of islands 142a-142d may be maintained through the conductive layer itself, for example, through tabs or other connecting features within the layer of conductive foil. Specifically, metal connecting tabs could be left in place near lines 575 in order to maintain alignment between islands 142a and 142b (and between islands 142c and 142d). In some embodiments, a pair of adjacent islands may be electrically connected to each other. As such, there is no need for removing the connecting tabs. This design would eliminate the need for extending the insulating layer 150 beyond the middle region of the interconnect circuit. Either prior to, during, or after the attachment of interconnect circuit 130 to battery cells, interconnect circuit 130 may be folded along folding lines 575 (identified with dotted lines in FIG. 5D). This folding may be used to form overlapping islands 142a-142d. Islands 142a-142d may then be electrically joined together using various bonding techniques, such as laser welding, ultrasonic welding, soldering, and the like, to achieve the desired conductance. Note that although four rows of islands 142a-142d are shown in FIG. 5D, in other embodiments any number of islands may be folded on top of one another to provide the desired conductance.

Figure 5E:
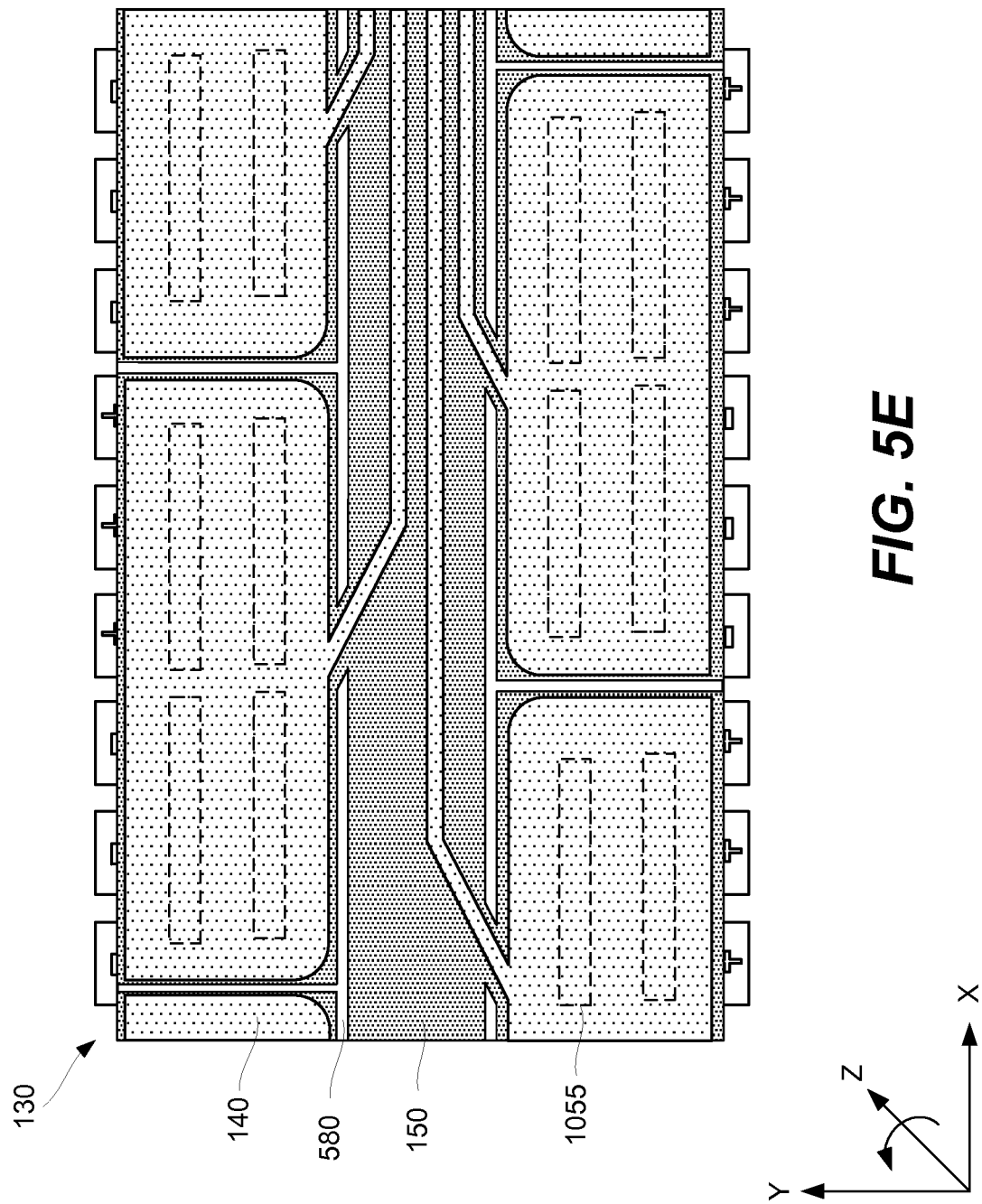
FIG. 5E is a plan view schematic diagram of an interconnect circuit suitable for interconnecting prismatic battery cells, in accordance with some embodiments.

In some embodiments, insulating layer 150 may be patterned with a series of slits 580, as shown schematically in plan view in FIG. 5E. Slits 580 may allow a degree of mechanical de-coupling between the individual islands of conductive layer 140 (as well as the regions of insulating layer 150 in the vicinity of these islands) and the remainder of interconnect circuit 130. Openings in insulating layer 150 are not visible in this view and are represented by dotted lines (insulating layer opening boundaries 1055). As shown schematically in side view in FIGS. 5F and 5G, a potential function of slits 580 is to allow islands of conductive layer 140 to be folded during the formation of electrical connections to terminals 515 of battery cells 100. In some embodiments, this may simplify the implementation of various methods of electrical interconnection, such as ultrasonic welding, laser welding, resistance welding, soldering, attachment with electrically conductive adhesive (ECA), crimping, and the like. Following the formation of electrical interconnects 590, conductive layer 140 and/or terminals 515 may subsequently be folded back to an approximate state of co-planarity with the remainder of interconnect circuit 130. This may have the benefit of reducing the total volume occupied by a battery pack (and, therefore, increasing the energy density of the pack).

Figure 6A:
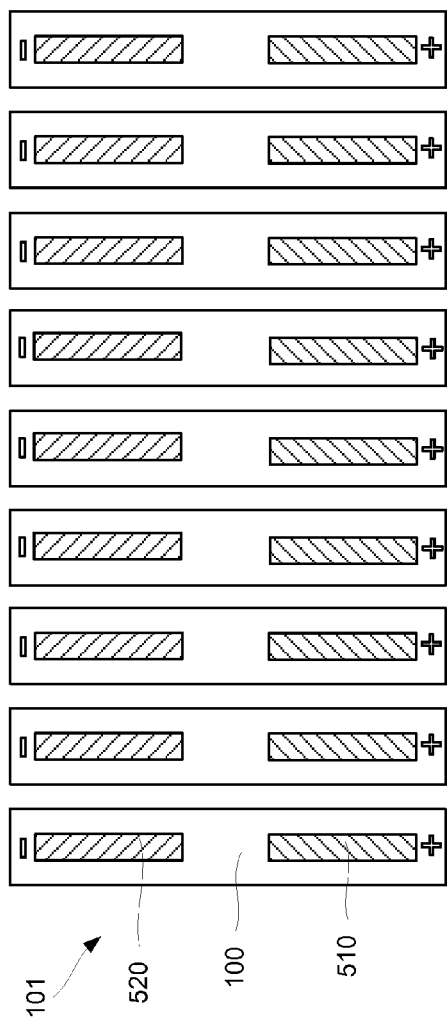
FIG. 6A is a plan view schematic diagram of another array of prismatic battery cells, in accordance with some embodiments.
Figure 6B:
FIG. 6B is a plan view schematic diagram of an interconnect circuit suitable for interconnecting prismatic battery cells, in accordance with some embodiments.

In some embodiments, battery cells may be oriented in the same direction in the group. FIG. 6A shows a plan view schematic diagram of such group 101 of battery cells 100. Positive terminals 510 are located on one side (top of FIG. 6A) and negative terminals 520 are located on the opposite side (bottom of FIG. 6A). Interconnect circuit 130 configured to interconnect such group 101 is shown schematically in plan view in FIG. 6B. Specifically, interconnect circuit 130 comprises a set of electrically-isolated islands 142a and 142b, which are parts of conductive foil. Patterned insulating layer 150 is disposed between conductive layer 140 and battery cells 100.

Figure 6C:
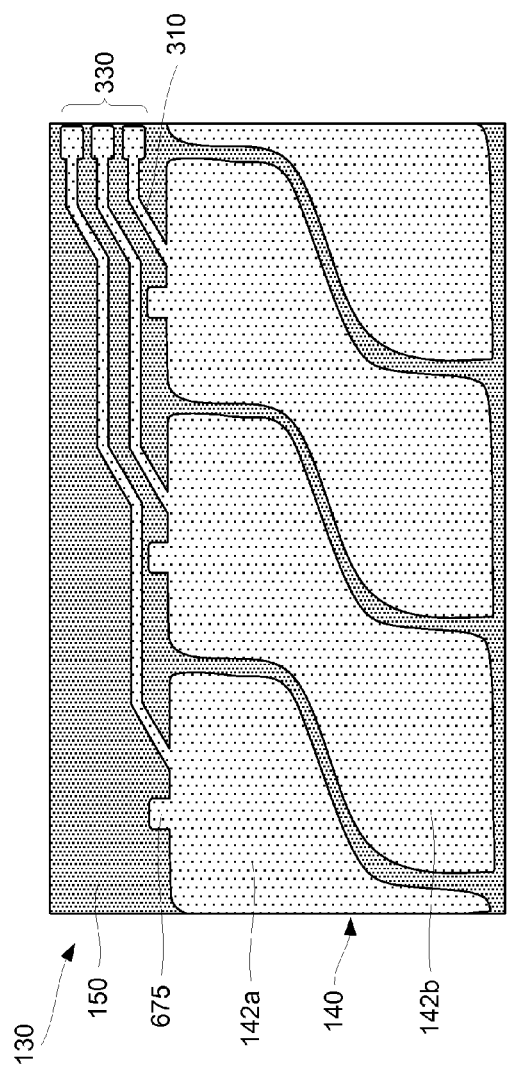
FIG. 6C is a plan view schematic diagram of an interconnect circuit comprising electrical monitoring and control traces, in accordance with some embodiments.

FIG. 6C is a schematic plan view diagram of interconnect circuit 130 having voltage monitoring traces 310 and contact points 330. The region of interconnect circuit 130 that is not disposed directly above the battery cells may optionally be folded along the side of the cells during battery module or pack assembly to preserve space within the module/pack.

Figure 6D:
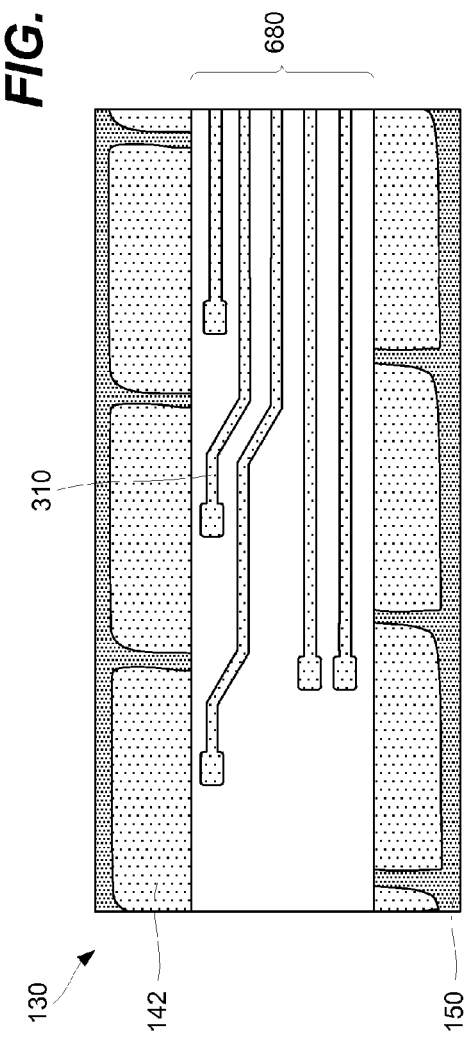
FIG. 6D is a plan view schematic diagram of a two-layer interconnect circuit comprising electrical monitoring and control traces, in accordance with some embodiments.

Alternatively, voltage monitoring traces 310 and possibly other devices may be parts of stacked flexible circuit 680 positioned next interconnect circuit 130, as shown schematically in plan view in FIG. 6D. Voltage monitoring traces 310 may be routed to openings in an insulating layer of stacked flexible circuit 680, through which electrical connections may be made to underlying islands 142 of conductive layer 140. In some embodiments, the thickness of islands 142 in interconnect circuit 130 and the thickness of voltage monitoring traces 310 of stacked flexible circuit 680 may be individually varied to achieve the desired electrical conductance of each layer. Furthermore, voltage monitoring traces 310 may terminate in relatively large contact pads (for example, terminating in pads whose area is a significant fraction of the area of the underlying island of conductive foil), thereby allowing for a relatively large-area electrical contact to be formed between the two circuits. As compared to a small-area contact, this may reduce the contact resistance and provide greater electrical contact redundancy. For example, the area of the contact pads on the end of voltage monitoring traces 310 may be at least 10, 20, 50, or 80 percent of the area of the corresponding islands of conductive layer 140. Stacked flexible circuit 680 may reduce the space taken up by interconnect circuit 130 within the battery pack relative, for example, to an example of the interconnect circuit shown in FIG. 6C. Furthermore, stacked flexible circuit 680 may simplify the routing and attachment of surface mount components and/or other electrical devices to the interconnect circuit assembly.

In some embodiments, battery cells may include terminals made out of thin tabs or foil. Some examples of such cells are prismatic, rectangular, and/or pouch battery cells. One distinctive characteristic of such tabs is that these tabs cab be easily bent. FIGS. 7A-7D depict examples of various configurations of the electrical connections that may be formed between interconnect circuit 130 and such terminal 515 of battery cell 100.

In the side view schematic diagram shown in FIG. 7A, interconnect circuit 130 includes slot 710 that has been patterned into conductive layer 140 and insulating layer 150 of interconnect circuit 130. Terminal 515 of battery cell 100 may extend through slot 710 and folded down onto the surface of conductive layer 140 that faces away from insulating layer 150 and battery cell 100. Terminal 515 and conductive layer 140 form electrical connection 745.

As shown schematically in plan view in FIG. 7B, conductive layer 140 may optionally include contact pad 160 and one or more fusible links 170 that electrically connect contact pad 160 to the rest of conductive layer 140. The number, cross-sectional area, and length of fusible links 170 depend on current ratings and current threshold.

Alternatively, interconnect circuit 130 may be folded to form an electrical connection 745 to both sides of terminal 515 of battery cell 100 as, for example, depicted schematically in side view in FIG. 7C. The layout of interconnect circuit 130 may be designed to incorporate sufficient space for a portion of interconnect circuit 130 to be folded while still maintaining appropriate registration with battery cell 100 and other components of the battery pack. In addition, insulating layer 150 may be patterned with openings to allow terminal 515 of battery cells 100 to be placed into contact with the folded portion of conductive layer 140. Once physical contact has been established, an electrical connection may be formed using techniques and materials described previously. In embodiments in which multiple battery cells are connected in parallel, this connection scheme may reduce the electrical resistance associated with current flow through interconnect circuit 130 in the vicinity of terminal 515 of battery cell 100, since conductive layer 150 remains continuous.

In some embodiments, terminal 515 of battery cell 100 may be folded and connected to the bottom surface of conductive layer 140 as shown in FIG. 7D. This bottom surface faces battery cell 100 and insulating layer 150. Conductive layer 140 may be continuous in the area of electrical connection as shown in FIG. 7D. Terminal 515 extends through an opening in insulating layer 150. Techniques including, but not limited to, soldering, laser welding, resistance welding, ultrasonic welding, or bonding with electrically conductive adhesive may be used to form electrical connection 745.

Examples of Battery Packs with Flat Form Factor for Prismatic Cells

Figure 8D:
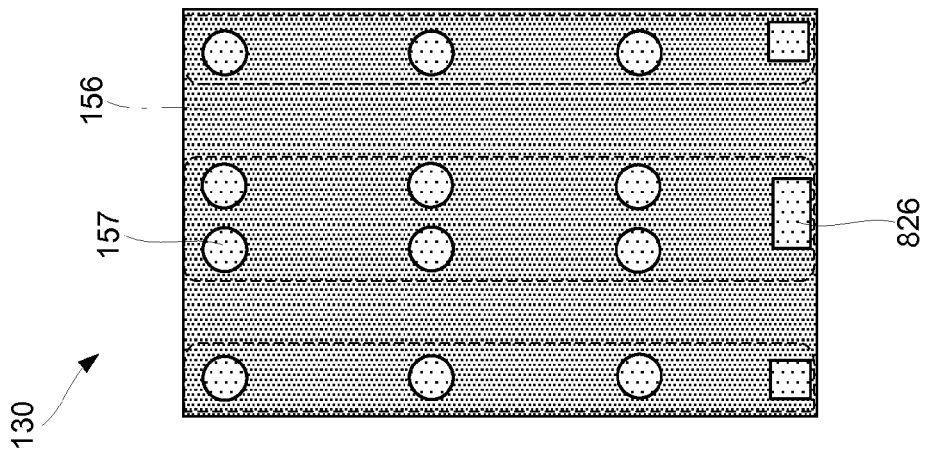
FIG. 8D is a plan view schematic diagram illustrating another example of an interconnect circuit, in accordance with some embodiments.

Interconnect circuits may also be used to interconnect prismatic battery cells in a planar or tiled array as shown in FIGS. 8A-8H. For the purposes of this disclosure, a tiled array refers to an array in which the largest faces of the prismatic cells are approximately coplanar. Specifically, FIG. 8A is a sequential cutaway plan view diagram of group 101 of battery cells 100 arranged into two columns. Each cell 100 has a positive terminal 510 and a negative terminal 520. In later figures, group 101 of battery cells 100 is interconnected using interconnect circuit 130. In order to better understand the features and orientation of the main components of the interconnect circuit a few hypothetical examples are shown. For example, FIG. 8B is a sequential cutaway plan view diagram of insulating layer 150 disposed over the group of battery cells. The terminals of the cells are aligned with and visible through insulating layer openings 155. Insulating layer 150 also include monitoring point openings 824 that need not be aligned with any terminals and, in fact, may be clear from group 101 of cells 100.

Figure 8C:
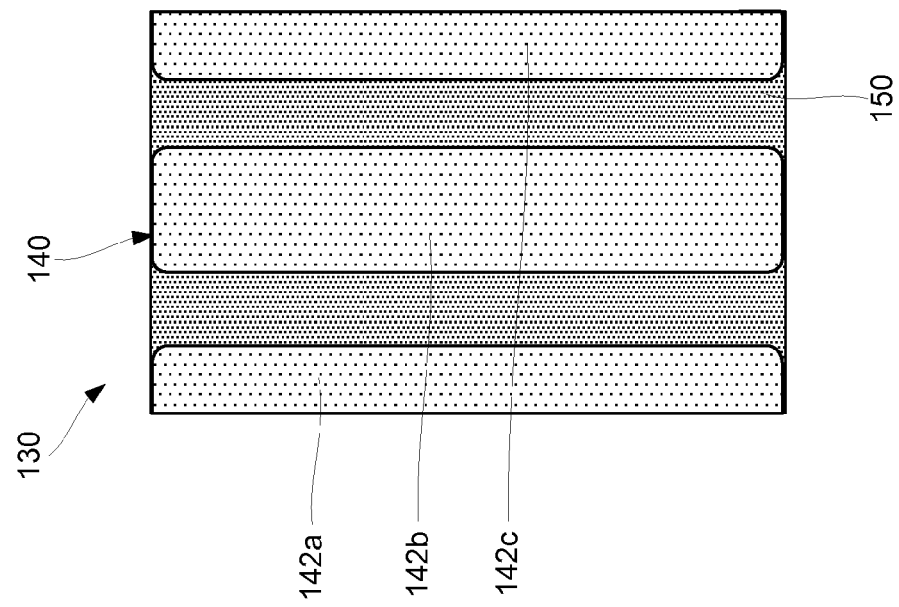
FIG. 8C is a plan view schematic diagram illustrating an example of an interconnect circuit, in accordance with some embodiments.

FIG. 8C is a sequential cutaway plan view diagram of one example of interconnecting circuit 130 having conductive layer 140 disposed over insulating layer 150. Conductive layer 140 is shown to include three islands 142a, 142b, and 142c. Each of islands 142a, 142b, and 142c covers a separate set of insulating layer openings 155 and monitoring point openings 824. Furthermore, in this example, island 142b interconnects six battery terminals by electrical connections made through the corresponding insulating layer openings 155.

FIG. 8D is a sequential cutaway plan view diagram of one example of interconnecting circuit 130 having second insulating layer 156 disposed over conductive layer 140. In this example conductive layer 140 is disposed between two insulating layers, such that one insulating layer, insulating layer 150, is disposed between conductive layer 140 and cells 100. This insulating layer is not visible in FIG. 8D. The other insulating layer, second insulating layer 156, is disposed on top of conductive layer 140 such that conductive layer 140 is disposed between second insulating layer 156 and cells 100. Second insulating layer 156 may include second insulating layer openings 157 that may be aligned with openings in the first insulating layer. Second insulating layer openings 157 may be used to access the conductive layer, which is visible in FIG. 8D through second insulating layer openings 157, when making electrical connections between the conductive layer and battery cell terminals.

The composition of insulating layers 150, 156 of interconnect circuit 130 may be selected from any of the electrically insulating dielectric and/or adhesive materials described in other embodiments. As noted above, the layers may include openings corresponding to the locations of the cell terminals. For example, the insulating layer 150 disposed between battery cells 100 and conductive layer 140 may include an upper adhesive sublayer for mechanically coupling and/or attaching the interconnect circuit 130 to the cells or, more specifically, to the packaging of the battery cells 100. This coupling may help reduce mechanical stress at the connection points between the terminals and conductive layer. In some embodiments, the thickness of the first insulating layer 150 and second insulating layer 156 may be relatively low to help promote heat transfer through the interconnect circuit 130. For example, the thickness of the first and second insulating layers may range from 10 to 125 microns.

Alternatively, the first insulating layer 150 may include additional openings for the direct attachment (via welding, soldering, adhesive, PSA, etc.) of the packaging of battery cells to the conductive layer. In these embodiments, the packaging of the battery cells may be electrically isolated from the terminals of the battery cells (e.g., the packaging may be electrically neutral). Furthermore, the conductive layer may be optionally patterned to electrically isolate islands of the conductive layer that interconnect the terminals from other regions of the conductive layer that bond to the packaging of the battery cells. This arrangement may facilitate the removal of heat from the battery cells (for example, by exposing the rear side of the interconnect circuit to a heat removal element, or by transferring heat across the length of interconnect circuit). In general, the battery cells 100 and their terminals 510, 520 may be electrically and/or mechanically connected to interconnect circuit 130 using techniques including, but not limited to, laser welding, resistance welding, ultrasonic welding, reflow soldering, wave soldering, attachment with ECA, or (in the case of the battery housing) attachment with non-conductive adhesives. The insulating layer may also include openings corresponding to monitoring points as described above. The monitoring points may be used for the monitoring of sub-array voltage, the attachment of surface mount devices, selective charge/discharge, etc. Alternatively, in some embodiments, the interconnect circuit 130 may extend beyond the bottom row of the battery cells and incorporate additional monitoring and/or control circuitry into the circuit, as described in other embodiments.

The patterned conductive layer (e.g., the layer having electrically isolated islands) may be used for electrical connections of the terminals. Referring to FIGS. 8A and 8C, island 142b interconnects positive terminals of battery cells 100 in the left column with negative terminals of battery cells in the right column. While FIG. 8C depicts conductive layer 140 having a one-dimensional array of islands 142a, 142b, and 142c, conductive layer 140 may be patterned in accordance with any desired layouts or designs. In some embodiments, regions of conductive layer 140 may be patterned for the purpose of facilitating the removal of heat from (or, in some cases, the addition of heat to) the battery cells. For example, regions of conductive layer 140 may be disposed beneath and, optionally, directly attached to the housing of the battery cells for improved heat transfer. Furthermore, the thickness of conductive layer 140 may be chosen to reduce resistive power loss and/or promote heat transfer. In some embodiments, the thickness of conductive layer 140 may range from 25 microns to over 2 mm.

In applications in which the length and width of the interconnect circuits are limited by external constraints (for example, by the lateral dimensions of a battery pack or an electrical device being powered by a battery or battery pack), stacked arrangements may be employed to increase the total energy storage capacity of the pack. For example, FIG. 8E shows a configuration in which more than one interconnect circuit 130 and corresponding battery cells 100 are stacked in the direction perpendicular to the plane of interconnect circuit 130. To electrically connect the stack of interconnect circuits 130 together, the conductive foil at the edges of a first interconnect circuit may be attached to the conductive foil at the edges of an adjacent interconnect circuit to achieve a desired series, parallel, or series/parallel connection. Alternatively, FIG. 8F shows a configuration in which battery cells 100 are attached to both sides of a single folded interconnect circuit 130. For example, battery cells 100 may be electrically connected to both sides of the conductive layer of interconnect circuit 130. Interconnect circuit 130 may be folded after the attachment of battery cells 100, or may be folded as battery cells 100 are individually attached to the interconnect circuit. In other embodiments, a wide variety of stacked arrangements may be implemented, including combinations of the arrangements shown in FIGS. 8E and 8F.

As in other embodiments, interconnect circuit 130 may be patterned to provide circuit features in the vicinity of two terminals having different polarities, as shown in FIG. 8G. For example, insulating layer 150 may be patterned with slot 220 to help reduce the mechanical stress and/or improve vibration resistance in the areas of interconnection between interconnect circuit 130 and the terminals. In addition, conductive layer 140 may be patterned to form fusible link 170. The composition, width, thickness, and length of fusible link 170 may be chosen to cause fusible link 170 to blow open at a desired fuse current (e.g., in the event that battery cell develops an internal short).

The use of a planar or tiled configuration for prismatic battery cells may provide benefits in other aspects of a battery pack. An example of the implementation of interconnect circuit 130 and battery cells 100 (as shown in FIG. 8A-8E) into a battery pack having a substantially flat form factor is shown in exploded view in FIG. 8H. Compression plate 840 may be made from a structurally strong material (e.g., 0.5-5 millimeter thick stainless steel, aluminum, titanium, carbon fiber, or the like) and may be used to seal and apply pressure to the other elements of battery pack 830. To help maintain uniform pressure across the pack, an array of bolts (not shown in FIG. 8H for the sake of clarity) may be used to fasten the pack in between compression plate 840 and an upper compression plate which is not visible in FIG. 8H. For example, bolts may be positioned at each corner of battery cells 100 to help apply uniform pressure.

Conformal layer 850 may be made from a relatively soft material (e.g., 0.5-5 millimeter thick polyurethane foam, rubber, silicone, or the like) and may be used to help maintain even pressure within the pack. In addition, conformal layer 850 may be designed to help accommodate any swelling that may occur in the battery cells 100 during pack operation.

Figure 8H:
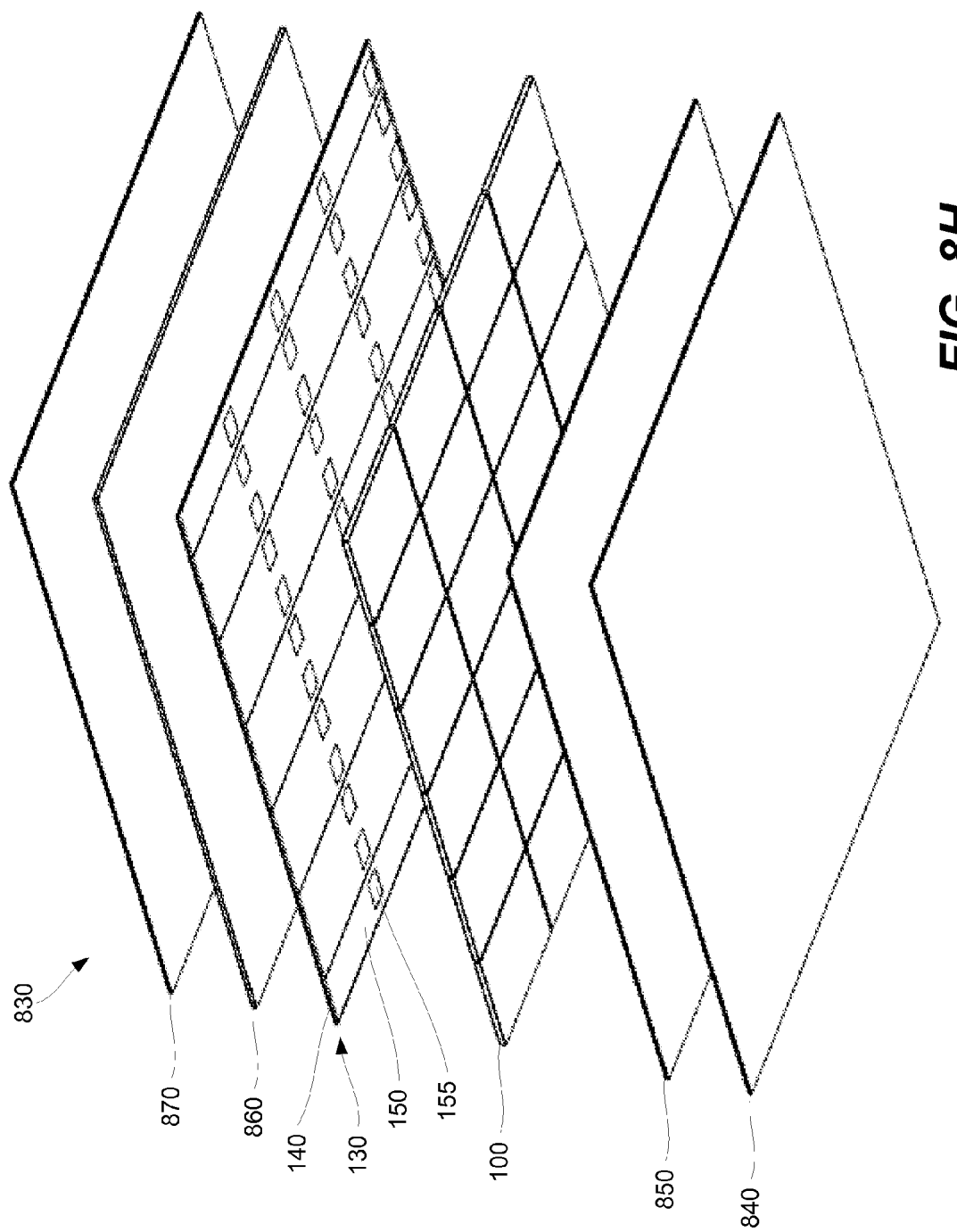
FIG. 8H is an exploded view schematic diagram illustrating an example of a battery pack, in accordance with some embodiments.

Battery cells 100 may have a prismatic form factor and may be configured in a flat or tiled orientation with respect to the z direction shown in FIG. 8H. In some embodiments, battery cells 100 may be of the so-called "pouch cell" variety, with a package thickness ranging from 3-30 mm. In addition, the battery cells 100 may optionally possess foil-based positive terminals 510 and negative terminals 520 that protrude from one edge of the cell. In the exploded view shown in FIG. 8H, the foil terminals have been folded over the battery cells 100 so that they are not visible. In some embodiments, the terminals may first be welded or otherwise electrically connected to the interconnect circuit 130 prior to folding the battery cells 100 over the tabs or vice-versa. This configuration may help to increase the packing density of the battery cells 100.

Interconnect circuit 130 may be designed in accordance with the layouts depicted in FIGS. 8B-8D. Alternatively, interconnect circuit 130 may have an entirely different layout or layer stack arrangement altogether. As described in other embodiments, an adhesive layer (e.g., a pressure-sensitive adhesive (PSA)) may be coated on the upper surface of insulating layer 150 to provide for the attachment of the packaging of battery cells 100 to interconnect circuit 130. This may act to reduce the mechanical stress on the battery terminals. A second insulating layer, which is not visible from the perspective shown in FIG. 8H, may be disposed in between conductive layer 140 of interconnect circuit 130 and optional heat spreader/sink 860. A second insulating layer may provide electrical isolation between the conductive layer 140 and the heat spreader/sink 860 (e.g. in cases in which the heat sink is electrically conducting). The second insulating layer may further incorporate an adhesive layer to facilitate the mechanical attachment of the interconnect circuit 130 to the heat spreader/sink 860, as described in other embodiments.

As an alternative to the use of a heat spreader/sink 860, the conductive layer 140 of the interconnect circuit 130 may be made sufficiently thick to perform as a heat sink in addition to providing electrical conductivity. For example, conductive layer 140 may be made 0.25-3 millimeters thick, or more specifically 0.5-2 millimeters thick, at which point the heat capacity of the conductive layer 140 may be suitably high so as to reduce the impact of any rapid influxes of heat from the battery cells 100 on circuit temperature.

In addition, conductive layer 140 may be patterned so that the area of the openings in conductive layer 140 (as viewed from a plan view perspective) occupies a relatively small percentage of the total area of the conductive layer 140. For example, conductive layer 140 may be designed so that more than 85% of the total area of the layer is occupied by conductive layer 140, or more specifically, so that more than 95% of the total area of the layer is occupied by a conductor. This will tend to increase the heat sinking capability of conductive layer 140.

To assist in the removal of heat from the battery pack, a heat removal element 870 may be placed into contact with the heat spreader/sink 860 or, optionally, in direct contact with interconnect circuit 130. The heat removal element may rely on a variety of means to remove heat from battery pack 830. In some embodiments, heat removal element 870 may include channels that circulate liquid coolant throughout the battery pack and out to a heat exchanger. In other embodiments, the heat removal element may be designed to flow air across battery pack 830 and, ultimately, away from the pack.

In some embodiments, an upper compression plate may be disposed above heat removal element 870 to complete battery pack 830. This element is not shown in FIG. 8G. Alternatively, the assembly shown in FIG. 8G may be layered in the z-direction with additional assemblies if a higher total energy storage capability is desired in the pack. This arrangement would be analogous to the arrangement shown in FIG. 8E.

Compared to configurations in which prismatic battery cells are stacked with their largest surfaces facing each other (e.g., in FIGS. 5A-5G and 6A-6G), a potential advantage of the flat or tiled cell configurations depicted in FIGS. 8A and 8H is that the largest surfaces of the battery cells are easily accessible for heat transfer. This may lead to simpler cooling systems and better thermal uniformity across the battery pack. In addition, a battery pack 830 having a substantially flat form factor may provide an advantage in applications in which a low pack height or profile may be desired, such as in certain automotive and aerospace designs.

Processing Examples

The use of traditional flexible circuits for interconnecting battery cells has a number of challenges. For example, battery cells may utilize large charge and discharge currents, such as during acceleration of electrical/hybrid vehicles, start-stop battery applications, and the like. At the same time, individual battery cells operate at very low voltages, such as 2-5V, for example. The cross-sectional area of conductive components or, more specifically, the thickness of conductive layers suitable for maintaining low power losses is often so large that many conventional mask-and-etch techniques used to pattern these layers are prohibitively expensive and inefficient. For example, the volume of chemical etch waste generated by mask-and-etch manufacturing lines is generally directly proportional to the thickness of the conductive layers. The disposal and/or treatment of this waste presents a significant environmental challenge. In addition, since most existing mask-and-etch manufacturing lines are designed for relatively thin conductors (e.g., 35 micron thick copper), an increase in the thickness of the conductor layer can lead to a directly proportionate reduction in the throughput of the manufacturing line. Furthermore, as described above, the etching of thick conductive layers frequently results in undercutting of the etchant beneath the mask layer, which can lead to very poorly-defined traces in the final circuit.

In addition, a significant challenge associated with conventional flexible circuit fabrication techniques is the production of flexible circuits that have openings in both a first insulating layer (known in conventional flexible circuit parlance as a "base") and in a second insulating layer that is disposed on the opposite surface of the conductive layer from the base (known in conventional flexible circuit parlance as a "coverlay"). The challenge in producing these so-called "back-bared" flexible circuits arises from a process step in which a pre-patterned base is laminated in registration to a masked, but un-etched, conductive layer. Because the conductive layer is un-etched, there is no line of sight available between the layers to ensure the proper alignment of the layers prior to lamination. This can result in a low manufacturing yield and increased manufacturing costs for this type of circuit. (Vlad, Feel free to modify the above paragraphs as you see fit, however, we do wish to contrast our method with the conventional method of producing a "back-bared" circuit somewhere within the application.)

Figure 9:
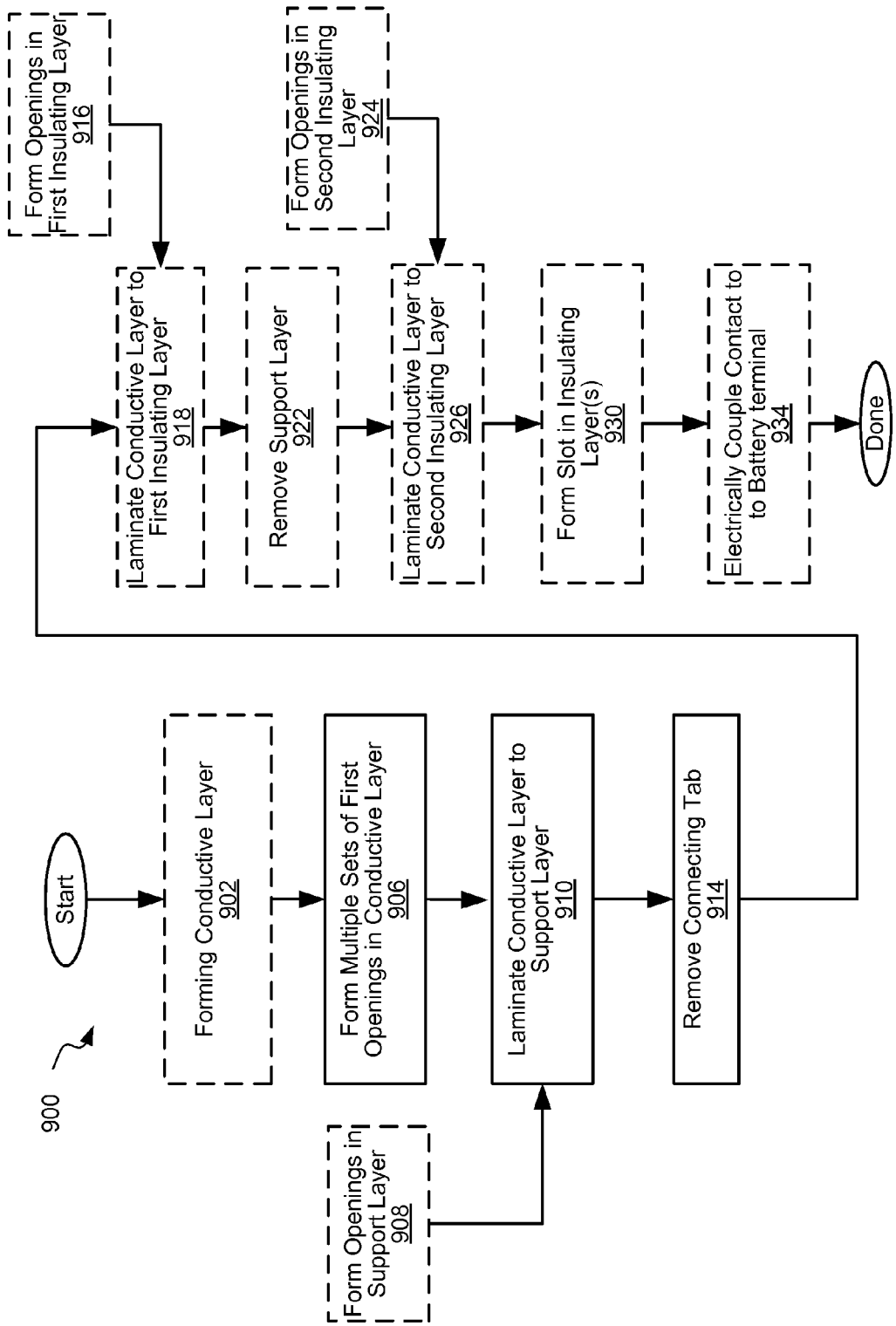
FIG. 9 is a process flowchart corresponding a method of forming an interconnect circuit, in accordance with some embodiment.

To overcome these challenges, various examples of a method of fabricating an interconnect circuit that does not involve mask-and-etch techniques are described herein. Specifically, FIG. 9 is a process flowchart corresponding to method 900 of forming an interconnect circuit that is suitable for interconnecting battery cells in a battery pack, in accordance with some embodiments. FIGS. 10A-13C show the interconnect circuit and its components at various stages of this method.

Method 900 may commence with forming a conductive layer during optional operation 902. This operation may be performed prior to laminating the conductive layer to a support layer as further described below. Furthermore, the operation of forming the conductive layer may be performed prior to forming openings in the conductive layer. Alternatively, the conductive layer may be formed in a different process and supplied to method 900 in a ready-to-use form.

Examples of the formation of a conductive layer during operation 902 (or supplied as such) are shown in FIGS. 10A-10C. FIG. 10A illustrates an example of conductive layer 140 having base sublayer 1002 and surface sublayer 1006 disposed on one side of base sublayer 1002. FIG. 10B illustrates an example of conductive layer 140 having base sublayer 1002, intermediate sublayer 1004 and surface sublayer 1006, such that intermediate sublayer 1004 is disposed between base sublayer 1002 and surface sublayer 1006. Finally, FIG. 10C illustrates an example of conductive layer 140 having two surface sublayers 1006a and 1006b such that base sublayer 1002 is disposed between two surface sublayers 1006a and 1006b.

Regardless of the example, each sublayer may have a different composition. Specifically, base sublayer 1002 may have a different composition than intermediate sublayer 1004 and surface sublayer 1006. Furthermore, intermediate sublayer 1004 may have a different composition than surface sublayer 1006. In some embodiments, base sublayer 1002 may include aluminum or alloys thereof, nickel, copper, or steel. Intermediate sublayer 1004 may include chromium, titanium, nickel, vanadium, zinc, or copper. Surface sublayer 1006 may include tin, lead, zinc, nickel, silver, palladium, platinum, gold, indium, tungsten, molybdenum, chrome, or copper. Intermediate and surface sublayers may each be coated on either or both sides of base sublayer, as shown in FIGS. 10A-10C. While base sublayer 1002 is generally available as a island or roll of material, intermediate sublayers 1004 and surface sublayers 1006 may generally be applied or coated using techniques including electroplating, electroless plating, sputtering, vacuum evaporation, electron beam evaporation, cladding, or cold welding. Alternatively, intermediate sublayers 1004 and surface sublayers 1006 may be applied or coated using other techniques altogether.

Forming one or more sublayers on a base sublayer allows more material options for the base layer without compromising the performance of the interconnect circuit. In some cases, the performance (e.g., weight) and cost of the resulting interconnect circuit is improved when a stacked conductive layer is used. For example and as noted above, the base layer may be made from aluminum. Aluminum is not a common material for electrical conductors because it tends to form an oxide layer that is difficult to make electrical and mechanical connections to. For example, aluminum foils and other types of aluminum structures may be difficult to solder to or to resistance weld to. Copper has been a material of choice for such applications. However, copper is substantially more expensive and much heavier. The density-to-conductivity ratio of copper is twice greater than that for aluminum.

By contrast, in embodiments described herein, a surface sublayer may be used for electrical and/or mechanical coupling to an aluminum base sublayer, and the aluminum base sublayer may be used as a primary electrical conductor and, in some embodiments, a primary thermal conductor. In some embodiments, an interface sublayer may be disposed between the surface sublayer and aluminum base sublayer, for example, to promote adhesion between the two. In some embodiments, the thickness of the surface sublayer may be between about 0.01 and 10 microns or, more specifically between about 0.05 microns and 1 micron. The thickness of the interface sublayer may be between about 0.01 microns and 10 microns or, more specifically between about 0.05 microns and 1 micron. The thickness of the base sublayer generally depends on the overall conductance requirements of the interconnect circuit. The thickness of the base sublayer may be between about 10 and 2000 microns or, more specifically between about 50 and 500 microns.

In the above example, the conductive layer forming operation may involve forming the intermediate sublayer over the base layer followed by forming the surface layer on the intermediate layer.

It should be noted that the surface sublayer of a conductive layer is not limited to contact pad areas. Instead, the surface sublayer extends under insulating layers as, for example, shown in FIG. 15A. Specifically, FIG. 15A illustrates conductive layer 140 including surface sublayer 1006 disposed on base sublayer 1002 and laminated to insulating layer 150. An intermediate sublayer may or may not be present as described above. As such, surface sublayer 1006 extends beyond contact pad 160 and may assist with adhesion of insulating layer 150 to conductive layer 140. This is contrary to an example where surface sublayer is formed after the conductive layer is laminated to the insulating layer as, for example, is shown in FIG. 15B. Specifically, FIG. 15B illustrates surface sublayer 1006 being present only in contact pad 160 and only within opening 157.

It should be noted that in some embodiments, surface sublayers may be present on both sides of base sublayer as, for example, shown in FIG. 15C. Specifically, FIG. 15C illustrates conductive layer 140 including base sublayer 1002, first surface sublayer 1006a, and second surface sublayer 1006b such that base sublayer 1002 is disposed between first surface sublayer 1006a and second surface sublayer 1006b. In this example, first surface sublayer 1006a, and second surface sublayer 1006b have been laminated to corresponding insulating layers 150 and 156.

Configurations in which surface sublayers 1006a and 1006b extend underneath insulating layer 150 and/or second insulating layer 156 (as shown in FIGS. 15A and 15C) may be of particular benefit when the base sublayer 1002 is made from aluminum foil. During the process of rolling aluminum sheet stock to produce foil, rolling oils and other contaminates can form on the surface of the aluminum that tend to reduce the adhesion that can be achieved between insulating layer 150 and the aluminum foil. In addition, if the aluminum foil is annealed as a roll (as is typically done following rolling if soft or annealed foil is desired), the roll can oxidize from the top and bottom surfaces of the roll towards the center during annealing, leading to a gradient in oxide thickness (and, consequently, a gradient in surface energy) across the foil web. This, also, may interfere with the adhesion of insulating layer 150 with base sublayer 1002. A potential solution to this issue is to apply intermediate sublayer 1004 (as shown in FIG. 10B)

and/or surface sublayer 1006 to base sublayer 1002 prior to lamination to insulating layer 150, as shown in FIGS. 15A and 15C. During the application of intermediate and/or surface sublayers, a cleaning and/or etching step may be employed to remove contaminates and the aluminum oxide layer from the aluminum foil. For example, if intermediate and/or surface sublayers are applied using sputtering, a plasma cleaning step may be used to remove the contaminants and/or the aluminum oxide layer prior to deposition of intermediate and/or surface sublayers. The application of intermediate and/or surface sublayers at operation 902 may therefore act to both promote the adhesion of insulating layer 150 to aluminum base sublayer 1002 (e.g., at operations 910, 918, and/or 926), as well electrically activate the surface of the aluminum base sublayer 1002 for further processing (e.g., make it solderable).

In some embodiments, the conductive foil may include a continuous coating of an electrically insulating material on one surface. This insulating coating may have a thickness of between about 0.5 and 50 microns. The insulating coating may be coated, deposited, anodized, or laminated onto the conductive layer, either before or after the lamination of the insulating layer and/or the second insulating layer. If the thin layer of electrically insulating material is thinner and/or more thermally conductive than the insulating layer and/or the second insulating layer, in some embodiments the thin layer of insulating material might enable processes such as welding or heat sinking to take place efficiently while also preventing the exposed (i.e., not welded or soldered) surfaces of the conductive foil from forming electrical shorts to other elements of the battery module or pack. In some embodiments, the thin layer of electrically insulating material may comprise a metal oxide material. Examples of metal oxide materials which may be suitable for the thin layer of insulating material include, but are not limited to, silicon dioxide ($SiO_2$), silicon nitride ($Si_3N_4$), aluminum oxide ($Al_2O_3$), boron nitride (BN), aluminum nitride (AlN), diamond (C), or silicon carbide (SiC).

Returning to FIG. 9, method 900 may proceed with forming a set or multiple sets of first conductive layer openings in the conductive layer during operation 906. The opening may be formed using various techniques including, but not limited to, punching, flat bed die cutting, match-metal die cutting, male/female die cutting, rotary die cutting, steel rule die cutting, laser cutting, water-jet cutting, machining, or combinations thereof. In some embodiments, rotary die cutting may be used to form these sets of openings. Each set of openings may partially define a region (e.g., a contact pad for electrically coupling to a terminal of a battery cells) of the conductive layer. When the region is a conductive pad, the relative position of the sets of openings on the conductive layer is determined by the relative positions of battery cells in a pack and connection schemes as described above. The position of the openings in each set may be followed a temporary processing pattern as further described below.

After forming the set of the conductive layer openings, the two or more connecting tabs mechanically support and maintain registration of the region of the conductive layer relative to other portions of the conductive layer. In some embodiments, the two or more connecting tabs may be evenly distributed around the region of the conductive layer to provide uniform support.

A challenge associated with traditional mask-and-etch-based flexible circuit fabrication methods is the difficulty in patterning circuit traces at a smaller linewidth than four to five times the thickness of the conductive foil. In some embodiments, the non-chemical-etch-based patterning methods described above may be used to precisely define the width of the fusible link (as well as other fine features in the interconnect circuit) independent of its thickness. For example, if the conductive foil is 100 microns thick, the width of the fusible link or other narrow circuit traces may range from 50-10000 microns.

The use of non-chemical-etch-based patterning to achieve precise control of the width of the fusible link may result in better control over the current required to cause the fusible link to blow open (i.e., the fuse current rating) than traditional means of fabrication. The fusible link may be patterned by either through-cutting the conductive layer before it has been attached to the insulating layer, or, in the case of laser processing or machining, by ablating or milling away the conductive layer from the insulating layer after the attachment has occurred. In embodiments in which highly precise control over the resistance of the fusible link is desired, an ohmmeter or four-point probe may be used to provide feedback to the patterning system during removal of the conductive layer.

Specifically, FIG. 11A illustrates conductive layer 140 having one set 1005 of first conductive layer openings 1010. In this example, set 1005 includes four first conductive layer openings 1010. One having ordinary skill in the art would understand that one set 1005 may include any number of two or more first conductive layer openings 1010. First conductive layer openings 1010 in set 1005 are separated by connecting tabs 1020. Connecting tabs 1020 provide mechanical support during subsequent processing and, in some embodiments, are used as references, e.g., provide mechanical registration/alignment of conductive layer 140 relative to other components, e.g., one or more insulating layers. While the connecting tabs 1020 shown in FIG. 11A are rectangular in shape, in other embodiments the connecting tabs 1020 may possess any shape, size, or aspect ratio. In addition, the size and shape of the connecting tabs 1020 may differ across the interconnect circuit 130. For example, different connecting tab sizes and shapes may be used in order to provide a desired level of mechanical support and/or registration in different regions of the interconnect circuit.

First conductive layer openings 1010 in set 1005 surround and define contact pad 160. The boundaries of contact pad 160 are shown with a dashed line in FIG. 11A. The boundaries of contact pad 160 are further defined in later operations by removing some connecting tabs 1020. For example, FIG. 11A illustrates contact pad 160 being supported by four connecting tabs 1020. For effective support, connecting tabs 1020 may optionally be distributed uniformly around the perimeter of contact pad 160. For example, FIG. 11A illustrates contact pad 160 having a circular shape and four connecting tabs 1020 positioned at 90° with respect to each other.

It should be noted that while FIG. 11A and subsequent figures refers to a region defined and surrounded by first conductive layer openings as a contact pad, this region may be any other components formed from the conductive layer, such as voltage traces, auxiliary traces, contact pads, collections of contact pads provided on the same continuous portion of the conductive layer, or any other like component.

Returning to FIG. 9, method 900 may proceed with laminating the conductive layer to a support layer during operation 910. If the support layer has any patterned features, then just prior to lamination, these features may be aligned with the first conductive layer openings formed in the previous operation. In this example, the alignment of a patterned support layer to a partially-patterned conductive layer may be performed using openings in each of the layers as aligning features. Compared to conventional techniques for producing a back-bared flexible circuit, the availability of patterned features on the same side of both the conductive layer and insulating layer may help simplify process the aligning of the layers, thereby improving yield and reducing cost.

In some embodiments, the optimal lamination conditions for the support layer may depend on how the support layer is used in the process. For example, if the support layer is the insulating layer that is to become a part of the completed interconnect circuit, a combination of heat and/or pressure may be used to attach support layer to the conductive layer and form a high-strength adhesive bond. By contrast, if the support layer is a releasable substrate (as described below), the support layer may optionally include a low-tack pressure-sensitive adhesive that allows for the formation of a low-tack bond to conductive layer 140 through a simple pressure-based lamination process.

FIG. 11C is a schematic top view of an example of interconnect circuit 130 after laminating conductive layer 140 to support layer 1025. In this view, conductive layer 140 is shown on the top of support layer 1025. Portions of support layer 1025 are visible through conductive layer openings 1010. For reference, support layer 1025 is shown as a standalone component (prior to laminating to the conductive layer) in FIG. 11B. In this example, support layer 1025 may be operable as an insulating layer that may later remain a part of the interconnect circuit. In this case, support layer 1025 may already be patterned. FIG. 11B illustrates support layer 1025 having optional opening 155 and slot 220, which may be referred to as an insulating layer opening and an insulating layer slot. In some embodiments, support layer 1025 may only have openings but not slots. In FIG. 11C, a part of slot 220 is visible through conductive layer openings 1010. In this view, opening 155 may be fully covered by conductive layer 140. As such, opening boundary 1055 is shown with a dashed line.

Figure 11D:
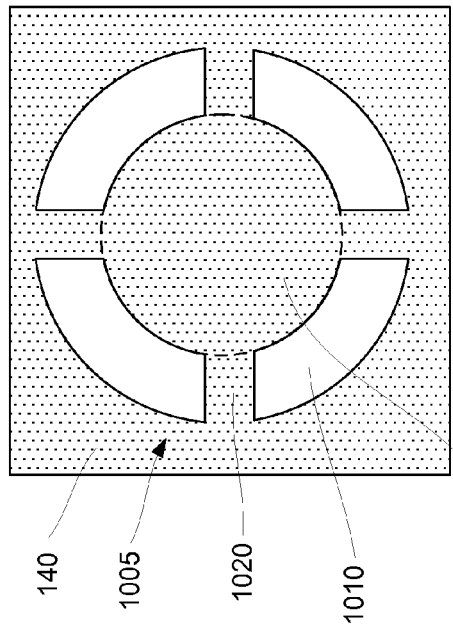
FIG. 11D is a plan view schematic diagram illustrating an example of a portion of a conductive layer having a contact pad, in accordance with some embodiments.
Figure 11E:
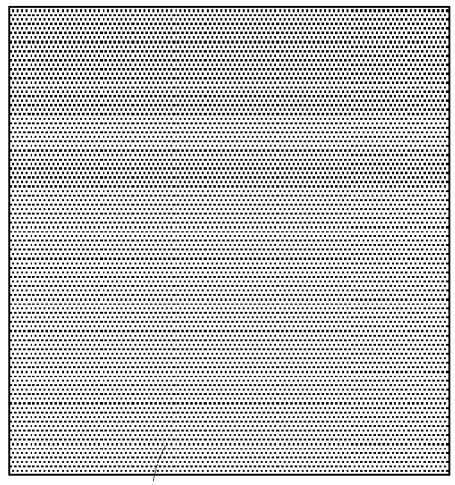
FIG. 11E is a plan view schematic diagram illustrating another example of a portion of a support layer, in accordance with some embodiments.
Figure 11F:
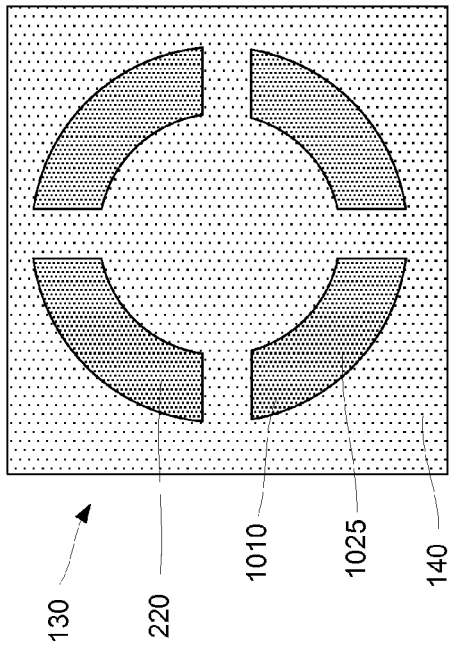
FIG. 11F is a plan view schematic diagram of another interconnect circuit, in accordance with some embodiments.

Alternatively, at the time of lamination to the conductive foil, support layer 1025 may not have any features. For example, support layer 1025 may be a temporary releasable substrate that is later removed and, in some embodiments, replaced with a different layer. The releasable substrate may be used to temporarily support the conductive foil while additional openings are formed in the foil or, more specifically, when some or all of the connecting tabs are removed. FIG. 11F is a schematic top view of another example of interconnect circuit 130 after laminating conductive layer 140 to support layer 1025, in which support layer is a releasable liner without any openings. An example of such a support layer 1025 is shown in FIG. 11E. FIG. 11D shows conductive layer 140 prior to lamination and is provided for reference.

After laminating the conductive layer to the support layer, the support layer mechanically supports and maintains registration of the region of the conductive layer relative to the other portions of the conductive layer. As such, some or all of the two or more connecting tabs may be removed as support from these opening is not needed. It should be noted that one or more connecting tabs may be completely or partially retained in order to provide electrical connections to the region of the conductive layer. Returning to FIG. 9, method 900 may proceed with removing at least one of the connecting tabs in each of the multiple sets during operation 914. During this operation, at least two of the first conductive layer openings in each set are converted into a continuous conductive layer channel that at least partially surrounds the region (e.g., a contact pad or other circuitry of the conductive layer). Various techniques may be used to remove the connecting tabs, including, but not limited to, punching, flat bed die cutting, match-metal die cutting, male/female die cutting, rotary die cutting, laser cutting, laser ablation, machining, applying a large voltage, or combinations thereof. In some embodiments, a vision alignment system may be used to ensure that the cutting apparatus precisely removes the connecting tabs. Such a vision system could enable a highly precise removal step by registering the cutting apparatus to fiducial marks made in the conductive layer during the formation of sets of first openings in the conductive layer at operation 902. In some embodiments, rotary die cutting with a vision alignment system may be used to remove the connecting tabs. The die cutting pattern may be made slightly larger than the size of the tab itself to make sure the connecting tabs are completely removed by the cutting apparatus. In some embodiments, the insulating layer lying above (or beneath) the connecting tab may be removed in the process of removing the tab, while in other embodiments the insulating layer may be left intact.

In some embodiments, while at least one of the connecting tabs is removed during operation 914, at least one of the connecting tabs 1020 is retained in the final assembly and is operable as a fusible link. The fuse current rating of a fusible link is generally proportional to its thickness and width. The thickness of the fusible link is typically the same as the surrounding regions of the conductive layer and may range from about 10-2000 microns, or more specifically from about 50-500 microns. Achieving a desired fuse current rating, therefore, is generally approached by controlling the width of the fusible link, which may range from about 50-10000 microns, or more specifically from about 100-1000 microns using the methods described herein. For a 100 micron thick conductive layer and a desired fuse current rating of 30 Amps, the width of the fusible link should be about 500 microns.

Alternatively, in other embodiments method 900 may be used to fabricate features in conductive layer 140 that are completely electrically isolated from other features. In these embodiments, all of the connecting tabs that are in connected to a region of conductive layer 140 in which electrical isolation is desired may be removed at operation 914. For example, the conductive layer islands 142a, 142b, and 142c shown in FIG. 1E may be initially mechanically coupled via one or more connecting tabs until support layer 1025 has been laminated to conductive layer 140. Then, at operation 914, all of the tabs that are used to hold conductive layer islands 142a, 142b, and 142c in registration may be removed to fully electrically isolate the conductive layer islands from each other, with registration still being maintained by support layer 1025. Additional examples of electrically isolated features that may be patterned using this method include, but are not limited to, circuit traces, busbars, ancillary traces, heat sinks, surface mount traces, routing traces, or other types of circuitry.

Figure 12B:
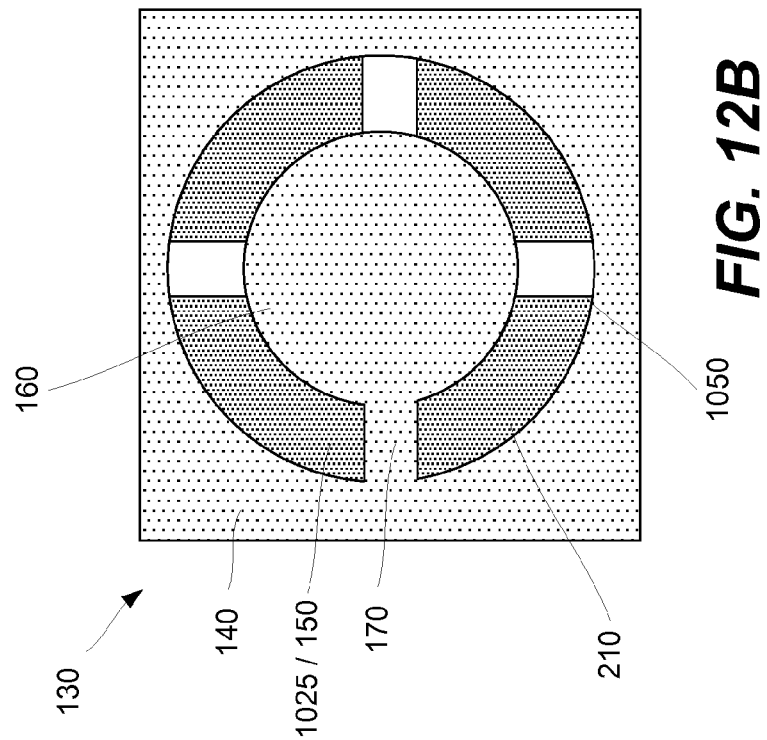
FIGS. 12A and 12B are plan view schematic diagrams of different interconnect circuits, in accordance with some embodiments.
Figure 12A:
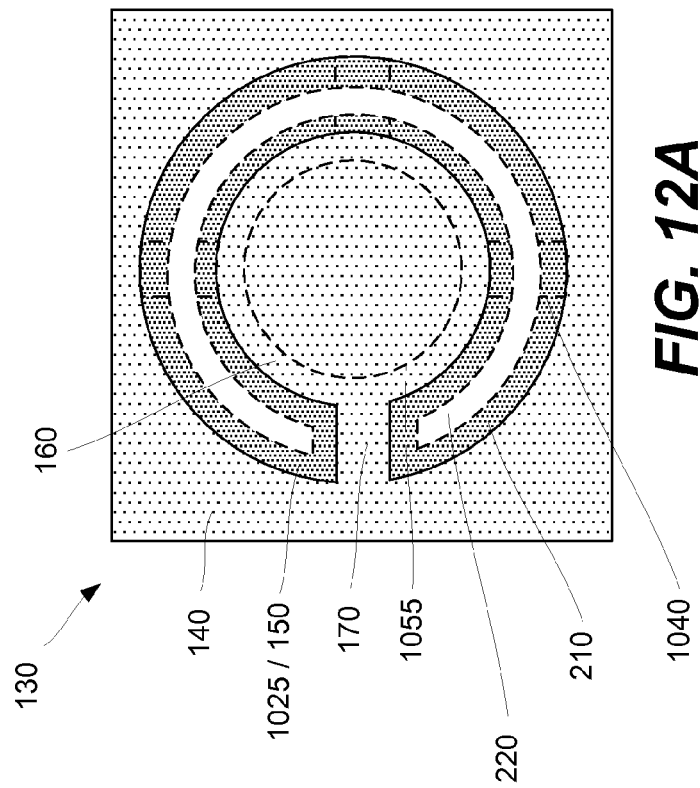

FIGS. 12A and 12B illustrate two alternative examples of interconnect circuit 130 after the connecting tab removal operation. In both examples, three connecting tabs positioned on the top, right, and bottom are removed. The connecting tab on the left has been retained providing an electrical connection between contact pad 160 and other parts of conductive layer 140. One having ordinary skills in the art would understand that this example would be also applicable to other components formed from conductive layer (besides contact pad 160). This remaining connecting tab may be operable as fusible link 170 as described above. The difference between these two examples lies in whether or not the support layer 1025 is cut when the connecting tabs are removed. Specifically, FIG. 12A illustrates the three tabs being removed without cutting through support layer 1025. As such, support layer 1025 may be operable as first insulating layer 150 and remain as a part of interconnect circuit 130.

On the other hand, FIG. 12B illustrates the three tabs being removed together with corresponding portions of support layer 1025 leaving tab openings 1050 in support layer 1025. This example may be used when support layer 1025 is operable as a temporary releasable layer, which is later removed and does not become a part of interconnect circuit 130. In this example, support layer 1025 may subsequently be replaced with an insulating layer that does not necessarily have such tab openings. Consequently, the presence of tab openings 1050 in the temporary releasable layer is irrelevant for electrical insulation. Furthermore, the size and location of tab openings 1050 may be such that support layer 1025 continues to provide mechanical support and registration to various features of conductive layer 140 and, in particular, to contact pad 160 of conductive layer 140 (or, more generally, the region) during later operations.

Materials that may be suitable for the releasable layer include, but are not limited to, polyimide (PI), polyethylene naphthalate (PEN), polyethylene terephthalate (PET), polymethyl methacrylate (PMMA), ethyl vinyl acetate (EVA), polyvinyl butyral (PVB), polyethylene (PE), paper, or conductive foil. Furthermore, the releasable layer may include a low-tack adhesive coating such as a PSA on its surface to facilitate bonding to the conductive foil. Alternatively, if the releasable layer does not include an adhesive coating, an adhesive material such as a thermoplastic sheet or wet-coatable PSA may be incorporated in between the conductive layer and releasable layer just prior to lamination. The releasable layer and its coatings may maintain a low-tack adhesive bond to the conductive layer through some operations including lamination of the conductive layer to an insulating layer. This feature ensures mechanical support to the conductive layer and its components at the same times allows the releasable layer to be removed when this support is later provided by the insulating layer.

As noted above, the releasable layer may be used for registering the patterned insulating layer to the patterned conductive layer. For example, in a roll-to-roll-based manufacturing process, a roll of partially-patterned conductive layer may be additionally patterned with the releasable layer laminated to it to provide mechanical support to various conductive layer components formed during patterning (for example, this may be carried out in accordance with steps 906, 910, and 914 as shown in FIG. 9). This patterning process may be followed by the singulation of the rolls of conductive layer/releasable layer laminate into individual parts including the patterned conductive layer and releasable layer. For example, the individual parts may correspond to a single interconnect circuit or to 2-100 interconnect circuits. Similarly, rolls of the insulating layer may also be patterned in-line and then singulated into individual parts that optionally correspond to a single interconnect circuit or to 2-100 interconnect circuits. The individual parts (one part being the patterned conductive layer/releasable layer laminate and the other part being patterned insulating layer) may then be aligned with each other. For example, various flexible circuit lamination techniques, such as pin-based or optical registration, may be used for this purpose. In some embodiments, the releasable layer is not involved in the registration. The releasable layer holds the conductive layer in place during the second cut. If the second cut is made and all the connecting tabs are removed (for example, to form complete islands), the conductive layer would fall apart without the releasable layer. The registration of the second cut is made to features put into the conductive layer during the first cut. After the alignment, the parts are laminated together and the releasable layer is removed. Comparing this process to conventional processes in which patterned conductive layers and patterned insulating layers are registered to each other as continuous rolls in-line, the process described herein may help to simplify manufacturing, improve throughput, and improve yield, because it is generally significantly simpler to align individual parts for lamination than aligning entire rolls.

Regardless of whether support layer 1025 is a first insulating layer or the first insulating layer is later laminated to the conductive layer, the first insulating layer may be patterned with an array of openings prior to lamination to the conductive layer as shown by optional operations 908 and 916 in FIG. 9. In some embodiments, the first insulating layer may be coated with or bonded to an adhesive layer, which facilitates lamination to the conductive layer. In some embodiments, an adhesive material is a part or sublayer of the first insulating layer.

As in other embodiments, the alignment of patterned first insulating layer 150 to patterned conductive layer 140 may be performed using openings in each of the layers as aligning features. In this example, the releasable layer is used to provide mechanical support and registration to patterned conductive layer 140 prior to the registered lamination of patterned conductive layer 140 to patterned insulating layer 150. Compared to conventional techniques for producing a backbared flexible circuit, the availability of patterned features on the same side of both the conductive layer 140 and insulating layer 150 may help simplify process the aligning of the layers, thereby improving yield and reducing cost. In some embodiments, releasable layer 1025 may be used to provide mechanical support to conductive layer 140 during the mask-and-etch-based patterning of conductive layer 140, e.g., prior to lamination of patterned conductive layer 140 to patterned insulating layer 150 using alignment features in both layers.

In some embodiments, an example of interconnect circuit 130 shown in FIG. 12A may be used for connecting to batteries without further processing. Alternatively, additional operations may be involved in forming interconnect circuit 130 as, for example, shown in FIG. 9. Specifically, if the support layer, which is laminated to the conductive layer prior to removing one or more connecting tabs, is a releasable temporary substrate, then method 900 may proceed with laminating a first insulating layer to the conductive layer during operation 918 followed by removing the support layer during operation 922. Note that during operation 918, the first insulating layer may be laminated to the opposite side of the conductive layer from the releasable substrate. The process conditions of this lamination step may be chosen such that the insulating layer 150 forms an intermediate level of tack with the conductive layer 140 and the releasable layer but not a high level of tack. This can help ensure that the conductive layer 140 will remain bonded to insulating layer 150 during subsequent peeling of the releasable layer, while also ensuring that the bond will not be so strong that it becomes impossible to peel the releasable layer apart from the insulating layer 150 in regions (such as in conductor layer channel 210) where these two layers are in contact. The releasable layer may then be peeled from the conductive layer 140 and insulating layer 150 during operation 922.

In some embodiments, operations 918 and 922 are not performed and the support layer remains a part of the interconnect circuit. In these embodiments, the support layer may be also referred to as a first insulating layer.

In some embodiments, method 900 may also involve laminating a second insulating layer to the conductive layer during optional operation 926. After this operation, the conductive layer is disposed between the first insulating layer and the second insulating layer. This operation is independent from optional operations 918 and 922 described above. In other words, operation 926 may be performed without performing operations 918 and 922, in which case the first insulating layer is a support layer laminated to the conductive layer during operation 910. Alternatively, when operations 918 and 922 are performed, the first insulating layer is laminated to the conductive layer during operation 918 and the releasable layer is removed during operation 922. In this later case, the releasable layer may be effectively replaced with the second insulating layer.

Figure 13A:
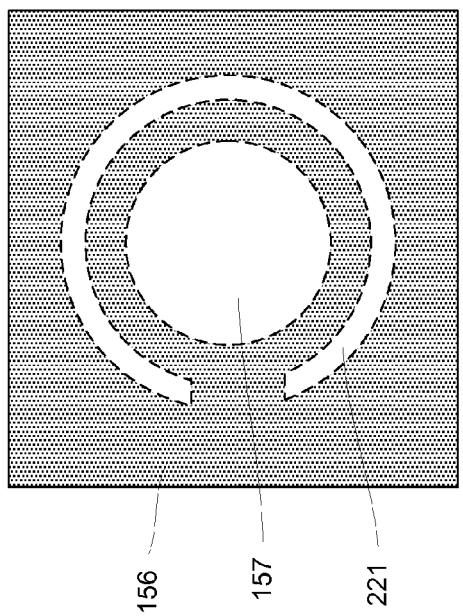
FIG. 13A is a plan view schematic diagram illustrating an example of a second insulating layer, in accordance with some embodiments.

FIG. 13A illustrates a top schematic view of an example of second insulating layer 156 prior to laminating this layer to the conductive layer. Second insulating layer 156 may include second insulating layer opening 157. As described above, this opening may be used to access the contact pad aligned with this opening during, for example, connecting the contact pad to a battery cell terminal. Second insulating layer 156 may include second insulating layer slot 221 to provide flexibility to a portion of second insulating layer 156 partially surrounded by this slot. Second insulating layer opening 157 and slot 221 may be patterned during operation 924, e.g. prior to operation 926.

Figure 13B:
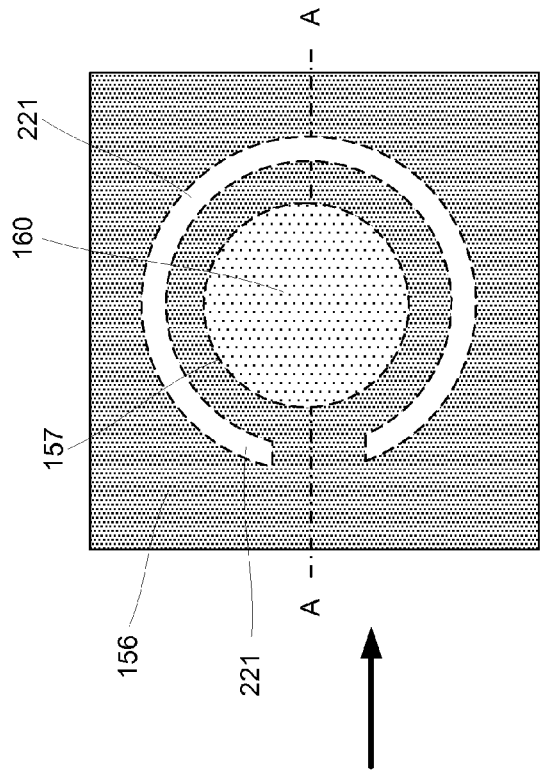
FIG. 13B is a plan view schematic diagram of an interconnect circuit, in accordance with some embodiments.

FIG. 13B illustrates a top schematic view of an example of second insulating layer 156 after to laminating this layer to conductive layer 140. Furthermore, contact pad 160 of conductive layer 140 is visible through second insulating layer opening 157. FIG. 13C illustrates a cross-sectional schematic view of the same example as in FIG. 13B. First insulating layer 150 and its features are visible in this view. Specifically, first insulating layer opening 155 exposes a bottom surface of contact pad 160, while second insulating layer opening 157 exposes a top surface of contact pad 160. FIG. 13C illustrates both openings 156 and 157 having the same size. In some embodiments, openings 156 and 157 may have different sizes. For example, opening 157 may be used to protrude a battery cell terminal and may be larger than opening 157 that is used to access contact pad 160 to form an electrical connection between contact pad 160 and battery cell terminal. FIG. 13C also illustrates an example in which both insulating layers 150 and 156 have corresponding (and aligned) insulating layer slots 220 and 221. In some embodiments, contact pad 160 does not extend to insulating layer slots 220 and 221 and insulating layer 150 and 156 are laminated directly to each other in the area near slots 220 and 221 and around contact pad 160. FIG. 13C also shows fusible link 170 extending to contact pad 160. Fusible link 170 may be laminated between two insulating layers 150 and 156 as shown in FIG. 13C.

In some embodiments, the second insulating layer may have no openings above the contact pad 160. FIGS. 14A and 14B illustrate two such examples. Specifically, FIG. 14A illustrates an example in which both insulating layers 150 and 156 have corresponding insulating layer slots 220 and 221, which are aligned (similar to an example shown in FIG. 13C and describe above). However, only a bottom surface of contact pad 160 is exposed through first insulating layer opening 156. Second insulating layer 156 does not have a corresponding opening. Such a layer stack arrangement could be useful in applications in which complete electrical isolation of one surface of the interconnect circuit 130 is desired, for example.

Figure 13C:
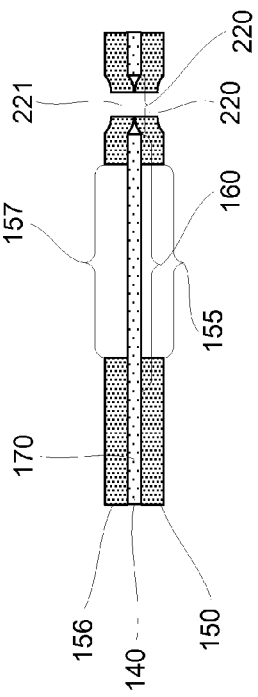
FIG. 13C is a side view schematic diagram of the interconnect circuit of FIG. 13B, in accordance with some embodiments.
Figure 14A:
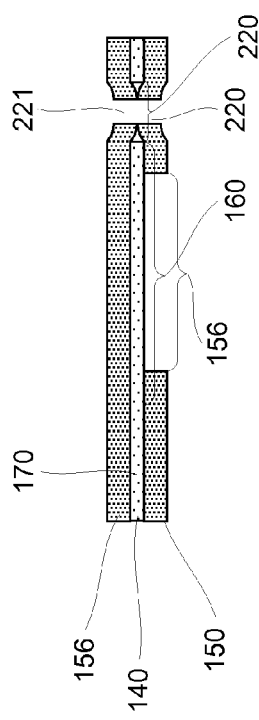
FIG. 14A-14C are side view schematic diagrams of different interconnect circuits, in accordance with some embodiments.
Figure 14B:
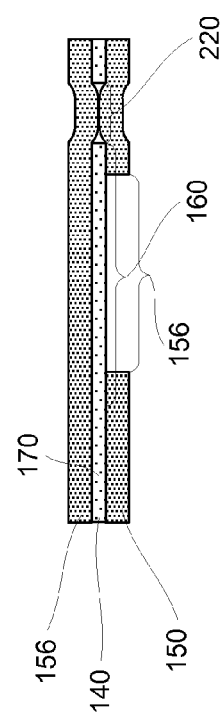

FIG. 14B illustrates an example in which both insulating layers 150 and 156 do not have insulating layer slots (unlike examples shown in FIG. 13C and FIG. 14A and describe above). This example provides more support to contact pad 160 while making it less flexible at the same time. Some flexibility may be provided by forming slits in insulating layers 150 and 156 in particular around conductive layer channel 210 (as shown in FIG. 2D, for example). Furthermore, similar to the example shown in FIG. 14A, only a bottom surface of contact pad 160 is exposed through first insulating layer opening 156. Second insulating layer 156 does not have a corresponding opening in this case.

In some embodiments, method 900 may involve forming slots in one or more insulating layers during optional operation 930. For example, the slots may be formed in the first insulating layer and/or in the second insulating layer. Alternatively, in some embodiments, one or both insulating layers have pre-formed slots at the time of their lamination to the conductive layer. Furthermore, slots may be formed (e.g., at least partially) during removal of the connecting tab as further described below. The function of the slots, such as providing a degree of freedom of motion to the contact pads) is described above with reference to FIG. 2C, FIG. 2D, and FIGS. 2F-2H.

Figure 14C:
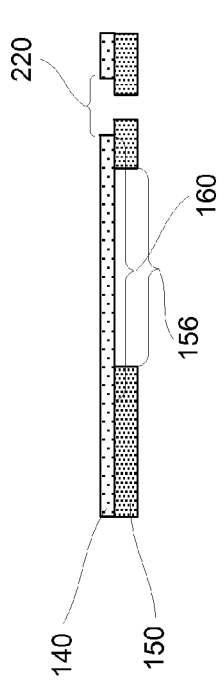

In some embodiments, an interconnect circuit has only one insulating layer when its fabrication is completed. This insulating layer may be a support layer initially present during fabrication or may be added later in the process (e.g. at operation 918). One such example of the insulating layer is show in FIG. 14C, which is a schematic cross-sectional view illustrating insulating layer 150 laminated to conductive layer 140. Conductive layer 140 has contact pad 160 and, in some embodiments, conductive layer channel 210 partially surrounding contact pad 160. Insulating layer may include insulating layer opening 156 to provide access to contact pad 160. In some embodiments, the relative positions of conductive layer 140 and insulating layer 150 may be exchanged (e.g., either insulating layer 150 may be disposed between conductive foil 140 and battery cells 100 or conductive foil 140 may be disposed in between battery cells 100 and insulating layer 150) depending on the interconnection scheme of the battery pack.

In some embodiments, method 900 may also involve electrically coupling the contact pad to a terminal of a battery cell during operation 934. The terminals of the battery cell may optionally protrude through the openings in this insulating layer 150 to reach the conductive layer 140.

CONCLUSION

The methods and devices described herein may be extended to the interconnection of electronic devices in general, including, but not limited to, integrated circuits, resistors, capacitors, inductors, photovoltaic cells, and other electronic components and/or power sources.

It is to be understood that the above description is intended to be illustrative, and not restrictive. For example, the above-described embodiments (and/or aspects thereof) may be used in combination with each other. In addition, many modifications may be made to adapt a particular situation or material to the teachings presented herein. Dimensions, types of materials, orientations of the various components, and the number and positions of the various components described herein are intended to define parameters of some embodiments, and are by no means limiting and are merely examples. Many embodiments and modifications within the spirit and scope of the claims will be apparent to those of skill in the art upon reviewing the above description. The scope should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A method of forming an interconnect circuit for interconnecting an array of battery cells, the method comprising:
    forming a set of conductive layer openings in a conductive layer,
        wherein the conductive layer openings in the set are separated from each other by two or more connecting tabs,
        wherein the set of the conductive layer openings and the two or more connecting tabs surround and define a region of the conductive layer, and
        wherein, after forming the set of the conductive layer openings, the two or more connecting tabs mechanically support and maintain registration of the region of the conductive layer relative to other portions of the conductive layer;
    laminating the conductive layer comprising the set of the conductive layer openings to a support layer,
        wherein, after laminating the conductive layer to the support layer, the support layer mechanically supports and maintains registration of the region of the conductive layer relative to the other portions of the conductive layer; and
    removing at least one of the two or more connecting tabs,
        wherein removing the at least one of the two or more connecting tabs converts the set of the conductive layer openings into a continuous conductive layer channel at least partially surrounding and defining the region of the conductive layer.

2. The method of claim 1, wherein at least another one of the two or more connecting tabs is retained while removing the at least one of the two or more connecting tabs, and wherein the at least one retained of the two or more connecting tabs interconnects the region of the conducive layer with the other portions of the conductive layer.

3. The method of claim 2, wherein the at least one retained of the two or more connecting tabs is operable as a fusible link and limits an electrical current level between the region of the conducive layer with the other portions of the conductive layer.

4. The method of claim 2, wherein the continuous conductive channel ends at the at least one retained of the two or more connecting tabs.

5. The method of claim 4, wherein the continuous conductive channel has an open ring shape.

6. The method of claim 1, wherein removing the at least one of the two or more connecting tabs comprises removing all of the two or more connecting tabs.

7. The method of claim 1, wherein removing the at least one of the two or more connecting tabs also removes at least one support layer portion of the support layer laminated to the at least one of the two or more connecting tabs.

8. The method of claim 1, wherein the support layer is operable as a first insulating layer and remains a part of the interconnect circuit.

9. The method of claim 8, wherein the support layer remains substantially intact while removing the at least one of the two or more connecting tabs.

10. The method of claim 1, further comprising:
    after removing the at least one of the two or more connecting tabs, laminating a first insulating layer to the conductive layer such that the conductive layer is disposed between the first insulating layer and the support layer; and
    after laminating the first insulating layer to the conductive layer, removing the support layer from the conductive layer.

11. The method of claim 10, wherein the first insulating layer comprises first insulating layer openings prior to laminating the first insulating layer to the conductive layer, and wherein the conductive layer openings provide aligning features for the first insulating layer openings during lamination of the first insulating layer to the conductive layer.

12. The method of claim 10, wherein the first insulating layer comprises first insulating layer slits prior to laminating the first insulating layer to the conductive layer, and
    wherein, after laminating the first insulating layer to the conductive layer, the first insulating layer slits are positioned within a boundary of the continuous conductive layer channel.

13. The method of claim 10, wherein, prior to laminating the first insulating layer to the conductive layer, the first insulating layer comprises first insulating layer openings, and
    wherein, after laminating the first insulating layer to the conductive layer, at least one of the insulating layer openings overlaps with the region of the conductive layer.

14. The method of claim 13, wherein edges of the region of the conductive layer are supported by the first insulating layer.

15. The method of claim 10, further comprising:
    after removing the support layer from the conductive layer, laminating a second insulating layer to the conductive layer such that the conductive layer is disposed between the first insulating layer and the second insulating layer.

16. The method of claim 15, wherein the first insulating layer comprises first insulating layer opening, and wherein the second insulating layer comprises a second insulating layer opening partially overlapping with the first layer opening.

17. The method of claim 1, wherein the interconnect circuit is further bonded to a heat sink.

18. The method of claim 1, further comprising:
    prior to laminating the conductive layer to the support layer, forming the conductive layer comprising a base sublayer and a surface sublayer,
    wherein the base sublayer has a different composition than the surface sublayer, and
    wherein forming the conductive layer comprises forming the surface sublayer over the base sublayer.

19. The method of claim 18, wherein forming the conductive layer further comprises forming an intermediate sublayer over the base sublayer and prior to forming the surface sublayer, and wherein a composition of each of the base sublayer and the surface sublayer is different from a composition of the intermediate sublayer.

20. The method of claim 18, wherein the surface sublayer directly contacts at least one of a first insulating layer or a second insulating layer in the interconnect circuit.

* * * * *